(12) United States Patent
Takase et al.

(10) Patent No.: US 11,532,652 B2
(45) Date of Patent: *Dec. 20, 2022

(54) IMAGING DEVICE AND IMAGE ACQUISITION DEVICE

(71) Applicant: Panasonic Intellectual Property Management Co., Ltd., Osaka (JP)

(72) Inventors: Masayuki Takase, Osaka (JP); Takayoshi Yamada, Hyogo (JP); Tokuhiko Tamaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/897,509

(22) Filed: Jun. 10, 2020

(65) Prior Publication Data

US 2020/0303436 A1 Sep. 24, 2020

Related U.S. Application Data

(63) Continuation of application No. 16/164,590, filed on Oct. 18, 2018, now Pat. No. 10,720,457, which is a
(Continued)

(30) Foreign Application Priority Data

Oct. 23, 2014 (JP) .................................. 2014-216209
Jun. 19, 2015 (JP) .................................. 2015-123725

(51) Int. Cl.
*H01L 27/146* (2006.01)
*H04N 5/378* (2011.01)
(Continued)

(52) U.S. Cl.
CPC .. *H01L 27/14603* (2013.01); *H01L 27/14612* (2013.01); *H01L 27/14667* (2013.01);
(Continued)

(58) Field of Classification Search
CPC ......... H01L 27/14603; H01L 27/14667; H01L 27/14612; H01L 27/307; H01L 27/14621;
(Continued)

(56) References Cited

U.S. PATENT DOCUMENTS 4,688,098 A  8/1987 Kon et al.
5,136,389 A  8/1992 Suzuki et al.
(Continued)

FOREIGN PATENT DOCUMENTS

JP  61-271867 A  12/1986
JP  H02-211666 A  8/1990
(Continued)

OTHER PUBLICATIONS

Non-Final Office Action issued in related U.S. Appl. No. 14/876,500 dated Sep. 26, 2017.
(Continued)

*Primary Examiner* — Sinh Tran
*Assistant Examiner* — Zhenzhen Wu
(74) *Attorney, Agent, or Firm* — McDermott Will & Emery LLP

(57) ABSTRACT

An imaging device includes a photoelectric conversion layer having a first surface and a second surface opposite to the first surface; a counter electrode on the first surface; a first electrode on the second surface; a second electrode on the second surface, the second electrode being spaced from the first electrode; and an auxiliary electrode on the second surface between the first electrode and the second electrode. The auxiliary electrode is spaced from the first electrode and the second electrode, where a shortest distance between the
(Continued)

first electrode and the auxiliary electrode is different from a shortest distance between the second electrode and the auxiliary electrode.

24 Claims, 38 Drawing Sheets

Related U.S. Application Data continuation of application No. 14/876,500, filed on Oct. 6, 2015, now Pat. No. 10,141,354.

(51) Int. Cl.
*H04N 5/353* (2011.01)
*H01L 27/30* (2006.01)

(52) U.S. Cl.
CPC ............. *H04N 5/353* (2013.01); *H04N 5/378* (2013.01); *H01L 27/14621* (2013.01); *H01L 27/14627* (2013.01); *H01L 27/307* (2013.01)

(58) Field of Classification Search
CPC ... H01L 27/14627; H04N 5/353; H04N 5/378
See application file for complete search history.

(56) References Cited

U.S. PATENT DOCUMENTS

| | | | |
|---|---|---|---|
| 6,229,191 B1 | 5/2001 | Cao et al. | |
| 6,831,692 B1 | 12/2004 | Oda | |
| 2002/0121605 A1* | 9/2002 | Fink | H01L 27/14665 250/370.08 |
| 2004/0017497 A1 | 1/2004 | Suzuki et al. | |
| 2005/0073024 A1 | 4/2005 | Frey et al. | |
| 2005/0145773 A1 | 7/2005 | Hashimoto et al. | |
| 2005/0225655 A1 | 10/2005 | Suzuki | |
| 2007/0076093 A1 | 4/2007 | Misawa | |
| 2007/0076108 A1 | 4/2007 | Misawa | |
| 2007/0164333 A1 | 7/2007 | Wright | |
| 2009/0085080 A1* | 4/2009 | Han | H01L 27/14643 257/292 |
| 2009/0127599 A1* | 5/2009 | Kim | H01L 27/1469 257/292 |
| 2009/0179293 A1 | 7/2009 | Shim et al. | |
| 2010/0053393 A1 | 3/2010 | Ota | |
| 2011/0049665 A1 | 3/2011 | Goto | |
| 2011/0156114 A1 | 6/2011 | Park et al. | |
| 2012/0086095 A1 | 4/2012 | Nishiyama et al. | |
| 2012/0248292 A1 | 10/2012 | Ozcan et al. | |
| 2012/0305926 A1 | 12/2012 | Nakatani et al. | |
| 2013/0044245 A1 | 2/2013 | Mabuchi et al. | |
| 2013/0271593 A1 | 10/2013 | Tsujimoto et al. | |
| 2013/0277536 A1 | 10/2013 | Mizuno et al. | |
| 2014/0117486 A1 | 5/2014 | Doi et al. | |
| 2016/0035921 A1* | 2/2016 | Matsuda | H01L 27/14645 348/374 |
| 2016/0037098 A1 | 2/2016 | Lee et al. | |
| 2016/0037099 A1 | 2/2016 | Mandelli et al. | |
| 2018/0151620 A1* | 5/2018 | Tashiro | H01L 27/14667 |
| 2019/0214417 A1* | 7/2019 | Matsuo | H01L 27/14647 |
| 2020/0029038 A1* | 1/2020 | Uesugi | H01L 27/14603 |

FOREIGN PATENT DOCUMENTS

| | | |
|---|---|---|
| JP | 3-174772 A | 7/1991 |
| JP | H05-267632 A | 10/1993 |
| JP | 2000-125209 A | 4/2000 |
| JP | 2001-210814 A | 8/2001 |
| JP | 2005-286104 A | 10/2005 |
| JP | 2007-104113 A | 4/2007 |
| JP | 2008-016862 A | 1/2008 |
| JP | 2008-112907 A | 5/2008 |
| JP | 2009-088511 A | 4/2009 |
| JP | 2009-147049 A | 7/2009 |
| JP | 2009-164604 A | 7/2009 |
| JP | 2011-054746 A | 3/2011 |
| JP | 2013-258168 A | 12/2013 |
| WO | 2007/122890 A1 | 11/2007 |
| WO | 2010/116974 A1 | 10/2010 |
| WO | 2012/086123 A1 | 6/2012 |
| WO | 2013/001809 A1 | 1/2013 |

OTHER PUBLICATIONS

Final Office Action issued in related U.S. Appl. No. 14/876,500 dated Apr. 19, 2018.
Notice of Allowance issued in related U.S. Appl. No. 14/876,500 dated Jul. 19, 2018.
Non-Final Office Action issued in related U.S. Appl. No. 16/164,590 dated Apr. 9, 2019.
Final Office Action issued in related U.S. Appl. No. 16/164,590 dated Oct. 24, 2019.
Notice of Allowance issued in related U.S. Appl. No. 16/164,590 dated Mar. 12, 2020.
Non-Final Rejection issued in corresponding U.S. Appl. No. 15/166,134, dated Sep. 5, 2017.
Final Rejection issued in corresponding U.S. Appl. No. 15/166,134, dated May 4, 2018.
Notice of Allowance issued in corresponding U.S. Appl. No. 15/166,134, dated Sep. 19, 2018.

* cited by examiner

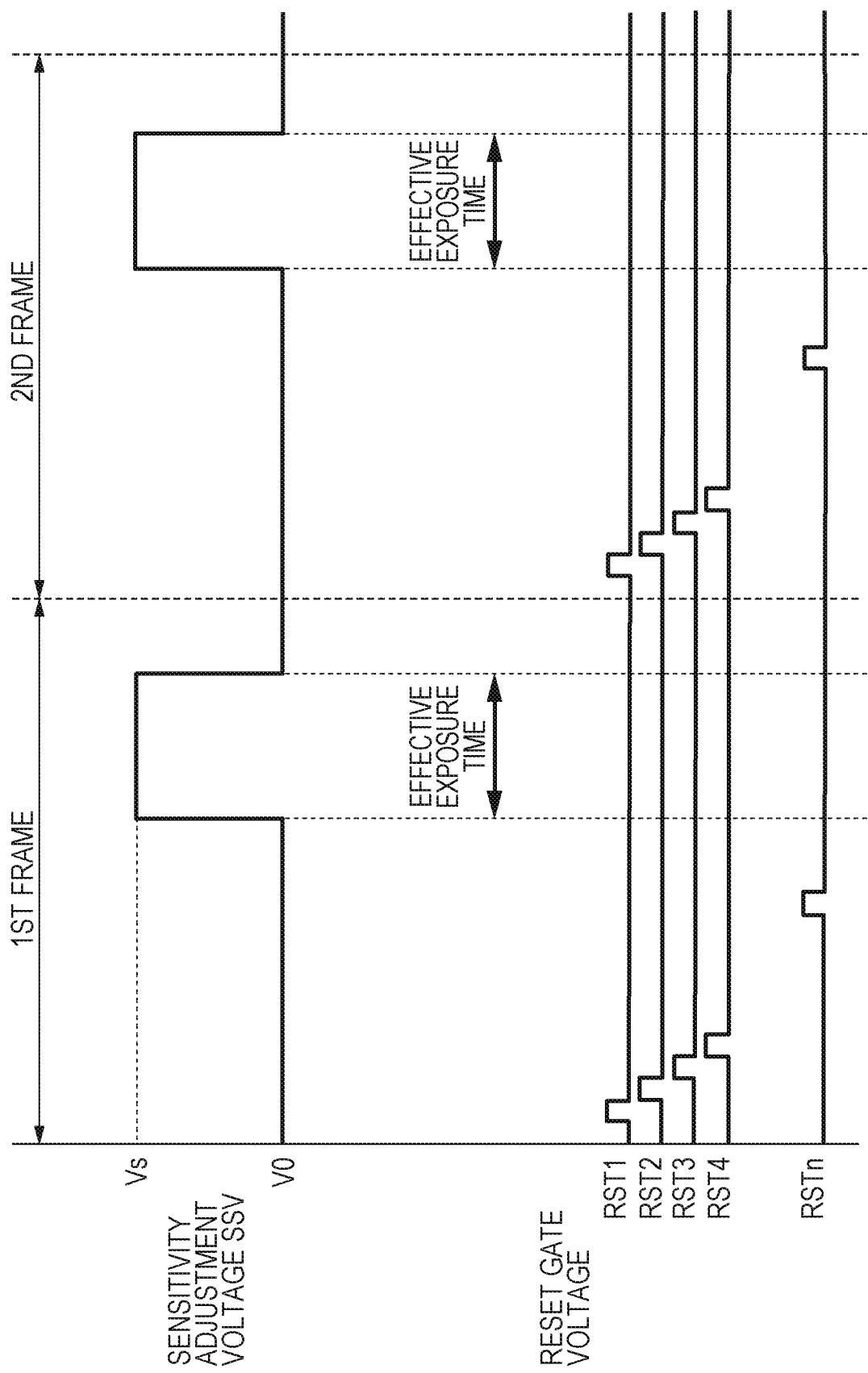

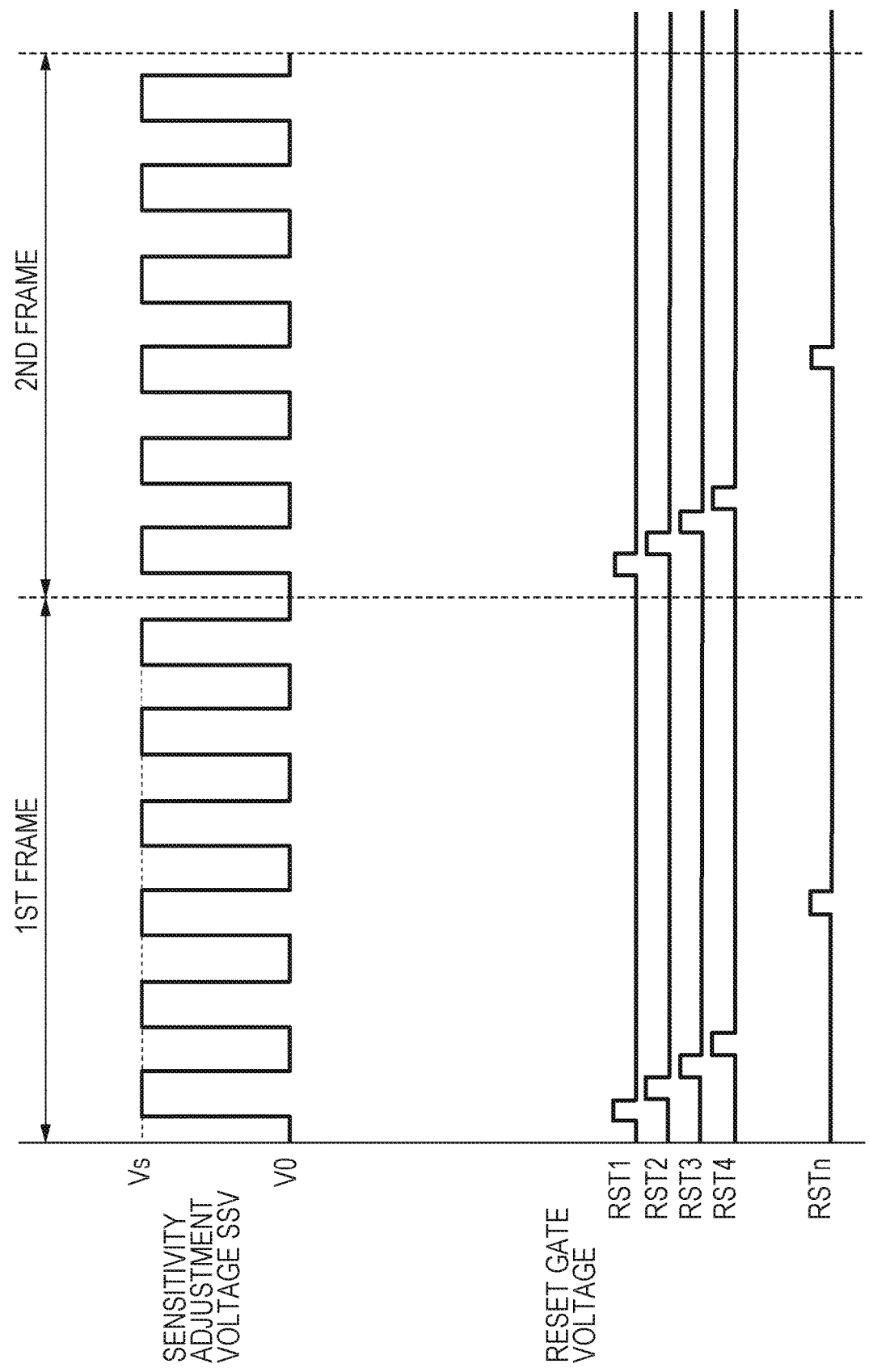

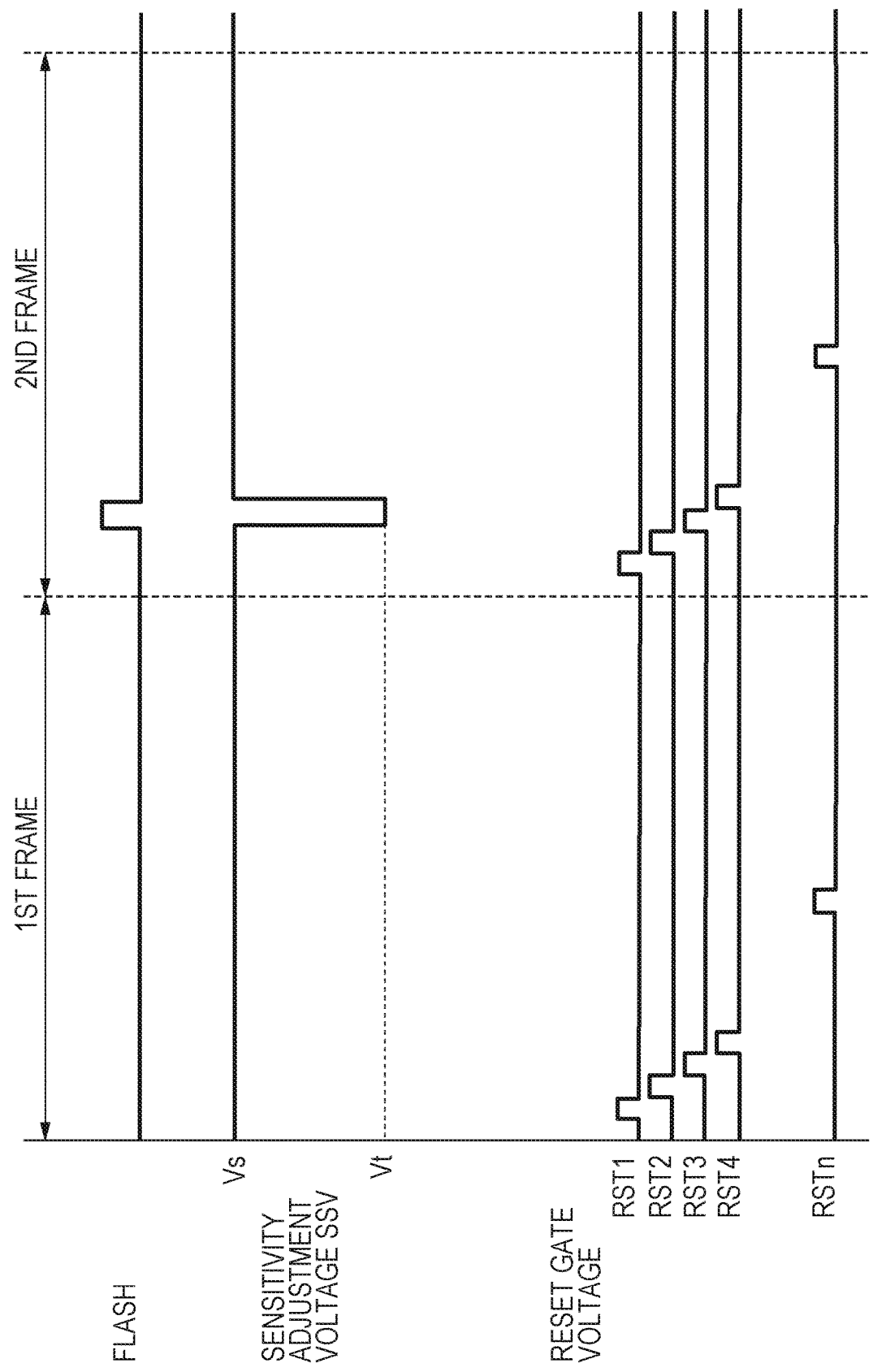

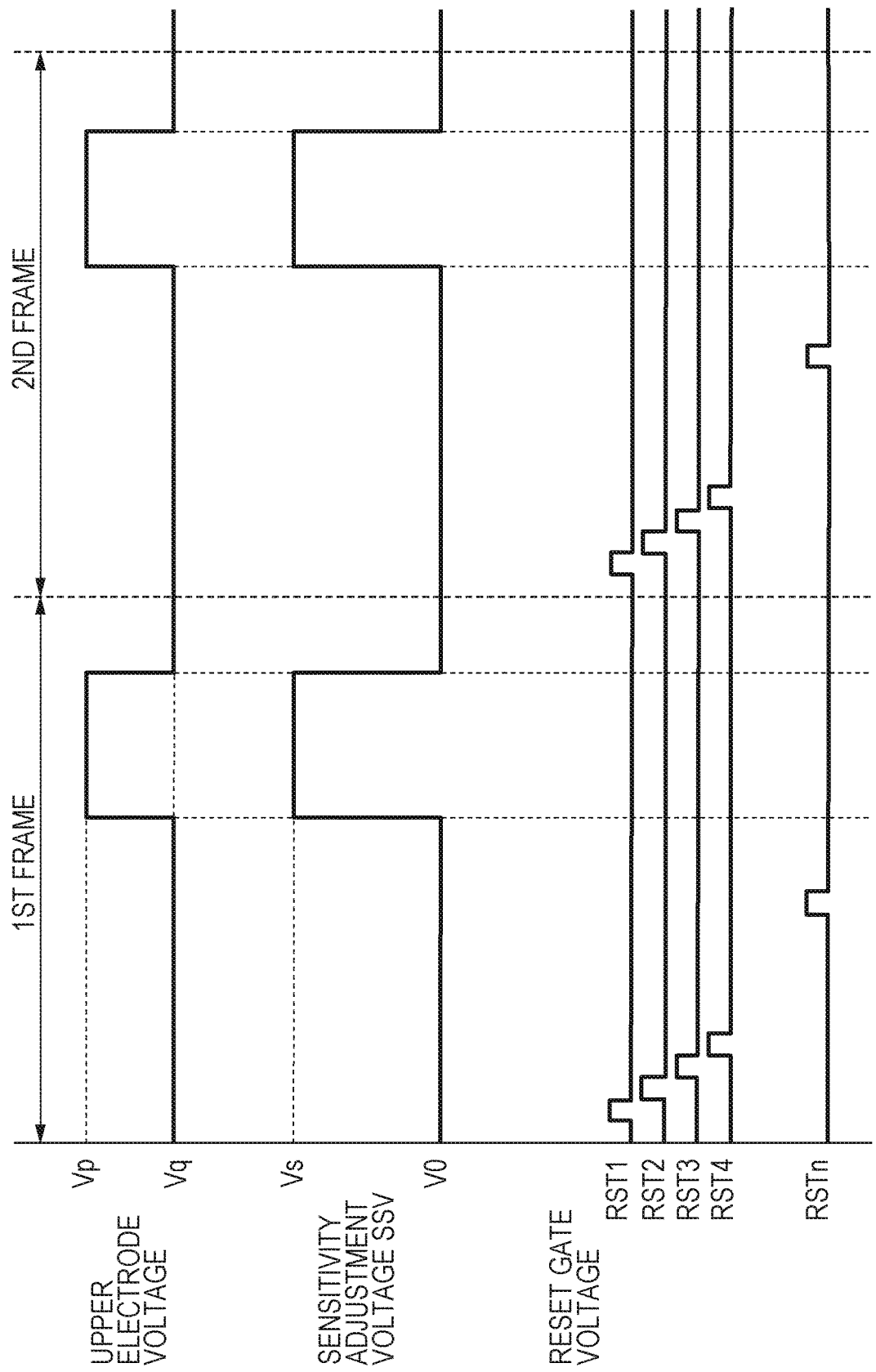

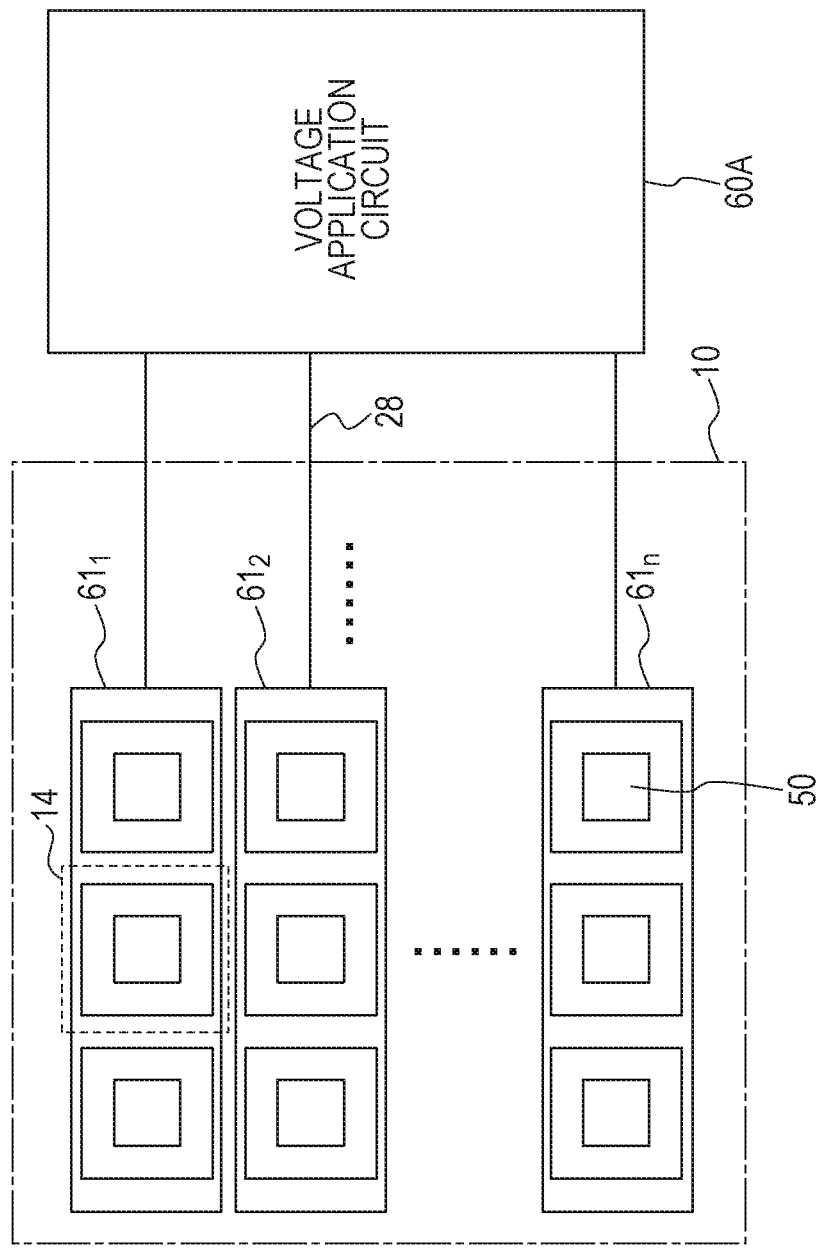

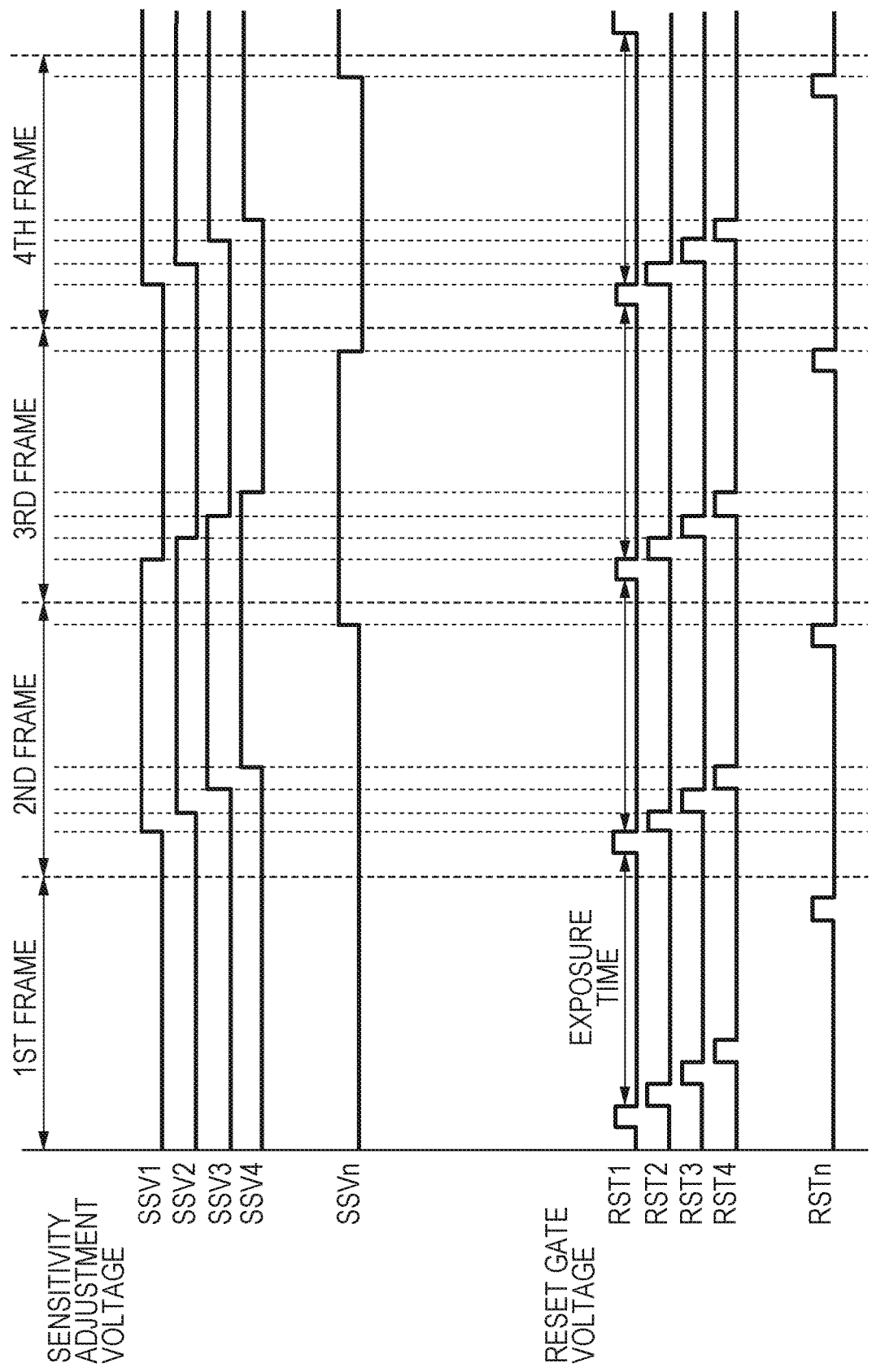

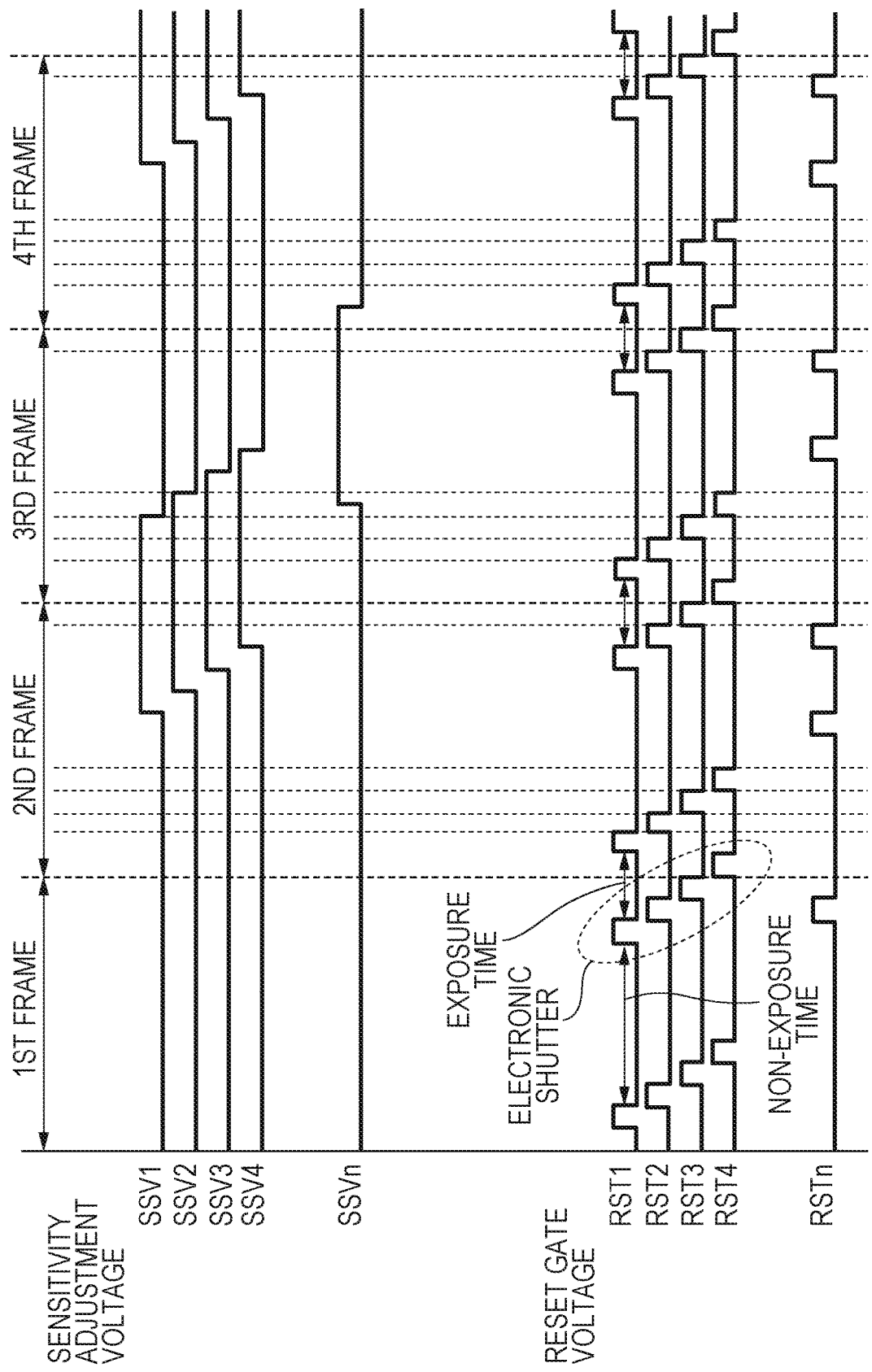

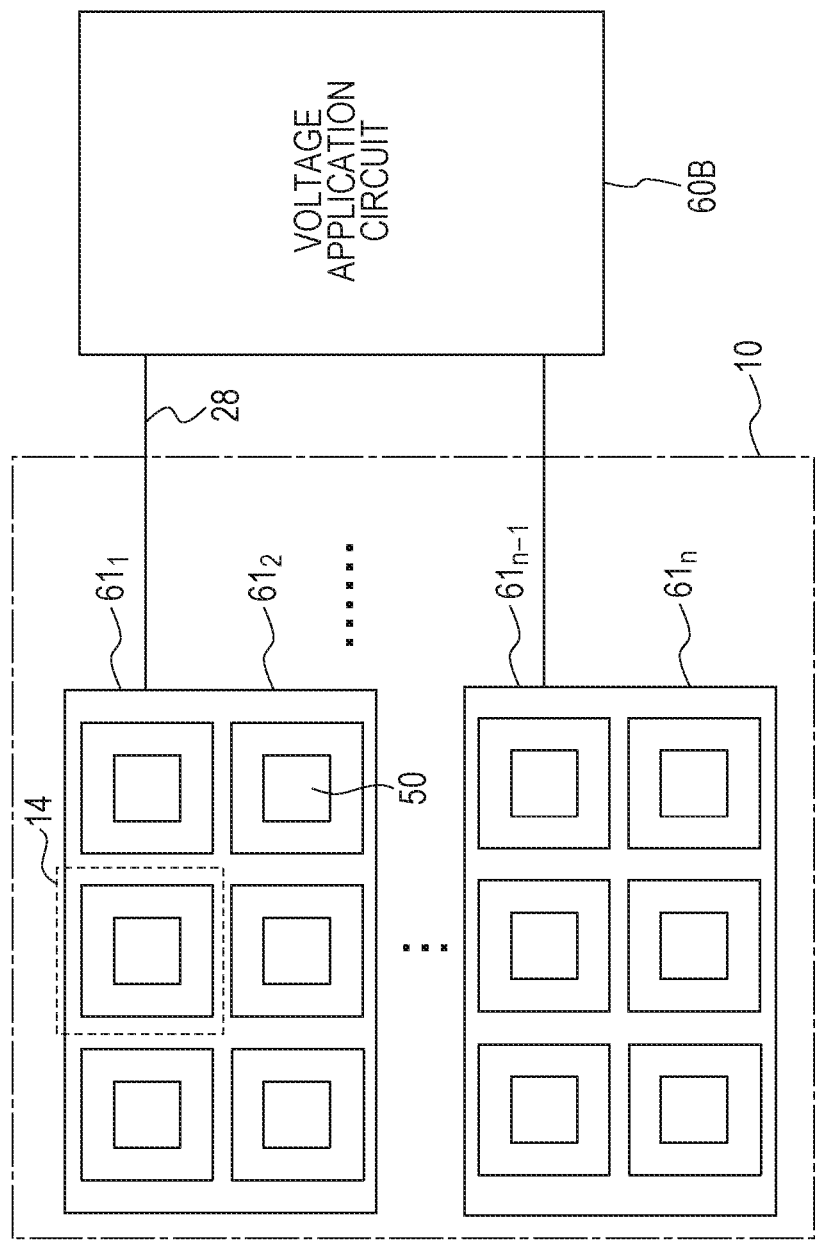

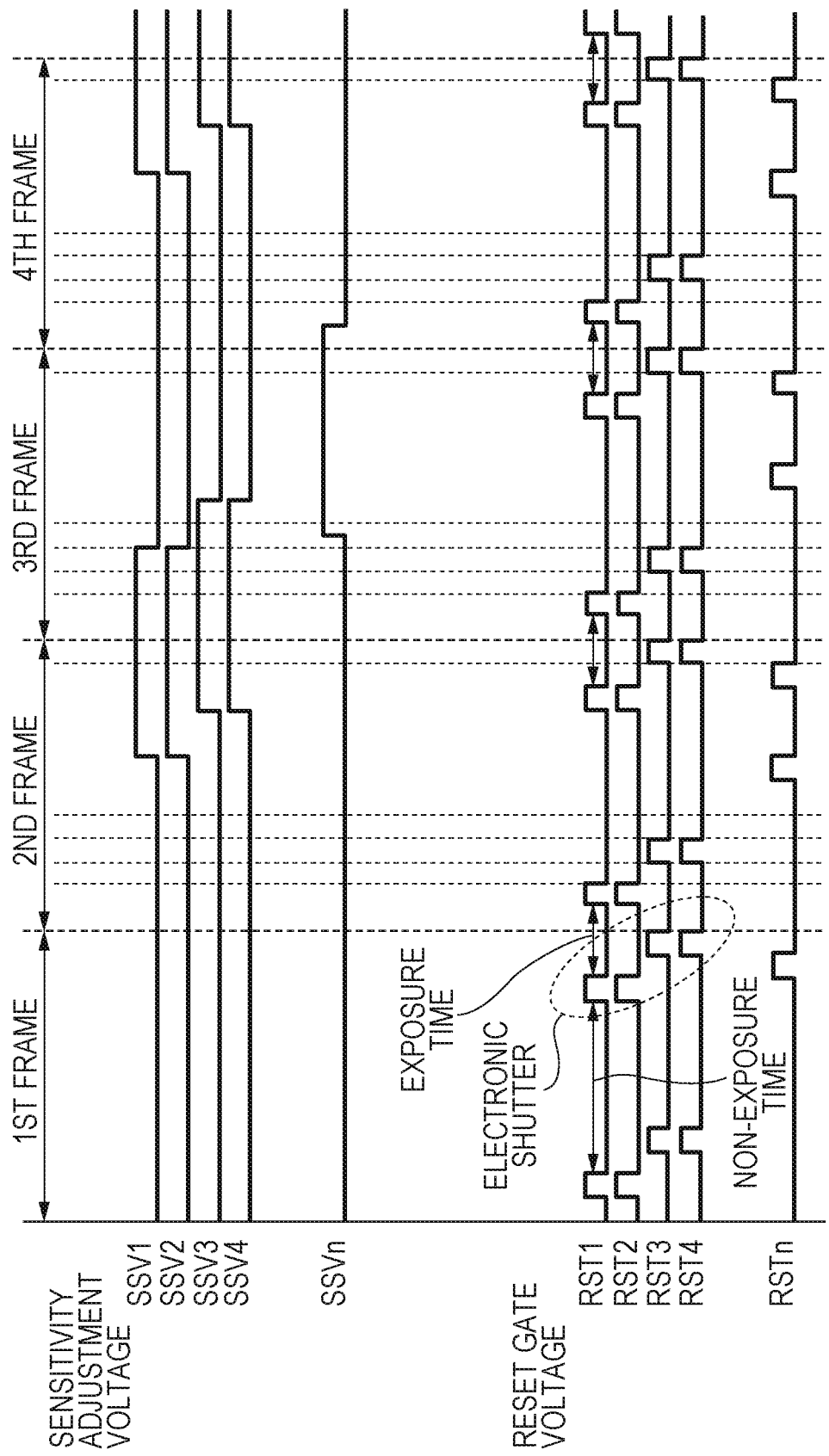

IMAGING DEVICE AND IMAGE
ACQUISITION DEVICE

CROSS REFERENCE

This application is a continuation application of U.S. patent application Ser. No. 16/164,590 filed on Oct. 18, 2018, which is a continuation application of U.S. application Ser. No. 14/876,500 filed on Oct. 6, 2015, now U.S. Pat. No. 10,141,354, which in turn claims the benefit of Japanese Application Nos. 2015-123725, filed Jun. 19, 2015, and 2014-216209, filed on Oct. 23, 2014, the entire contents of each are hereby incorporated by reference.

BACKGROUND

1. Technical Field

The present disclosure relates to an imaging device and an image acquisition device.

2. Description of the Related Art

As a metal oxide semiconductor (MOS) type imaging device, a stacked-layer type imaging device has been proposed. In the stacked-layer type imaging device, a photoelectric conversion film is stacked on the outermost surface of a semiconductor substrate. Charges generated by photoelectric conversion in the photoelectric conversion film are stored in a charge storage region. The imaging device reads the stored charges using a charge coupled device (CCD) circuit or a complementary MOS (CMOS) circuit in the semiconductor substrate. For instance, Japanese Unexamined Patent Application Publication No. 2009-164604 discloses such an imaging device.

SUMMARY

The imaging device is used in various environments. For instance, for an imaging device for monitoring or mounting in a vehicle, capability of picking up an image of high quality even in an environment in which brightness changes significantly is demanded. Therefore, for conventional stacked-layer type imaging devices, capability of changing the sensitivity has been demanded.

In one general aspect, an imaging device includes a photoelectric conversion layer having a first surface and a second surface opposite to the first surface; a counter electrode on the first surface; a first electrode on the second surface; a second electrode on the second surface, the second electrode being spaced from the first electrode; and an auxiliary electrode on the second surface between the first electrode and the second electrode. The auxiliary electrode is spaced from the first electrode and the second electrode, where a shortest distance between the first electrode and the auxiliary electrode is different from a shortest distance between the second electrode and the auxiliary electrode.

It should be noted that general or specific embodiments may be implemented as an element, a device, a system, an integrated circuit, and a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 8 is a timing chart illustrating another example of timing of change in the sensitivity adjustment voltage and in the reset gate voltage of the imaging device according to the first embodiment;

FIG. 9 is a timing chart illustrating still another example of timing of change in the sensitivity adjustment voltage and in the reset gate voltage of the imaging device according to the first embodiment;

FIG. 10 is a graph for explaining an example of operation in an imaging device having a flash;

FIG. 11 is a timing chart illustrating an example of timing of change in the sensitivity adjustment voltage, in the voltage of an upper electrode, and in the reset gate voltage of the imaging device according to the first embodiment;

FIG. 12A is a schematic diagram illustrating an example of planar structure of a pixel electrode and an auxiliary electrode in an imaging device according to a second embodiment;

FIG. 12B is a timing chart illustrating an example of timing of change in a sensitivity adjustment voltage and in a reset gate voltage of the imaging device according to the second embodiment;

FIG. 12C is a timing chart illustrating another example of timing of change in the sensitivity adjustment voltage and in the reset gate voltage of the imaging device according to the second embodiment;

FIG. 13A is a schematic diagram illustrating another example of planar structure of the pixel electrode and the auxiliary electrode in the imaging device according to the second embodiment;

FIG. 13B is a timing chart illustrating still another example of timing of change in the sensitivity adjustment voltage and in the reset gate voltage of the imaging device according to the second embodiment;

DETAILED DESCRIPTION

Figure 1:
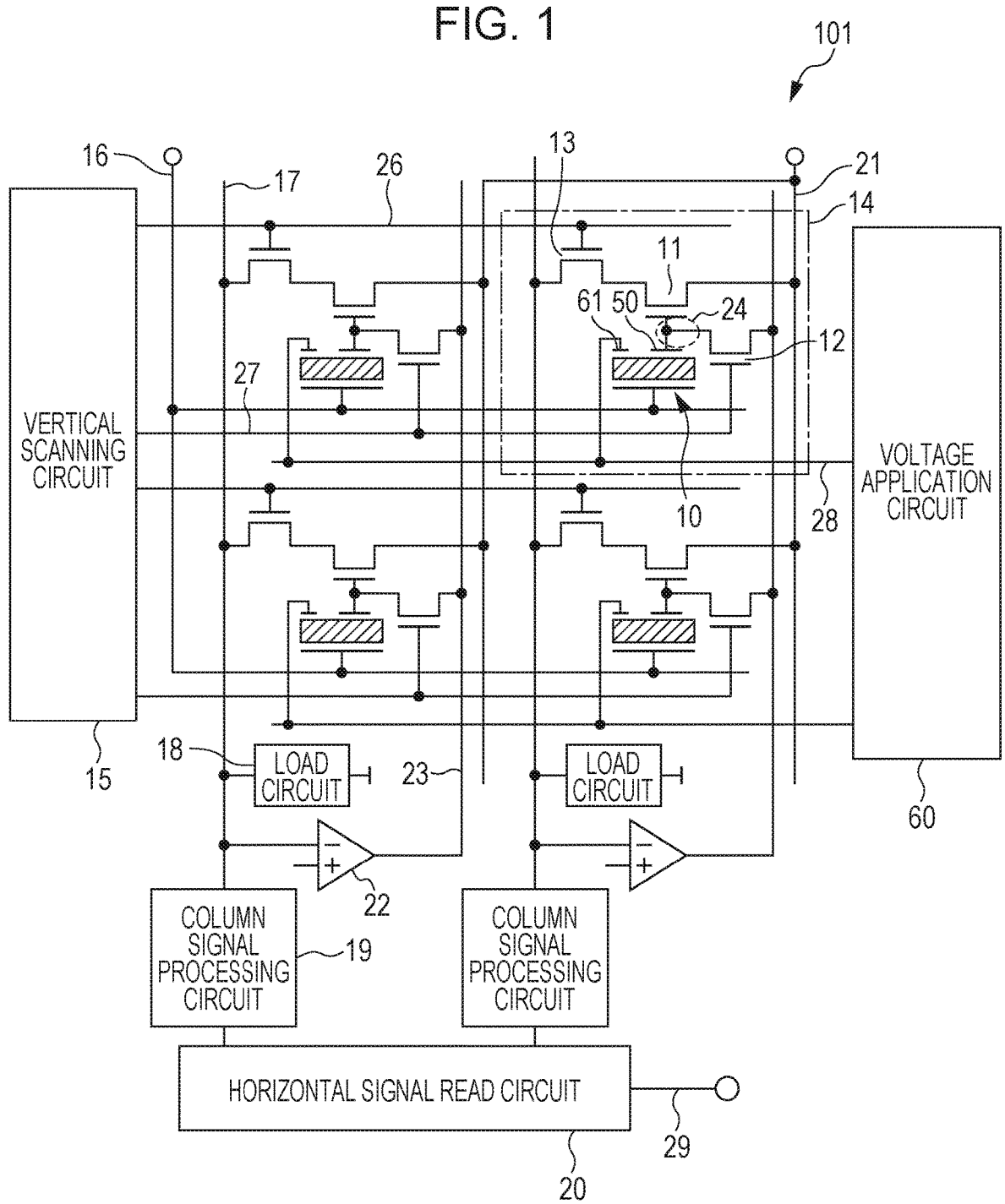
FIG. 1 is a schematic diagram illustrating an example of a circuit configuration of an imaging device according to a first embodiment.

The embodiments according to the present disclosure will be described with reference to the drawings. In the following embodiments, an example will be described in which when a pair of a hole and an electron is generated by photoelectric conversion, the hole is detected as a signal charge. An electron may serve as the signal charge. It is to be noted that the present disclosure is not limited to the following embodiments. In addition, modifications may be made in a range without departing from the scope of the present disclosure in which the effect is achieved. Furthermore, one embodiment and another embodiment may also be combined. In the following description, the same or similar components are denoted by the same reference character. Also, redundant description may be omitted.

First Embodiment

An imaging device according to the present embodiment will be described with reference to FIGS. 1 to 11.
(Structure of Imaging Device 101)

FIG. 1 illustrates an example of a circuit configuration of an imaging device 101 according to a first embodiment. The imaging device 101 includes a plurality of unit pixel cells 14 and a peripheral circuit.

The unit pixel cells 14 arranged two-dimensionally, that is, in the row direction and in the column direction on a semiconductor substrate to form a photosensitive area (pixel area). The imaging device 101 may be a line sensor, and the unit pixel cells 14 may be arranged one-dimensionally. In the description of the present application, the row direction and the column direction indicate the directions in which the row and the column extend, respectively. That is, the column direction is the vertical direction and the row direction is the horizontal direction.

Each of the unit pixel cells 14 includes a photoelectric converter 10, an amplification transistor 11, a reset transistor 12, and an address transistor (row selection transistor) 13. As described in detail in the following, in the present embodiment, the photoelectric converter 10 includes a pixel electrode 50 and an auxiliary electrode 61. The amount of signal charge which is generated by photoelectric conversion and trapped in the pixel electrode 50 is adjusted by adjusting a voltage applied to the auxiliary electrode 61. That is, the sensitivity of the imaging device 101 is adjusted.

The imaging device 101 has a voltage application circuit 60. The voltage application circuit 60 is configured to be able to apply at least two mutually different voltages simultaneously or selectively to the auxiliary electrode 61 when the imaging device 101 is in operation. It is sufficient that the voltage application circuit 60 have a configuration that allows a voltage supplied to the auxiliary electrode 61 to be changed. The circuit configuration of the voltage application circuit 60 is not limited to a specific circuit configuration. For instance, the voltage application circuit 60 may have a configuration in which a voltage supplied from a voltage source (not illustrated) is converted to a predetermined voltage. Alternatively, the voltage application circuit 60 itself may be configured to generate a predetermined voltage. Hereinafter, the voltage supplied from the voltage application circuit 60 to the auxiliary electrode 61 is referred to as a sensitivity adjustment voltage. The voltage application circuit 60 supplies a sensitivity adjustment voltage to the auxiliary electrode 61 via a sensitivity adjustment line 28, the sensitivity adjustment voltage according to a command from an operator who operates the imaging device 101 or a command from another control circuit provided in the imaging device 101. The voltage application circuit 60 is typically provided as part of the peripheral circuit outside the photosensitive area.

The pixel electrode 50 is connected to the gate electrode of the amplification transistor 11. The signal charge collected by the pixel electrode 50 is stored in a charge storage node 24 located between the pixel electrode 50 and the gate electrode of the amplification transistor 11. Although a hole serves as a signal charge in the present embodiment, an electron may serve as the signal charge.

The signal charge stored in the charge storage node 24 is applied to the gate electrode of the amplification transistor 11 as a voltage according to the amount of the signal charge. The amplification transistor 11 amplifies the voltage. The signal voltage is selectively read by the address transistor 13. The source or drain electrode of the reset transistor 12 is connected to the pixel electrode 50. The reset transistor 12 resets the signal charge which is stored in the charge storage node 24. In other words, the reset transistor 12 resets the potentials of the gate electrode of the amplification transistor 11 and the pixel electrode 50.

In order to selectively perform the above-described operations in each of the unit pixel cells 14, the imaging device 101 includes a power supply line 21, a vertical signal line 17, an address signal line 26 and a reset signal line 27. These lines are each connected to the unit pixel cells 14. The power supply line 21 is connected to the source or drain electrode of the amplification transistor 11. The vertical signal line 17 is connected to the source or drain electrode of the address transistor 13. The address signal line 26 is connected to the gate electrode of the address transistor 13. Also, the reset signal line 27 is connected to the gate electrode of the reset transistor 12.

The imaging device 101 includes a photoelectric converter control line 16 for applying a predetermined voltage to the photoelectric converter 10. The voltage supplied to the photoelectric converter 10 via the photoelectric converter control line 16 may be used in common among all the photoelectric converters 10. The voltage supplied to the photoelectric converter 10 via photoelectric converter control line 16 may be a nearly constant magnitude or a time varying voltage as described later.

In the configuration illustrated to FIG. 1, the peripheral circuit includes a vertical scanning circuit 15, a horizontal signal read circuit 20, a plurality of column signal processing circuits 19, a plurality of load circuits 18, and a plurality of inverting amplifiers 22. The vertical scanning circuit 15 is also called a row scanning circuit. The horizontal signal read circuit 20 is also called a column scanning circuit. The column signal processing circuits 19 are each also called a row signal storage circuit. The inverting amplifiers 22 are each also called a feedback amplifier.

The vertical scanning circuit 15 is connected to the address signal line 26 and the reset signal line 27. The vertical scanning circuit 15 selects the unit pixel cells 14 disposed in each row at a time, and reads a signal voltage and resets the potential of the pixel electrode 50. The power supply line (source follower power supply) 21 supplies a predetermined power supply voltage to each of the unit pixel cells 14. The horizontal signal read circuit 20 is electrically connected to the column signal processing circuits 19. The column signal processing circuits 19 are electrically connected to the unit pixel cells 14 disposed in each of the columns via a vertical signal line 17 corresponding to the column. Each of the load circuits 18 is electrically connected to a corresponding vertical signal line 17. The load circuit 18 and the amplification transistor 11 form a source follower circuit.

Each column is provided with a corresponding one of the inverting amplifiers 22. The input terminal of the negative side of the inverting amplifier 22 is connected to a corresponding vertical signal line 17. Also, the output terminal of the inverting amplifier 22 is connected to the unit pixel cells 14 in a corresponding column via a feedback line 23 corresponding to the column.

The vertical scanning circuit 15 applies a row selection signal to the gate electrode of the address transistor 13 via the address signal line 26, the row selection signal controlling ON and OFF of the address transistor 13. In this manner, the rows to be read are scanned and selected. A signal voltage is read from the unit pixel cells 14 in the selected row to the vertical signal line 17. In addition, the vertical scanning circuit 15 applies a reset signal to the gate electrode of the reset transistor 12 via the reset signal line 27, the reset signal controlling ON and OFF of the reset transistor 12. In this manner, the row of target unit pixel cells 14 to be reset is selected. The vertical signal line 17 transmits signal voltages read from the unit pixel cells 14 selected by the vertical scanning circuit 15 to the column signal processing circuits 19.

The column signal processing circuits 19 each perform noise oppression signal processing represented by, for instance, correlation double sampling, and analog-to-digital conversion (A/D conversion).

The horizontal signal read circuit 20 successively reads signals from the column signal processing circuits 19 and outputs signals to a horizontal common signal line 29.

The inverting amplifier 22 is connected to the drain electrodes of the corresponding reset transistor 12 via a feedback line 23. Therefore, when the address transistor 13 and the reset transistor 12 are in a conductive state, the inverting amplifier 22 receives an output of the address transistor 13 at a negative terminal. The inverting amplifier 22 performs a feedback operation so that the gate potential of the amplification transistor 11 reaches a predetermined feedback voltage. In this operation, the value of an output voltage of the inverting amplifier 22 is 0 V or a positive voltage close to 0 V. The feedback voltage indicates the output voltage of the inverting amplifier 22.

(Device Structure of Unit Pixel Cell 14)

Figure 2:
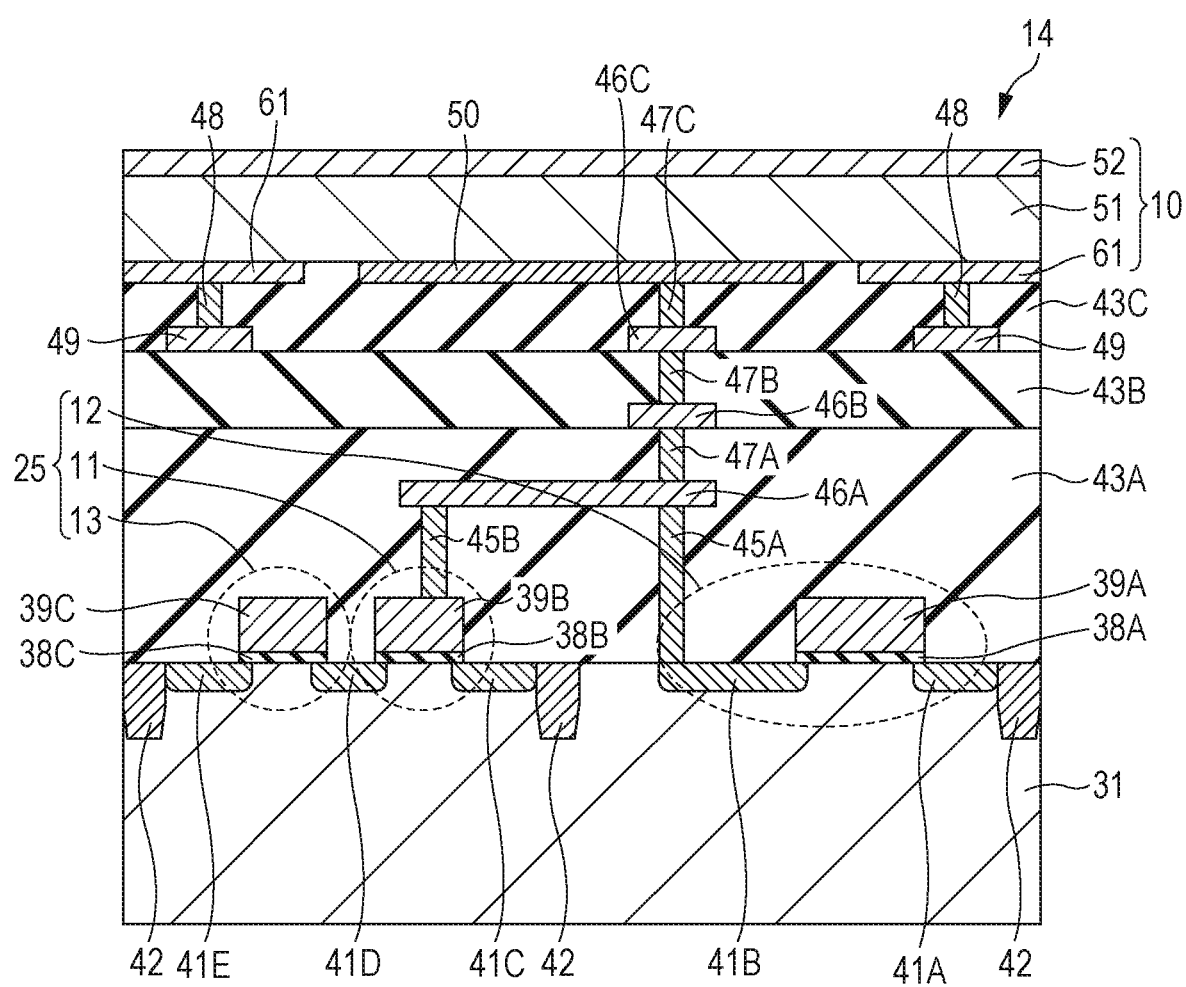
FIG. 2 is a schematic sectional view illustrating a typical example of a unit pixel cell in the imaging device according to the first embodiment.

FIG. 2 schematically illustrates a cross-section of the device structure of a unit pixel cell 14 in the imaging device 101 according to the present embodiment.

The unit pixel cell 14 includes a semiconductor substrate 31, a charge detection circuit 25, and a photoelectric converter 10. The semiconductor substrate 31 is, for instance, p-type silicon substrate. The charge detection circuit 25 detects signal charge trapped in the pixel electrode 50 and outputs a signal voltage. The charge detection circuit 25 includes the amplification transistor 11, the reset transistor 12, and the address transistor 13, and is formed in the semiconductor substrate 31.

The amplification transistor 11 is formed in the semiconductor substrate 31, and includes n-type impurity regions 41C and 41D that serve as a drain and a source, respectively, a gate insulating layer 38B located on the semiconductor substrate 31, and a gate electrode 39B located on the gate insulating layer 38B.

The reset transistor 12 is formed in the semiconductor substrate 31, and includes n-type impurity regions 41B and 41A that serve as a drain and a source, respectively, a gate insulating layer 38A located on the semiconductor substrate 31, and a gate electrode 39A located on the gate insulating layer 38A.

The address transistor 13 is formed in the semiconductor substrate 31, and includes n-type impurity regions 41D and 41E that serve as a drain and a source, respectively, a gate insulating layer 38C located on the semiconductor substrate 31, and a gate electrode 39C located on the gate insulating layer 38C. The n-type impurity region 41D is shared by the amplification transistor 11 and the address transistor 13, and thereby the amplification transistor 11 and the address transistor 13 are connected in series.

In the semiconductor substrate 31, an element separation region 42 is provided between adjacent unit pixel cells 14 and between the amplification transistor 11 and the reset transistor 12. The element separation region 42 achieves electrical separation between the adjacent unit pixel cells 14. Also, leakage of the signal charge stored in the charge storage node is avoided.

Interlayer insulating layers 43A, 43B, and 43C are stacked on the surface of the semiconductor substrate 31. In the interlayer insulating layer 43A, there are provided a contact plug 45A connected to the n-type impurity region 41B of the reset transistor 12, a contact plug 45B connected to the gate electrode 39B of the amplification transistor 11, and a wired line 46A that connects the contact plug 45A and the contact plug 45B. Thus, the n-type impurity region 41B (drain) of the reset transistor 12 is electrically connected to the gate electrode 39B of the amplification transistor 11.

The photoelectric converter 10 is provided on the interlayer insulating layer 43C. The photoelectric converter 10 includes an upper electrode 52, a photoelectric conversion layer 51, the pixel electrode 50, and the auxiliary electrode 61. The photoelectric conversion layer 51 is interposed between the upper electrode 52 and the pixel electrode 50, the auxiliary electrode 61. The pixel electrode 50 and the auxiliary electrode 61 are provided on the interlayer insulating layer 43C. The upper electrode 52 is composed of, for instance, a conductive transparent material such as ITO. The pixel electrode 50 and the auxiliary electrode 61 are composed of, for instance, metal including aluminum or copper, or polysilicon which is doped with impurities to be conductive.

Although not illustrated in FIG. 2, the unit pixel cell 14 may have a micro lens on the upper electrode 52 of the photoelectric converter 10. Alternatively, the unit pixel cell 14 may have a color filter.

Figure 3:
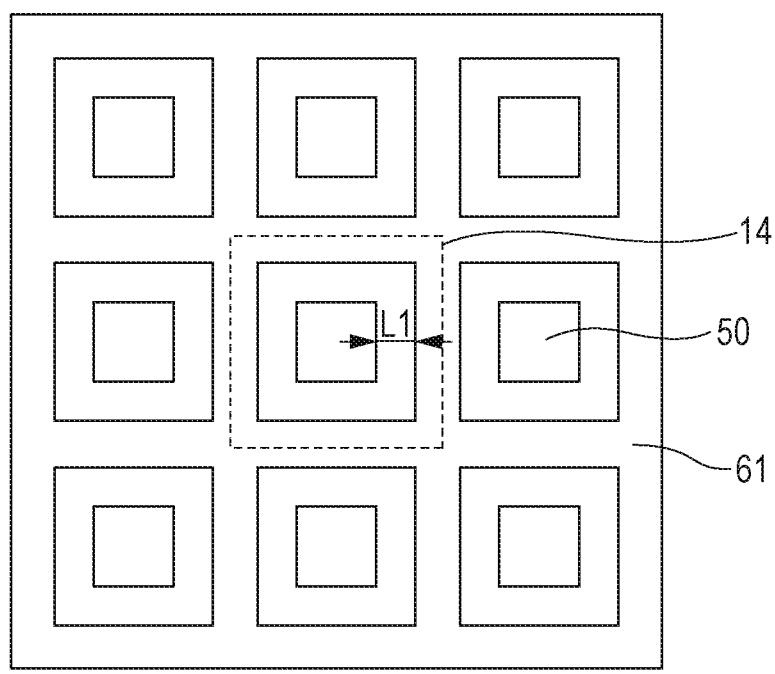
FIG. 3 is a schematic plan view illustrating an example of a shape of a pixel electrode and an auxiliary electrode.

FIG. 3 illustrates an example of a shape of the pixel electrode 50 and the auxiliary electrode 61 on the surface of the interlayer insulating layer 43C. FIG. 3 illustrates nine unit pixel cells that are arranged in a matrix with 3 rows and 3 columns. The pixel electrode 50 has a quadrilateral shape, for instance. In the present embodiment, as illustrated in FIG. 3, the pixel electrode 50 has a rectangular shape and the auxiliary electrode 61 has a ring-shaped rectangular shape that surrounds the pixel electrode 50. The pixel electrode 50 and the auxiliary electrode 61 are spaced apart by distance L1. In this instance, the respective auxiliary electrodes 61 are formed integrally between nine unit pixel cells 14 illustrated are electrically connected to one another.

Although the pixel electrode 50 is rectangular in the present embodiment, the pixel electrode 50 may have a circular shape or a polygonal shape having five sides or more. Although the auxiliary electrode 61 surrounds the pixel electrode 50 in the present embodiment, the auxiliary electrode 61 may not surround the pixel electrode 50.

As illustrated in FIG. 2, the pixel electrode 50 is connected to the wired line 46A via a plug 47C provided in the interlayer insulating layer 43C, a wired line 46C provided on the interlayer insulating layer 43B, a plug 47B provided in the interlayer insulating layer 43B, a wired line 46B provided on the interlayer insulating layer 43A, and a plug 47A provided in the interlayer insulating layer 43A. Also, the auxiliary electrode 61 is connected to a wired line 49 provided on the interlayer insulating layer 43B via a plug 48 provided in the interlayer insulating layer 43C. These plugs, contact plugs, and wired lines are composed of metal such as aluminum or copper, or polysilicon which is doped with impurities to be conductive.

In the present embodiment, the imaging device 101 detects signal charge, that is, holes among the electron-hole pairs generated by photoelectric conversion in the photoelectric conversion layer 51. The signal charge to be detected is stored in the above-described charge storage node 24 (see FIG. 1). The charge storage node 24 includes the pixel electrode 50, the gate electrode 39B, the n-type impurity region 41B, and the plugs 47A, 47B, 47C, the contact plugs 45A, 45B, and the wired lines 46C, 46B, 46A (see FIG. 2) that connect those electrodes and region.

The photoelectric conversion layer 51 covers the auxiliary electrode 61 and the pixel electrode 50 on the interlayer insulating layer 43C and is formed continuously over the entire portion of the unit pixel cells 14. The photoelectric conversion layer 51 is composed of, for instance, an organic material or an amorphous silicon.

Although not illustrated in FIG. 2, the peripheral circuits (here the vertical scanning circuit 15, the horizontal signal read circuit 20, the column signal processing circuit 19, load circuit 18, and the inverting amplifier 22) are also formed in the semiconductor substrate 31.

The imaging device 101 may be manufactured using a general semiconductor manufacturing process. In particular, when a silicon substrate is used as the semiconductor substrate 31, the imaging device 101 may be manufactured by utilizing various silicon semiconductor processes.

(Operation of Imaging Device 101)

Next, the exemplary operation of the imaging device 101 will be described with reference to FIG. 1, FIG. 2, and FIGS. 4A to 4D. As described below, when a hole is used as a signal charge, the potential of the pixel electrode 50 and the auxiliary electrode 61 is set lower than the potential of the upper electrode 52, thereby making it possible to collect the holes generated in photoelectric conversion near the pixel electrode 50.

First, a voltage of approximately 10 V is applied to the upper electrode 52. Furthermore, the reset transistor 12 is turned ON, and subsequently is turned OFF, thereby resetting the potential of the pixel electrode 50. By the resetting, the potential of the charge storage node 24 including the pixel electrode 50 is set to a reset voltage (for instance, 0 V) as an initial value. Also, a first sensitivity adjustment voltage lower than the reset voltage (here, 0 V) for instance, is applied to the auxiliary electrode 61 from the voltage application circuit 60. Here, a voltage of −2 V is applied to the auxiliary electrode 61 as the first sensitivity adjustment voltage.

Like this, the potential of the pixel electrode 50 and the auxiliary electrode 61 is set lower than that of the upper electrode 52. Therefore, holes generated by photoelectric conversion in the photoelectric conversion layer 51 move to the auxiliary electrode 61 and the pixel electrode 50. Here, the potential of the auxiliary electrode 61 is lower than the potential of the pixel electrode 50. That is, the potential difference between the auxiliary electrode 61 and the upper electrode 52 is higher than the potential difference between the pixel electrode 50 and the upper electrode 52. Therefore, generated holes are more likely to move to the auxiliary electrode 61 than to the pixel electrode 50. Consequently, holes generated in region 51A (see FIG. 4A) including the overlapping portion with the pixel electrode 50 in a plan view within the photoelectric conversion layer 51, mainly move to the pixel electrode 50 and are detected as signal charge. On the other hand, holes generated in region 51B (see FIG. 4A) including the overlapping portion with the auxiliary electrode 61 in a plan view within the photoelectric conversion layer 51, mainly move to the auxiliary electrode 61. This indicates that among the light emitted to the photoelectric conversion layer 51, the light emitted to the region 51A is detected. That is, the unit pixel cell 14 substantially detects the light incident to the region 51A among the light incident to the pixel region. The region 51A is such a region that signal charge (here, holes) generated by photoelectric conversion in the region of the photoelectric conversion layer 51 mainly move to the pixel electrode. The region 51B is such a region that signal charge (here, holes) generated by photoelectric conversion in the region of the photoelectric conversion layer 51 mainly move to the auxiliary electrode.

Figure 4A:
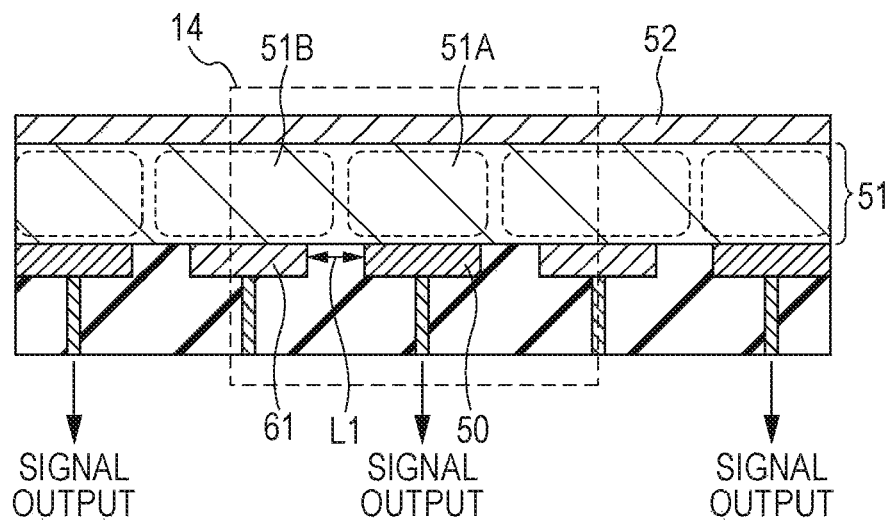
FIG. 4A is a schematic sectional view illustrating an example of a region for trapping charges which is formed in a photoelectric conversion layer when a sensitivity adjustment voltage is applied to the auxiliary electrode.
Figure 4B:
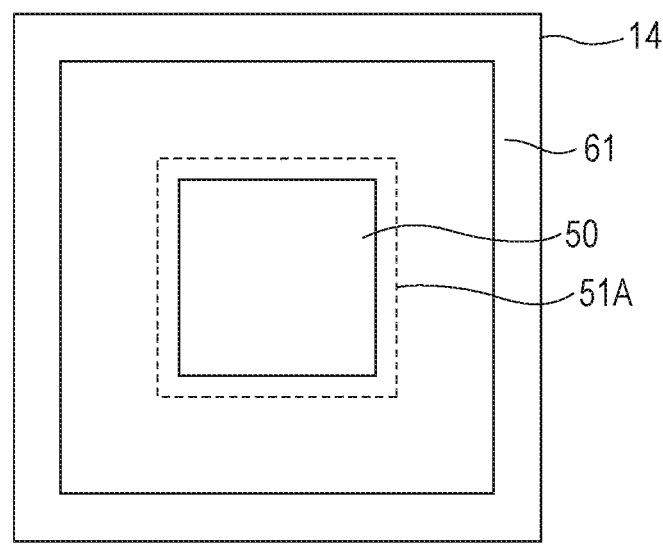
FIG. 4B is a schematic plan view illustrating an example of a region for trapping charges which is formed in the photoelectric conversion layer when a sensitivity adjustment voltage is applied to the auxiliary electrode.

FIG. 4B is a plan view of the region 51A seen from a side of the pixel electrode 50 and auxiliary electrode 61. In this example, the region 51A has a first area slightly greater than the pixel electrode 50, in a plane parallel to the photoelectric conversion layer 51. As illustrated in FIG. 4B, the shape and area of the region 51A as seen in a direction normal to the surface of the semiconductor substrate 31 does not necessarily match with the shape and area of the pixel electrode 50. In addition, as described in detail below, the shape and/or area of the region 51A may vary with a voltage applied to the pixel electrode 50, the auxiliary electrode 61, and the upper electrode 52. The shape and area of the region 51B as seen in a direction normal to the surface of the semiconductor substrate 31 also does not necessarily match with the shape and area of the auxiliary electrode 61. FIG. 4A and FIG. 4B merely schematically illustrate the region 51A and no clear boundary exists between the region 51A and the region 51B.

Signal charge is stored for each of frames and the stored charge and the potential of the pixel electrode 50 are reset with the first sensitivity adjustment voltage applied to the auxiliary electrode 61. In this manner, it is possible to detect charge generated in the region 51A having the first area from among the charge which is generated by photoelectric conversion in the photoelectric conversion layer 51.

Figure 4C:
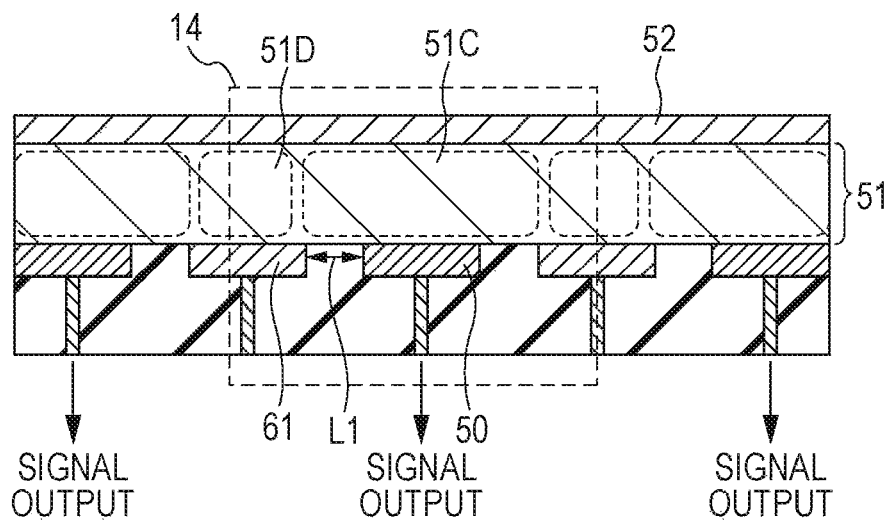
FIG. 4C is a schematic sectional view illustrating another example of a region for trapping charges which is formed in the photoelectric conversion layer when a sensitivity adjustment voltage is applied to the auxiliary electrode.
Figure 4D:
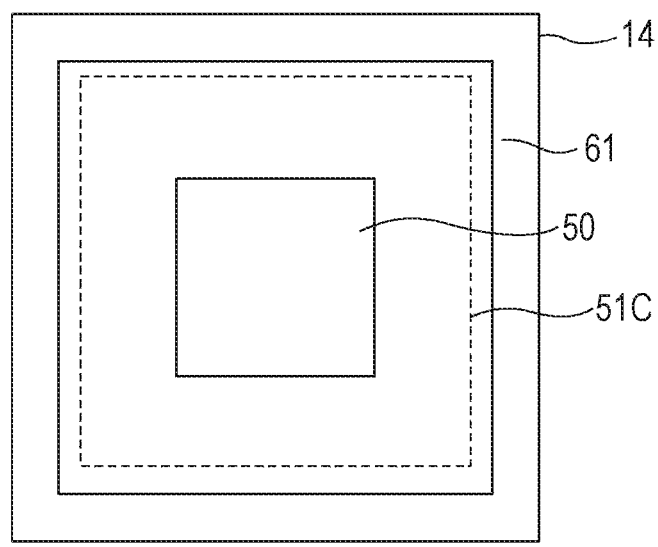
FIG. 4D is a schematic plan view illustrating another example of a region for trapping charges which is formed in the photoelectric conversion layer when a sensitivity adjustment voltage is applied to the auxiliary electrode.

FIG. 4C and FIG. 4D illustrate an example in which the voltage application circuit 60 applies a second sensitivity adjustment voltage higher than the first sensitivity adjustment voltage to the auxiliary electrode 61. For instance, the second sensitivity adjustment voltage is 5 V.

Similarly to the case where the first sensitivity adjustment voltage is applied, also in this example, the holes generated by photoelectric conversion in the photoelectric conversion layer 51 move to the auxiliary electrode 61 and the pixel electrode 50. In this example, the second sensitivity adjustment voltage (here, 5 V) is higher than the reset voltage (here, 0 V). Therefore, the holes generated in the photoelectric conversion layer 51 are more likely to move to the pixel electrode 50 than to the auxiliary electrode 61.

Furthermore, in this example, the second sensitivity adjustment voltage, which is higher than the first sensitivity adjustment voltage in the example described with reference to FIG. 4A and FIG. 4B, is applied to the auxiliary electrode 61. Therefore, the amount of holes that flow into the auxiliary electrode 61 is smaller than in the case where the first sensitivity adjustment voltage is applied to the auxiliary electrode 61. That is, the generated holes are much more likely to move to the pixel electrode 50. Consequently, as schematically illustrated in FIG. 4C, region 51C, in which holes movable to the pixel electrode 50 are distributed, is larger than the region 51A (see FIG. 4A) in the case where the first sensitivity adjustment voltage is applied to the auxiliary electrode 61. In addition, region 51D, in which holes movable to the auxiliary electrode 61 are distributed, is smaller than the region 51B (see FIG. 4A) in the case where the first sensitivity adjustment voltage is applied to the auxiliary electrode 61.

FIG. 4D is a plan view of the region 51C seen from a side of the pixel electrode 50 and auxiliary electrode 61. The region 51C has a second area larger than the first area, in a plane parallel to the photoelectric conversion layer 51.

Signal charge is stored for each of frames and the stored charge and the potential of the pixel electrode 50 are reset with the second sensitivity adjustment voltage applied to the auxiliary electrode 61. In this manner, it is possible to detect charge generated in the region 51C having the second area from among the charge which is generated by photoelectric conversion in the photoelectric conversion layer 51.

When the first sensitivity adjustment voltage is applied to the auxiliary electrode 61 in this manner, the region 51A where signal charges are trapped by the pixel electrode 50 is relatively small. When the second sensitivity adjustment voltage is applied, the region 51C where signal charges are trapped by the pixel electrode 50 is relatively large. That is, when the first sensitivity adjustment voltage is applied to the auxiliary electrode 61, the sensitivity of the imaging device 101 is relatively low. When the second sensitivity adjustment voltage is applied, the sensitivity is relatively high. In this manner, the sensitivity of the imaging device 101 is changeable by changing the sensitivity adjustment voltage applied to the auxiliary electrode 61. As the distance L1 (see FIG. 4A and FIG. 4C) between the pixel electrode 50 and the auxiliary electrode 61 increases, the size of the region (here, regions 51A, 51C) where signal charges are trapped by the pixel electrode 50 is adjustable in a wider range by changing the sensitivity adjustment voltage.

Figure 5:
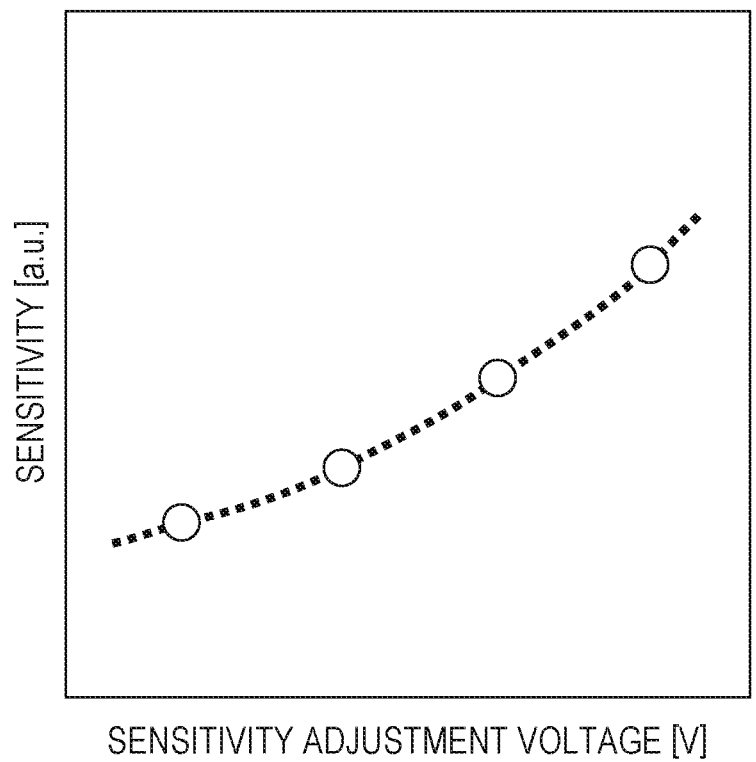
FIG. 5 is a schematic diagram illustrating an exemplary relationship between sensitivity adjustment voltage and sensitivity.

FIG. 5 schematically illustrates the relationship between the sensitivity adjustment voltage applied to the auxiliary electrode and the sensitivity of the imaging device 101 when a hole serves as a signal charge. As illustrated in FIG. 5, when the sensitivity adjustment voltage applied to the auxiliary electrode is changed, the sensitivity also changes. For instance, when the sensitivity adjustment voltage is increased the sensitivity increases. Like this, according to the present embodiment, the imaging device having a variable sensitivity is achieved.

Although a hole serves as a signal charge in the above-described embodiment, an electron may be used as a signal charge. When an electron serves as a signal charge, a voltage higher than the potential of the upper electrode 52 is applied to the pixel electrode 50 and the auxiliary electrode 61. Thus, electrons generated by photoelectric conversion move to the pixel electrode 50 and the auxiliary electrode 61. When an electron serves as a signal charge, electrons are more likely to flow to the pixel electrode and the sensitivity of the imaging device increases with a relatively lower sensitivity adjustment voltage applied to the auxiliary electrode. On the other hand, electrons are more likely to flow to the auxiliary electrode and the sensitivity of the imaging device decreases with a relatively higher sensitivity adjustment voltage applied to the auxiliary electrode.

Like this, it is possible to change the sensitivity of the imaging device 101 by switching the sensitivity adjustment voltage applied to the auxiliary electrode 61 from the voltage application circuit 60. In the case where a hole is used as a signal charge, when the potential difference between the upper electrode 52 and the auxiliary electrode 61 is greater than the potential difference between the upper electrode 52 and the pixel electrode 50, the sensitivity of the imaging device becomes relatively low. On the other hand, when the potential difference between the upper electrode 52 and the auxiliary electrode 61 is less than the potential difference between the upper electrode 52 and the pixel electrode 50, the sensitivity of the imaging device becomes relatively high. It is to be noted that this relationship holds in the case where an electron is used as a signal charge.

In the aforementioned example described with reference to FIGS. 4A to 4D, the sensitivity adjustment voltage applied to the auxiliary electrode 61 is changed between a value higher and a value lower than the reset voltage of the pixel electrode 50. However, even when the sensitivity adjustment voltage applied to the auxiliary electrode 61 is changed in a range higher than or a range lower than the reset voltage of the pixel electrode 50, the sensitivity of the imaging device 101 is changeable. For instance, in the case where a hole is used as a signal charge and the sensitivity adjustment voltage is changed in a range lower than the reset voltage of the pixel electrode 50, the sensitivity of the imaging device is decreased as the potential difference between the pixel electrode 50 and the auxiliary electrode 61 is relatively increased.

Next, the value of sensitivity adjustment voltage applied to the auxiliary electrode 61 and the characteristics of the imaging device 101 achieved by the sensitivity adjustment voltage will be further described with reference to FIGS. 6A to 6D.

Figure 6A:
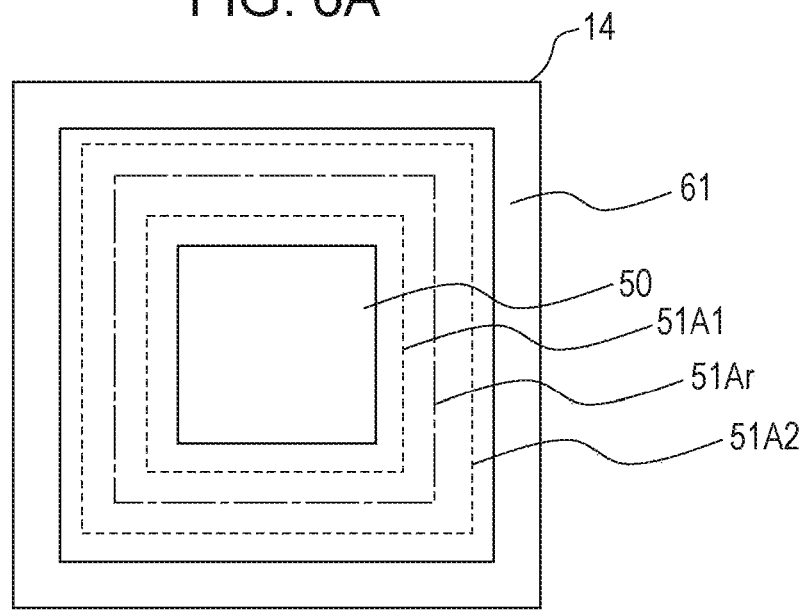
FIG. 6A is a schematic plan view illustrating an example of a region for trapping charges which is formed in the photoelectric conversion layer when a first sensitivity adjustment voltage is applied to the auxiliary electrode together with an example of a region for trapping charges which is formed in a photoelectric conversion layer when a second sensitivity adjustment voltage is applied to the auxiliary electrode.

First, let Vr be the reset voltage of the pixel electrode 50 and a case will be described where a hole serves as a signal charge. FIG. 6A is a plan view of a region where signal charges are trapped by the pixel electrode 50, the plan view seen from a side of the pixel electrode 50 and the auxiliary electrode 61 when sensitivity adjustment voltages V1 and V2 satisfying V1<Vr<V2 are applied to the auxiliary electrode 61. In FIG. 6A, regions 51A1, 51Ar, 51A2 schematically illustrate respective regions where signal charges (here, holes) are trapped by the pixel electrode 50 when sensitivity adjustment voltages of V1, Vr, V2 are applied to the auxiliary electrode 61. When the reset voltage Vr is applied to the auxiliary electrode 61, initialized pixel electrode 50 and auxiliary electrode 61 have the same potential. Therefore, when the reset voltage Vr is applied to the auxiliary electrode 61, the outer periphery of the region 51Ar is located at approximately the midpoint between the pixel electrode 50 and the auxiliary electrode 61.

When a hole serves as a signal charge, the lower the voltage applied to the auxiliary electrode 61, it is more likely that holes serving as signal charges are trapped by the auxiliary electrode 61 and the region where signal charges are trapped by the pixel electrode 50 is decreased. Therefore, the region 51A1 formed when the sensitivity adjustment voltage V1 lower than Vr is applied is smaller than the region 51Ar when Vr is applied. Also, the region 51A2 formed when the sensitivity adjustment voltage V2 higher than Vr is applied is larger than the region 51Ar when Vr is applied. In this manner, the sensitivity adjustment voltage V1 lower than the reset voltage Vr and the sensitivity adjustment voltage V2 higher than the reset voltage Vr are selectively applied, thereby making it possible to greatly change the size of region where holes are trapped by the pixel electrode 50. That is, the imaging device 101 having a wide adjustable range of sensitivity may be achieved.

Figure 6B:
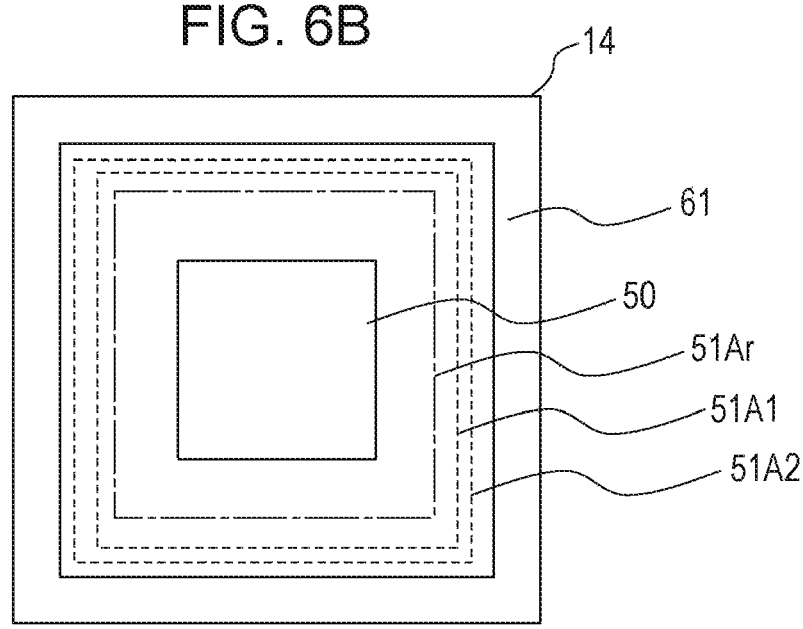
FIG. 6B is a schematic plan view illustrating another example of a region for trapping charges which is formed in the photoelectric conversion layer when the first sensitivity adjustment voltage is applied to the auxiliary electrode together with another example of a region for trapping charges which is formed in a photoelectric conversion layer when the second sensitivity adjustment voltage is applied to the auxiliary electrode.

FIG. 6B is a plan view of a region where signal charges are trapped by the pixel electrode 50, the plan view seen from a side of the pixel electrode 50 and the auxiliary electrode 61 when sensitivity adjustment voltages V1 and V2 satisfying Vr<V1<V2 are applied to the auxiliary electrode 61. The region 51A1 formed when the sensitivity adjustment voltage V1 higher than Vr is applied is larger than the region 51Ar when Vr is applied. Also, the region 51A2 formed when the sensitivity adjustment voltage V2 higher than V1 is applied is further larger than the region 51A1 when V1 is applied. Therefore, by applying the sensitivity adjustment voltage V1 satisfying the relationship Vr<V1<V2 to the auxiliary electrode 61, it is possible to ensure favorable sensitivity to some extent while suppressing color mixing between unit pixel cells. In addition, by applying the sensitivity adjustment voltage V2 to the auxiliary electrode 61, higher sensitivity may be achieved.

Figure 6C:
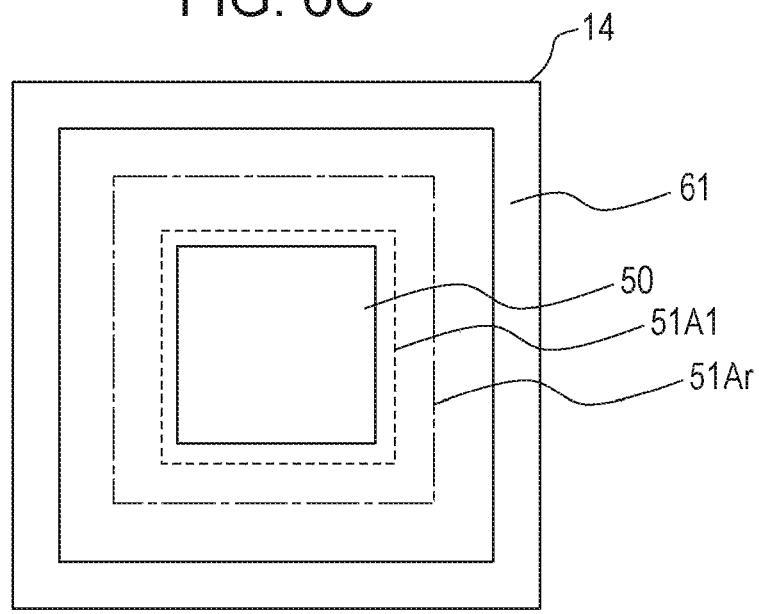
FIG. 6C is a schematic plan view illustrating an example of a region for trapping charges which is formed in the photoelectric conversion layer when the first sensitivity adjustment voltage lower than 0 is applied to the auxiliary electrode.

FIG. 6C is a plan view of a region where signal charges are trapped by the pixel electrode 50, the plan view seen from a side of the pixel electrode 50 and the auxiliary electrode 61 when sensitivity adjustment voltages V1 satisfying V1<Vr and V1<0 are applied to the auxiliary electrode 61. By setting the sensitivity adjustment voltage V1 to a negative value, a great number of holes are trapped by the auxiliary electrode 61, and thus the region 51A1 is decreased. Consequently, the sensitivity is decreased and an imaging device may be implemented in which an overexposed white area is not likely to occur even in a bright environment. It is to be noted that when a negative voltage is used as a voltage for driving (switching between ON and OFF of) the transistors (such as the reset transistor 12, the address transistor 13) provided in each pixel, the negative voltage may also be used as the sensitivity adjustment voltage applied to the auxiliary electrode 61. For instance, when the reset transistor 12 is turned ON or OFF by applying a negative voltage to the gate voltage of the reset transistor 12, a circuit for generating a gate voltage may be used as the voltage application circuit 60. Thus, the size of the peripheral circuits may be reduced and/or the configuration of the peripheral circuits may be simplified. Although FIG. 6C illustrates the case where V1<Vr and V1<0, the relationship may be such that V1≥Vr and V1<0.

Figure 6D:
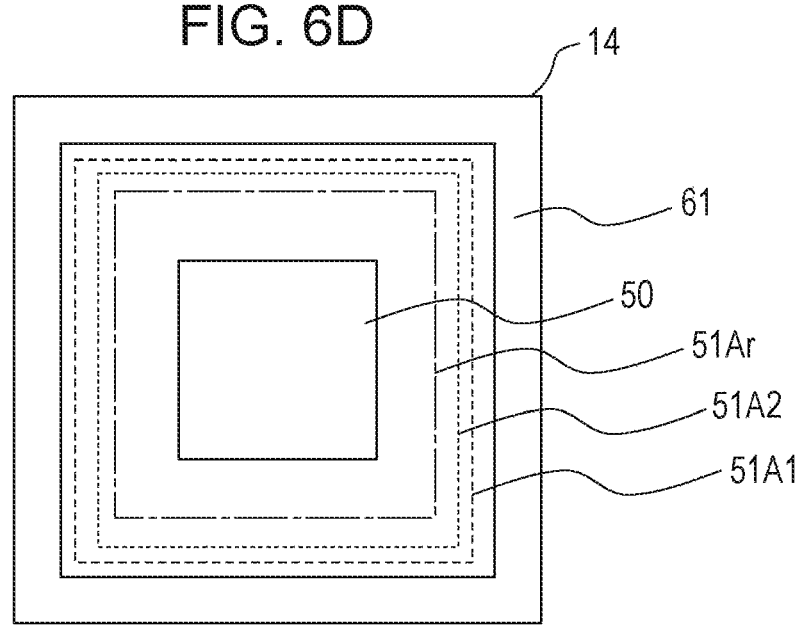
FIG. 6D is a schematic plan view illustrating an example of a region for trapping charges which is formed in the photoelectric conversion layer when the first sensitivity adjustment voltage is applied to the auxiliary electrode together with an example of a region for trapping charges which is formed in the photoelectric conversion layer when the second sensitivity adjustment voltage is applied to the auxiliary electrode.

When an electron serves as a signal charge, it is sufficient to invert the magnitude relationship between V1, V2, Vr as in the case where a hole serves as a signal charge. For instance, the sensitivity adjustment voltages V1 and V2 satisfying V1<V2<Vr may be applied to the auxiliary electrode 61. FIG. 6D is a plan view of a region where signal charges (here, electrons) are trapped by the pixel electrode 50, the plan view seen from a side of the pixel electrode 50 and the auxiliary electrode 61 when sensitivity adjustment voltages V1 and V2 satisfying V1<V2<Vr are applied to the auxiliary electrode 61. It is to be noted that an electron is assumed to serve as a signal charge.

When an electron serves as a signal charge, the lower the voltage applied to the auxiliary electrode 61 is, it is more unlikely that signal charges (here, electrons) are trapped by the auxiliary electrode 61 and the region where signal charges are trapped by the pixel electrode 50 increases. Therefore, the region 51A2 when the sensitivity adjustment voltage V2 lower than Vr is applied is larger than the region 51Ar when Vr is applied. Also, the region 51A1 formed when the sensitivity adjustment voltage V1 further lower than V2 is applied may be made further larger than the region 51A2 when V2 is applied. Therefore, by applying the sensitivity adjustment voltage V2 satisfying the relationship V1<V2<Vr to the auxiliary electrode 61, it is possible to ensure favorable sensitivity to some extent while suppressing color mixing between unit pixel cells. In addition, by applying the sensitivity adjustment voltage V1 to the auxiliary electrode 61, higher sensitivity may be achieved.

Figure 7:
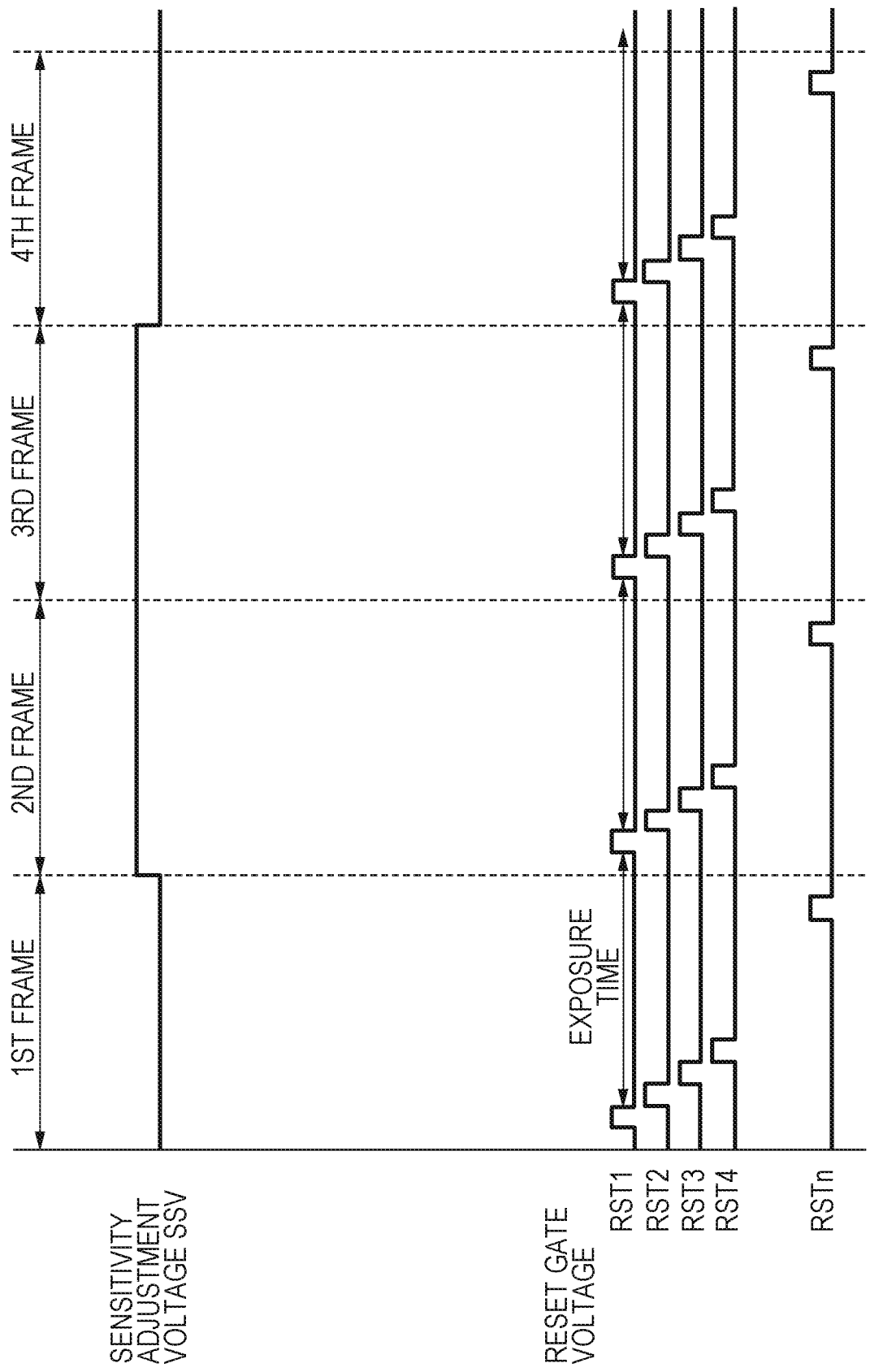
FIG. 7 is a timing chart illustrating an example of timing of change in a sensitivity adjustment voltage and in a reset gate voltage of the imaging device according to the first embodiment.

Next, an exemplary method of driving the imaging device 101 with the sensitivity adjustment voltage varied will be described with reference to FIGS. 1 to 7. FIG. 7 is a timing chart illustrating an example of timing of application of the sensitivity adjustment voltage and exposure in the imaging device 101.

In FIG. 7, RST1, RST2, . . . , RSTn indicate the timing of a gate voltage (hereinafter may be referred to as a reset gate voltage) to be applied to the gate electrodes of the reset transistors 12 included in the 1st, 2nd, . . . , nth rows, respectively. As described with reference to FIG. 1, the imaging device 101 performs, for instance, exposure and reading of signals for each row. This is called a rolling shutter. The charge storage nodes 24 in the unit pixel cells 14 in each row are successively reset during the period of one frame by application of the reset gate voltage. The exposure time corresponds to the period until the subsequent reset gate voltage is applied after the reset gate voltage is applied to each row of the pixel array.

In the example indicated in FIG. 7, sensitivity adjustment voltage SSV applied to the auxiliary electrode 61 is changed at the start of a second frame. As described with reference to FIG. 3, in the present embodiment, the auxiliary electrode 61 is continuously formed over the unit pixel cells 14. That is, in the configuration illustrated in FIG. 3, the sensitivity adjustment voltage applied to the auxiliary electrode 61 is controlled not row by row but as a whole at the same timing. Although the sensitivity adjustment voltage is controlled in the entire pixel array at the same timing, the timing of starting exposure is shifted for each row of the pixel array as seen from FIG. 7. Therefore, when the sensitivity adjustment voltage applied to the auxiliary electrode 61 is changed at any time, the sensitivity adjustment voltage is changed during the exposure time. In the frame (here, the second frame) in which the sensitivity adjustment voltage is changed, the sensitivity is different for each row. Also, the sensitivity adjustment voltage is changed in the middle of the exposure time, and thus incident light is not detectable with proper sensitivity corresponding to the applied sensitivity adjustment voltage. For this reason, the image data picked up in the second frame, in which the sensitivity adjustment voltage is changed, is discarded. In the subsequent third frame, the sensitivity adjustment voltage after the variation has been applied to each row since the start of exposure, and consequently, incident light is detectable with proper sensitivity in all the rows.

Thus, when the sensitivity adjustment voltage applied to the auxiliary electrode 61 is changed per unit of at least two frames, an image with changed sensitivity may be obtained per unit of frame. Thus, according to the present embodiment, the sensitivity of the imaging device may be changed per unit of frame by changing the value of the sensitivity adjustment voltage which is supplied from the voltage application circuit. Consequently, the imaging device that is capable of picking up an image of high quality in various environments in which brightness changes significantly is achieved.

In addition, the auxiliary electrodes 61 of the unit pixel cells 14 are connected to one another and so the sensitivity adjustment voltage may be applied to the auxiliary electrodes 61 at the same time, and thereby wired lines for driving auxiliary electrodes may be reduced.

It is to be noted that Japanese Unexamined Patent Application Publication No. 2008-112907 and International Publication No. WO 2013/001809 disclose the use of a shield electrode for prevention of color mixing. In this technique, it is preferable that the sensitivity adjustment voltage applied to the shield electrode be nearly constant in order to obtain the technical effect. Therefore, the technique of the present disclosure, that is, sensitivity is adjusted by the sensitivity adjustment voltage applied to the auxiliary electrode is based on completely different ideas from the technique disclosed in the cited literature.

Modification of First Embodiment

In the operation described with reference to FIG. 7, the sensitivity adjustment voltage applied to the auxiliary electrode 61 is changed per unit of two frames. However, switching of sensitivity adjustment voltage is not limited to per unit of two frames. As described below, switching of sensitivity adjustment voltage may be performed per unit of one frame.

FIG. 8 is a timing chart illustrating another example of timing of application of the sensitivity adjustment voltage, exposure and signal reading. In the example illustrated in FIG. 8, the voltage application circuit 60 switches the sensitivity adjustment voltage SSV from V0 to Vs in one frame. Furthermore, the voltage application circuit 60 switches the sensitivity adjustment voltage SSV to V0 after elapse of a certain time.

In this example, the voltage V0 is sufficiently low voltage to make the sensitivity of the imaging device 101 nearly 0. That is, in a state where the voltage V0 is applied to the auxiliary electrode 61, most signal charges (here, electron holes) generated in the photoelectric conversion layer 51 are trapped by the auxiliary electrode 61. In other words, in a state where the voltage V0 is applied to the auxiliary electrode 61, the region (see the region 51A illustrated in FIG. 4A and FIG. 4B) where signal charges are trapped by the pixel electrode 50 is sufficiently small, and only a slight amount of signal charges is trapped by the pixel electrode 50. That is, application of the voltage V0 to the auxiliary electrode 61 achieves a state that is as if a photosensitive region is shielded from light. On the other hand, application of voltage Vs moderately higher than the voltage V0 to the auxiliary electrode 61 enables the region 51A to expand moderately where signal charges are trapped by the pixel electrode 50, and it is possible to provide the imaging device 101 with the sensitivity necessary for image pickup.

In the example illustrated in FIG. 8, the voltage Vs is applied to the auxiliary electrode 61 during a certain period in one frame and the voltage V0 is applied to the auxiliary electrode 61 in other periods. Therefore, signal charges are collected by the pixel electrode 50 except for the period in which the voltage V0 is applied to the auxiliary electrode 61 and the sensitivity becomes nearly 0. That is, the period, within a frame, during which the voltage Vs is applied to the auxiliary electrode 61 contributes to the storage of signal charges as effective exposure time.

Like this, according to the present embodiment, it is possible to adjust effective exposure time by the period during which the voltage Vs is applied to the auxiliary electrode 61. As illustrated in FIG. 8, the effective exposure time may be in common between all the unit pixel cells 14. Therefore, it is possible to synchronize the exposure periods in all the unit pixel cells included in the pixel array. That is, a function similar to what is called global shutter may be achieved by changing the sensitivity adjustment voltage in each frame without separately providing a capacity element for storing signal charges in each pixel.

FIG. 9 is a timing chart illustrating still another example of timing of application of the sensitivity adjustment voltage, exposure and signal reading. As described with reference to FIG. 8, the sensitivity in the imaging device 101 may be decreased to nearly 0 by applying the voltage V0 with an appropriate magnitude to the auxiliary electrode 61. That is, it is possible to use the sensitivity adjustment voltage applied to the auxiliary electrode 61 instead of a shudder. Similarly to the example described with reference to FIG. 8, also in this example, signal charges are stored in the period during which the voltage Vs is applied to the auxiliary electrode 61. The period during which the voltage V0 is applied to the auxiliary electrode 61 does not effectively contribute to acquisition of an image.

In the example illustrated in FIG. 9, the voltage application circuit 60 switches the sensitivity adjustment voltage SSV between V0 and Vs periodically. Therefore, an effective exposure period and a non-exposure period are repeated periodically. For instance, when image pickup is performed using a lighting fixture having periodic flickering, the effect of the periodic flickering of the lighting fixture may be canceled by varying the voltage applied to the auxiliary electrode 61 periodically.

FIG. 10 is a timing chart illustrating still another example of timing of application of the sensitivity adjustment voltage, exposure and signal reading. FIG. 10 is a timing chart for explaining an example of operation in an imaging device having a flash (for instance, see FIG. 14B described later). FIG. 10 illustrates the change in the sensitivity adjustment voltage SSV, the change in the reset gate voltage of each row of the pixel array, and the timing of firing the flash.

In the example illustrated in FIG. 10, a flash operation is performed in the second frame. The voltage application circuit 60 changes the sensitivity adjustment voltage SSV in synchronization with the flash. Specifically, the voltage application circuit 60 applies the voltage Vs to the auxiliary electrode 61 during the period in which the flash is off, and, applies voltage Vt lower than the voltage Vs to the auxiliary electrode 61 during the period in which the flash is on. That is, the flash operation is performed so that the sensitivity of the imaging device is low during the period in which the flash is on.

In this manner, the sensitivity adjustment voltage SSV may be changed so that the sensitivity of the imaging device is temporarily decreased during the period in which the flash is on. The temporary decrease in the sensitivity of the imaging device during the period in which the flash is on may suppress occurrence of an overexposed white area. In addition, the effect of locus of light due to movement of a bright spot such as reflection of flash may be removed. Instead of the voltage Vt, the aforementioned voltage V0, which makes the sensitivity of the imaging device nearly 0, may be applied to the auxiliary electrode 61.

FIG. 11 is a timing chart illustrating still another example of timing of application of the sensitivity adjustment voltage, exposure and signal reading. FIG. 11 illustrates the change in the sensitivity adjustment voltage SSV, the change in the reset gate voltage of each row of the pixel array, and the change in the voltage applied to the upper electrode 52. As described below, the magnitude of a voltage applied to the upper electrode 52 may be changed according to the change in the sensitivity adjustment voltage SSV.

Here, similarly to the example described with reference to FIG. 8, the period in which the voltage V0 is applied to the auxiliary electrode 61 and the period in which the voltage Vs is applied to the auxiliary electrode 61 are provided in each frame. The sensitivity in the period during which the voltage V0 is applied to the auxiliary electrode 61 is lower than the sensitivity in the period during which the voltage Vs is applied to the auxiliary electrode 61. However, the sensitivity of the imaging device may not be sufficiently decreased only by the adjustment of the sensitivity adjustment voltage.

In the example illustrated in FIG. 11, the voltage applied to the upper electrode 52 is changed via photoelectric converter control line 16 (see FIG. 1) according to the change in the sensitivity adjustment voltage. Specifically, a predetermined voltage Vp is applied to the upper electrode 52 in the period (the effective exposure period) during which the voltage Vs is applied to the auxiliary electrode 61, and voltage Vq lower than the voltage Vp is applied to the upper electrode 52 in the period during which the voltage V0 is applied to the auxiliary electrode 61. Like this, the potential of the upper electrode 52 is reduced in the periods other than the effective exposure period, and thus the sensitivity of the imaging device 101 may be further decreased. An electronic shutter operation may be performed more effectively by adjusting the voltage of the upper electrode 52 in addition to the sensitivity adjustment voltage. The voltage applied to the upper electrode 52 may be supplied via the photoelectric converter control line 16 from the voltage application circuit 60 or the vertical scanning circuit 15.

Second Embodiment

Next, an imaging device according to the present embodiment will be described with reference to FIGS. 12A to 13B.

The imaging device of the present embodiment differs from the imaging device of the first embodiment in that the auxiliary electrodes are electrically separated row by row. The configuration of components other than the auxiliary electrode and the voltage application circuit may be the same as that of the first embodiment, and thus the auxiliary electrode and the voltage application circuit will be mainly described.

FIG. 12A schematically illustrates an example of planar structure of an auxiliary electrode of the present embodiment. The imaging device of the present embodiment includes auxiliary electrode rows $61_1$, $61_2$, ..., $61_n$ for which the auxiliary electrodes 61 of the unit pixel cells 14 within each row are electrically connected. The auxiliary electrode rows $61_1$, $61_2$, ..., $61_n$ are electrically separated from one another.

As illustrated, the auxiliary electrode rows $61_1$, $61_2$, ..., $61_n$ each have a connection to the voltage application circuit 60A. The voltage application circuit 60A is configured to supply at least two sensitivity adjustment voltages to each of the auxiliary electrode rows $61_1$, $61_2$, ..., $61_n$ individually. In the following example described with reference to FIG. 12A, switching between the two sensitivity adjustment voltages is performed at different times for each auxiliary electrode row.

FIG. 12B is an example of a timing chart illustrating the timing of application of the sensitivity adjustment voltage, exposure and signal reading in the configuration illustrated in FIG. 12A. In FIG. 12B, SSV1, SSV2, ..., SSVn illustrate the timing of the change in the sensitivity adjustment voltage applied to the auxiliary electrode rows $61_1$, $61_2$, ..., $61_n$, respectively.

The imaging device of the present embodiment can change the sensitivity adjustment voltage applied to each row of the pixel array at mutually different timing. Therefore, as illustrated in FIG. 12B, the sensitivity adjustment voltage is changeable in each row of the pixel array according to a time at which the reset gate voltage is switched from a high level to a low level, for instance. Thus, the sensitivity adjustment voltage in each frame may be made nearly constant in each row of the pixel. That is, the sensitivity is changeable per unit of frame in each row.

With the imaging device of the present embodiment, change in the sensitivity adjustment voltage in the middle of an exposure period is avoidable, and thus proper image pickup is performed in every frames. Consequently, continuous frame shooting is possible and the sensitivity is adjustable per unit of frame. For instance, in the imaging device of the present embodiment, the sensitivity is adjustable per unit of frame, and thus even in a shooting environment in which brightness changes rapidly, the sensitivity is adjustable by coping with change of brightness quickly.

The imaging device of the present embodiment is also applicable to a drive method of adjusting an exposure time by an electronic shutter. For instance, as illustrated in FIG. 12C, the period during which the reset gate voltage is set to a high level is provided twice in one frame period in each row of the pixel array. Thus, it is possible to divide one frame period into non-exposure time and exposure time. The exposure time is changeable by changing the time at which the reset gate voltage is set to a high level again in one frame period.

When control of exposure time is applied using such an electronic shutter, it is sufficient that the sensitivity adjustment voltage be changed in a non-exposure time as illustrated in FIG. 12C. Thus, the sensitivity adjustment voltage is not changed in the middle of an exposure period in each row, and nearly constant sensitivity adjustment voltage may be applied over the entire exposure periods. Therefore, an imaging device that allows proper image pickup in every frames, enables continuous frame shooting, and is capable of adjusting the sensitivity per unit of frame is achieved. Also, it is possible to adjust the exposure time by an electronic shutter.

In the example described with reference to FIGS. 12A to 12C, the auxiliary electrodes of the unit pixel cells 14 in each row are electrically connected to one another and constitute the auxiliary electrode rows. The auxiliary electrode rows are electrically separated from one another. However, the auxiliary electrodes may form groups each of which includes n rows (n is an integer greater than or equal to 2) rather than 1 row. The auxiliary electrodes in each group may be electrically connected to one another and the groups may be electrically separated from one another.

FIG. 13A schematically illustrates a planar structure of pixel electrodes in which 2 rows of the pixel array form one group. In the configuration illustrated in FIG. 13A, for instance, the auxiliary electrodes of the unit pixel cell 14 included in the 1st row of the pixel array and the auxiliary electrodes of the unit pixel cell 14 included in the 2nd row of the pixel array form one group. As illustrated, the auxiliary electrodes belonging to the group are integrally formed, and thus electrically connected to one another. In the configuration illustrated in FIG. 13A, it may be stated that the auxiliary electrodes include a structure in which the auxiliary electrode row $61_1$ and the auxiliary electrode row $61_2$ illustrated in FIG. 12A are integrally formed.

As illustrated, each of the groups that each include 2 rows of the pixel array is connected to voltage application circuit 60B. The voltage application circuit 60B is configured to supply at least two sensitivity adjustment voltages to each group individually.

FIG. 13B illustrates an example of a timing chart for changing the sensitivity adjustment voltage in the imaging device having the electrode structure illustrated in FIG. 13A. FIG. 13B illustrates the timing of application of the sensitivity adjustment voltage, exposure and signal reading. In this example, switching between sensitivity adjustment voltages is performed every 2 rows. As illustrated in FIG. 13B, the timing of change in sensitivity adjustment voltage in each of the sets SSV1 and SSV2, and SSV3 and SSV4, etc. is common. Also, as seen with reference to the change in the set of RST1 and RST2, the set of RST3 and RST4, etc., the reset gate voltage is also switched every 2 rows. Therefore, the electronic shutter is also controlled every 2 rows.

It is to be noted that in FIG. 13B, changes in the voltages such as SSV1 and SSV2 of the auxiliary electrode rows corresponding to 2 rows of the pixel array are separately illustrated, and in this example, 2 auxiliary electrode rows form one group and the auxiliary electrodes 61 in each group are electrically connected to one another. Therefore, practically, SSV1 and SSV2 may have a common signal. Reset gate voltage signals such as RST1 and RST2 may be common, that are supplied to the unit pixel cells 14 corresponding to the auxiliary electrode rows belonging to the same group.

In the imaging device in this configuration, n rows as a unit may have a common change in the sensitivity adjustment voltage to be supplied to the pixel array. Therefore, the number of signals for adjusting the sensitivity may be reduced to 1/n the number of rows. Consequently, it is possible to reduce the size of the voltage application circuit 60B, simplify the circuit, and decrease the number of wired lines for driving the auxiliary electrode 61.

Third Embodiment

An imaging device according to the present embodiment will be described with reference to FIG. 14A.

The imaging device of the present embodiment differs from the imaging device of the first embodiment in that a light quantity detection circuit is further included. The configuration of components other than the light quantity detection circuit may be the same as that of the first embodiment. The light quantity detection circuit will be mainly described.

Figure 14A:
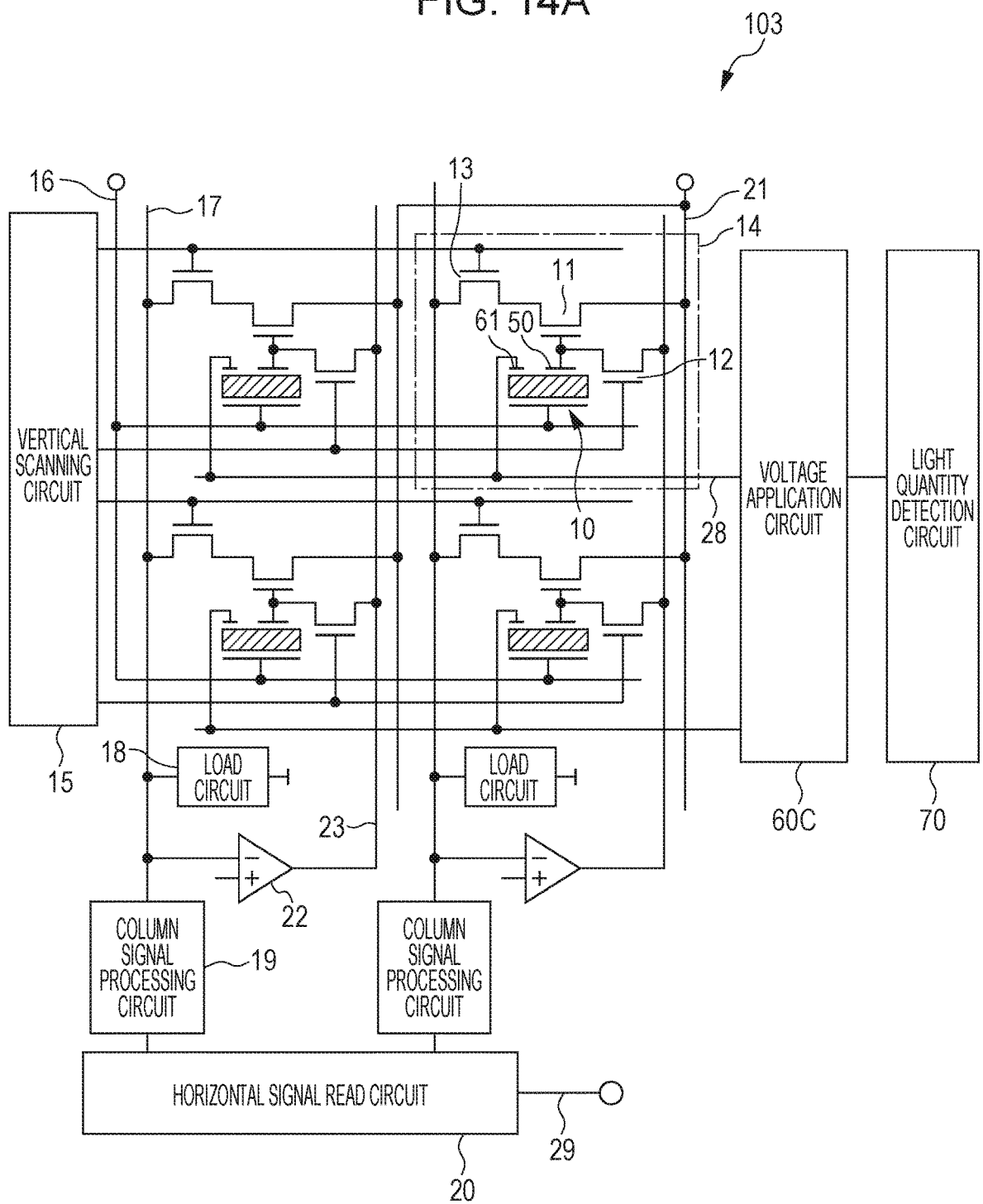
FIG. 14A is a schematic diagram illustrating an example of a circuit configuration of an imaging device according to a third embodiment.

FIG. 14A schematically illustrates an example of a circuit configuration of an imaging device 103 according to the present embodiment. The imaging device 103 further includes a light quantity detection circuit 70 in addition to the components of the imaging device 101 of the first embodiment. The light quantity detection circuit 70 includes a light detection device and detects a quantity of light per unit area, which is incident to the photoelectric converter 10. The quantity of light per unit area may be illumination.

The light quantity detection circuit 70 outputs a detection signal regarding the quantity of light per unit area to the voltage application circuit 60C. The voltage application circuit 60C applies a sensitivity adjustment voltage according to the detection signal to the auxiliary electrode 61 of each unit pixel cell 14. In the present embodiment, a hole is assumed to serve as a signal charge. For instance, when a large quantity of light is incident to the photoelectric conversion layer per unit area and a detection signal is high, the voltage application circuit 60C supplies a relatively low sensitivity adjustment voltage to the unit pixel cell 14. Application of a relatively low voltage to the auxiliary electrode 61 causes the sensitivity of the imaging device 103 to decrease as described in the first embodiment. Therefore, a high quality image in which overexposed white areas are reduced may be obtained.

Also, when a small quantity of light is incident to the photoelectric conversion layer per unit area and a detection signal is low, the voltage application circuit 60C supplies a relatively high sensitivity adjustment voltage to the unit pixel cell 14. Application of a relatively high voltage to the auxiliary electrode 61 causes the sensitivity of the imaging device 103 to increase. Therefore, a high quality image in which underexposed black areas are reduced may be obtained.

In this manner, with the imaging device of the present embodiment, the sensitivity is automatically adjusted and image pickup may be performed with an appropriate sensitivity according to the ambient brightness.

Modification of Third Embodiment

Figure 14B:
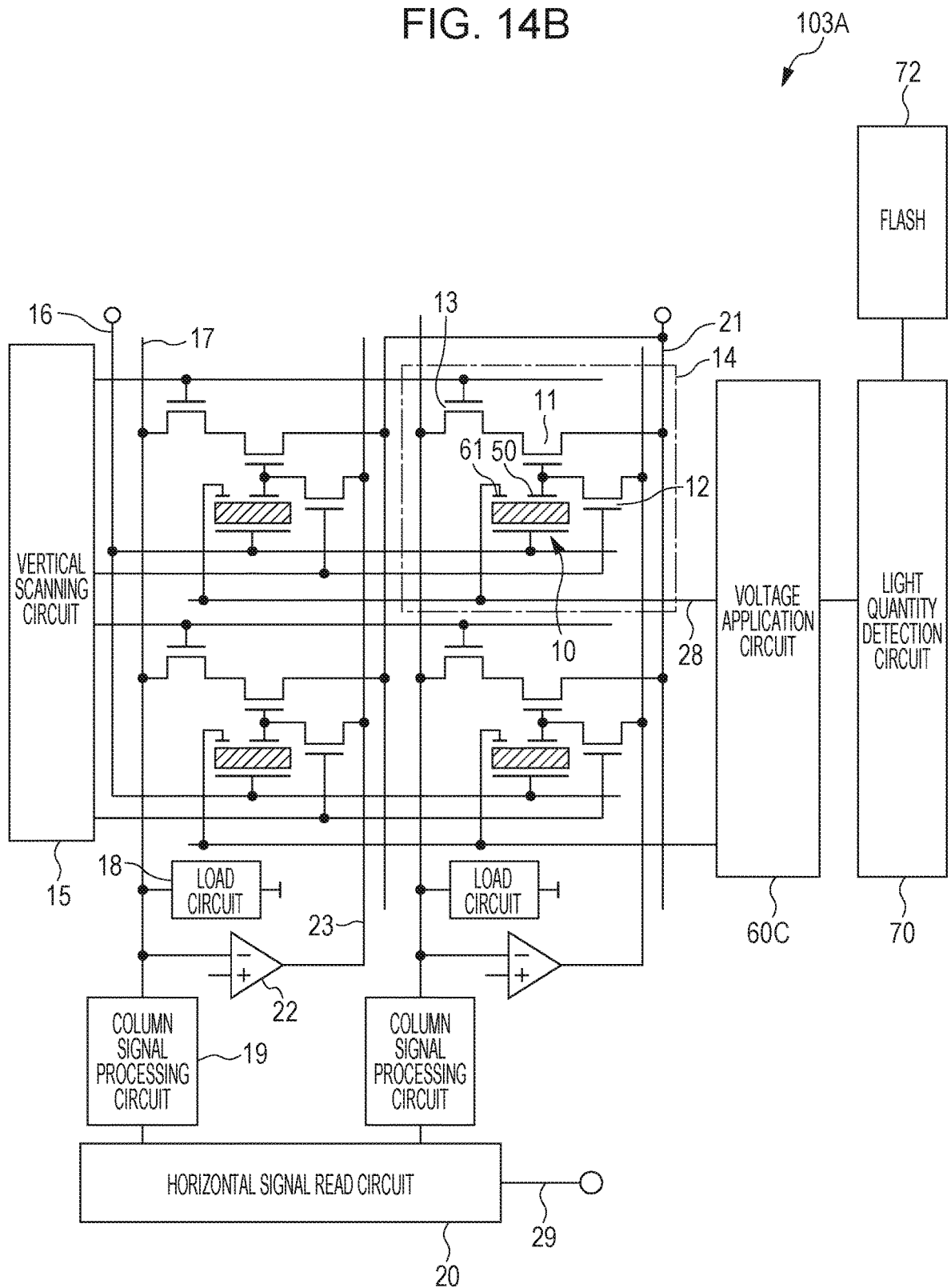
FIG. 14B is a schematic diagram illustrating another example of a configuration of the imaging device according to the third embodiment.

FIG. 14B illustrates another example of a configuration of an imaging device according to a third embodiment. The imaging device 103A illustrated in FIG. 14B has a flash 72. As described with reference to FIG. 10 in the configuration illustrated in FIG. 14B, an operation may be performed such that the sensitivity of the imaging device 103A is temporarily reduced in synchronization with the timing of firing of the flash. For instance, the voltage application circuit 60C may supply a sensitivity adjustment voltage to the unit pixel cell 14, the sensitivity adjustment voltage causing the sensitivity of the imaging device 103A to temporarily reduce in synchronization with the timing of firing of the flash.

Figure 15:
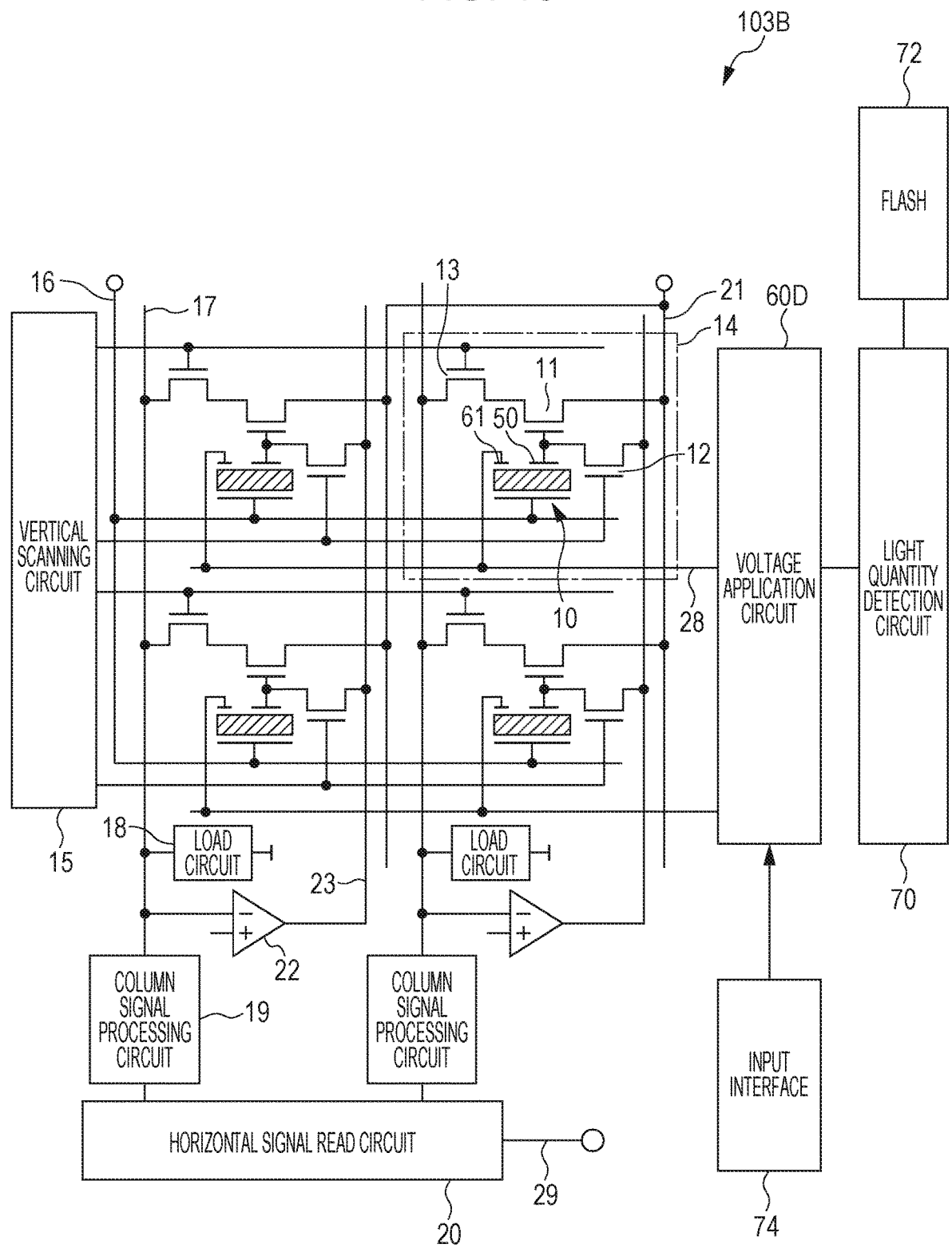
FIG. 15 is a schematic diagram illustrating still another example of a configuration of the imaging device according to the third embodiment.

FIG. 15 illustrates still another example of a configuration of the imaging device according to the third embodiment. The imaging device 103B illustrated in FIG. 15 has an input interface 74. In the configuration illustrated to FIG. 15, the input interface 74 receives an input from a user. Here, the input interface 74 is configured to receive at least input of F value from a user. The example of the input interface 74 includes a button, a dial, and a touch screen.

According to the embodiments of the present disclosure, as already described with reference to FIG. 4B and FIG. 4D, change in the sensitivity adjustment voltage applied to the auxiliary electrode 61 makes it possible to change the size of the region (for instance, see the region 51A illustrated in FIG. 4B and the region 51C illustrated in FIG. 4D) where signal charges are trapped by the pixel electrode 50. That is, the size of the region that contributes to generation of signal charges may be changed in each unit pixel cell 14 according to the value of the sensitivity adjustment voltage. As seen from the comparison between FIG. 4B and FIG. 4D, the region 51A illustrated in FIG. 4B is smaller than the region 51C illustrated in FIG. 4D, and the outer periphery of the region 51A is located inside the outer periphery of the region 51C. As illustrated in FIG. 4B, the region (for instance, the region 51A) which is formed in the photoelectric conversion layer and in which signal charges are trapped by the pixel electrode 50 is relatively small, and therefore in a state where the sensitivity of the imaging device is adjusted to be low, the incident light to a position away from the center of the unit pixel cell 14 does not contribute to formation of an image. That is, a state where the region where signal charges are trapped by the pixel electrode 50 is reduced corresponds to a state where the F value of the camera is increased. This indicates that the F value is controllable by changing the size of the region 51A where signal charges are trapped by the pixel electrode 50, using the sensitivity adjustment voltage.

FIG. 15 is referred. In the configuration illustrated to FIG. 15, the voltage application circuit 60D supplies a sensitivity adjustment voltage to the pixel array according to an input from the input interface 74. For instance, when a first value as the F value is specified via the input interface 74, the voltage application circuit 60D applies a first sensitivity adjustment voltage (for instance, −2 V) to the auxiliary electrode 61. When a second value smaller than the first value as the F value is specified via the input interface 74, the voltage application circuit 60D applies a second sensitivity adjustment voltage (for instance, 5 V) to the auxiliary electrode 61. Application of the second sensitivity adjustment voltage to the auxiliary electrode 61 causes the region where signal charges are trapped by the pixel electrode 50 to be increased compared with the case where the first sensitivity adjustment voltage is applied to the auxiliary electrode 61. The increase of the region where signal charges are trapped by the pixel electrode 50 achieves a state similar to a state where the F value of the camera is reduced.

In this manner, according to the embodiment of the present disclosure, the F value is controllable by adjusting the sensitivity adjustment voltage. For the control of the F value using the sensitivity adjustment voltage, no diaphragm mechanism needs to be provided, and thus it is also possible to change the F value continuously. It is to be noted that in this example, the F value is controlled by changing the sensitivity adjustment voltage based on an operation of the input interface 74 by a user. However, the control of the F value is not limited to the above-described example. For instance, control of the F value may be performed automatically by determining the value of the sensitivity adjustment voltage based on the result of detection by the light quantity detection circuit.

Figure 16:
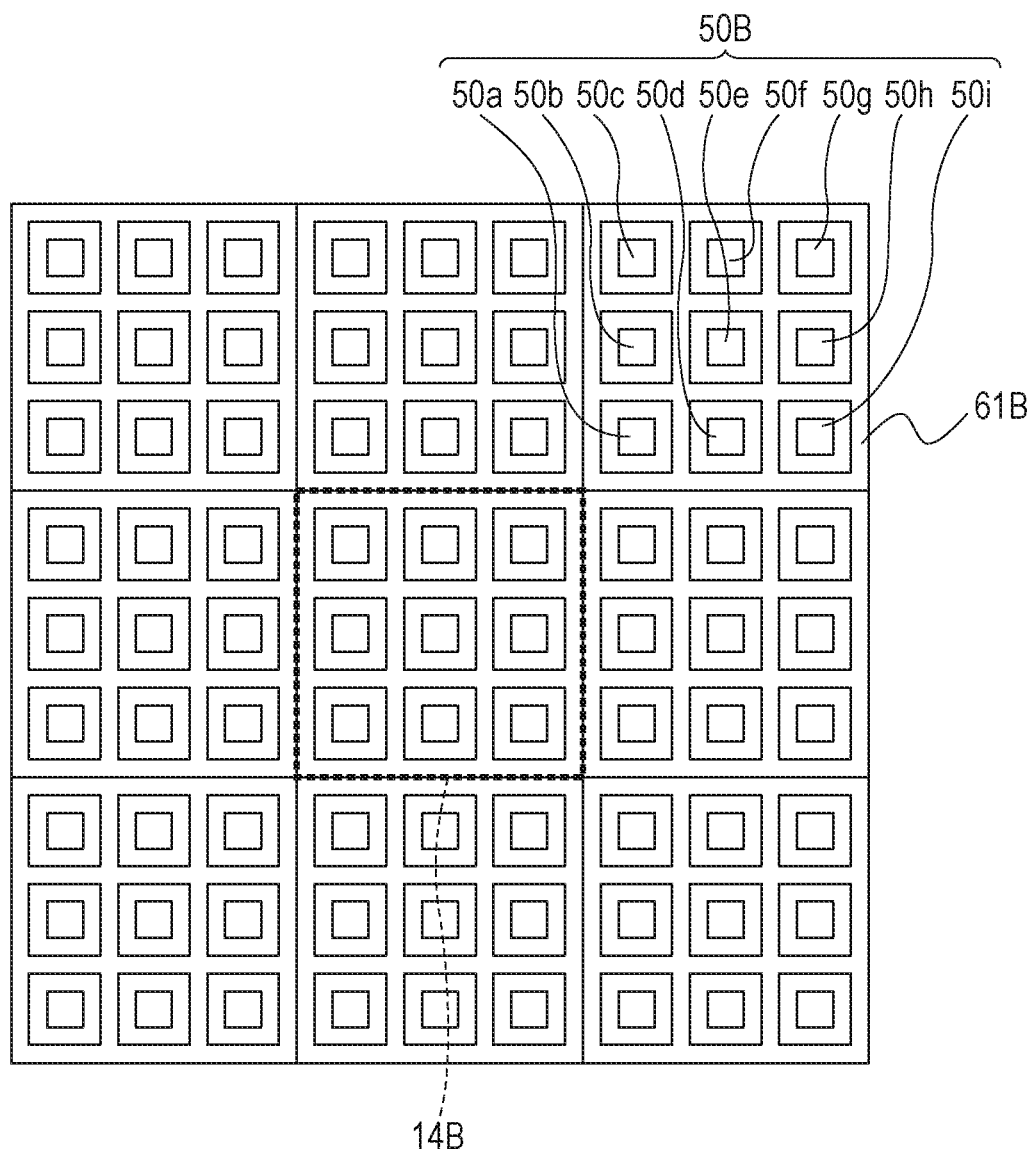
FIG. 16 is a plan view illustrating an example of disposition of pixel electrodes and auxiliary electrodes in an imaging device having an input interface.

FIG. 16 illustrates an example of disposition of pixel electrodes and auxiliary electrodes in the imaging device having the input interface 74.

FIG. 16 illustrates nine unit pixel cells selected from the unit pixel cells in the pixel array. The pixel electrode 50B in each of the unit pixel cells 14B illustrated in FIG. 16 includes nine sub-pixel electrodes 50a to 50i. The sub-pixel electrodes 50a to 50i are connected to the gate electrode 39B (see FIG. 2) of the same amplification transistor 11 and thus are electrically connected to one another. That is, at the time of an operation of the imaging device, the potentials of the sub-pixel electrodes 50a to 50i in a unit pixel cell 14B are the same. It is to be noted that in the imaging device of the present disclosure, a unit pixel cell to which a pixel electrode of interest belongs is determined by an amplification transistor having the gate electrode to which the pixel electrode is connected. That is, when a pixel electrode is connected to the gate electrode of a first amplification transistor and anther pixel electrode is connected to the gate electrode of a second amplification transistor, these two pixel electrodes are distinguished as electrodes belonging to different unit pixel cells.

In this example, the sub-pixel electrodes 50a to 50i are spatially separately disposed, and the auxiliary electrode 61B encloses each of the sub-pixel electrodes 50a to 50i. In this example, the auxiliary electrodes 61B are electrically connected to one another between the unit pixel cells 14B. Needless to say, the number, shape, and disposition of the sub-pixel electrodes in the unit pixel cell 14B are not limited to the example illustrated in FIG. 16. The shape of the auxiliary electrode 61B is not limited to the example illustrated in FIG. 16, either.

As described above, according to the embodiment of the present disclosure, change in the sensitivity adjustment voltage makes it possible to change the size of the region which is in the photoelectric conversion layer 51 and in which signal charges are trapped by the pixel electrode 50. The sensitivity of the imaging device changes as the size of the region where signal charges are trapped by the pixel electrode 50 is changed. That is, it is possible to control the sensitivity of the imaging device using the sensitivity adjustment voltage.

However, when the size of the region where signal charges are trapped by the pixel electrode 50 is extremely changed in accordance with a change in the sensitivity adjustment voltage, the change in the size of the region may cause an unintended change of the F value. This is because the change in the size of the region which is in the photoelectric conversion layer 51 and in which signal charges are trapped by the pixel electrode 50 causes an effect similar to an effect caused by changing the size of the diaphragm in the camera.

In the configuration illustrated in FIG. 16, the sub-pixel electrodes 50a to 50i, which are spatially separated by the auxiliary electrode 61B, are provided within the unit pixel cell 14B. Thus, it is possible to form mutually separated sub-regions in a single unit pixel cell 14B correspondingly to the sub-pixel electrodes 50a to 50i. These sub-regions are regions where signal charges are trapped by the sub-pixel electrodes 50a to 50i. When the sensitivity adjustment voltage is changed, the size of each of the sub regions formed in the unit pixel cell 14B is changed. Therefore, the sensitivity of the imaging device changes in accordance with the change in the sensitivity adjustment voltage.

At this point, the change in the size of each of the sub-regions in accordance with the change in the sensitivity adjustment voltage is in general smaller than the change in the size of the region (for instance, see the region 51A illustrated in FIG. 4B) where signal charges are trapped by the pixel electrode 50 in the configuration in which the unit pixel cell 14 is provided with a single pixel electrode. That is, formation of sub-regions in each unit pixel cell 14B reduces the range of the change in the size of each of the sub-regions while achieving an effect of sensitivity adjustment due to the change in the sensitivity adjustment voltage. Therefore, it is possible to suppress unintended change in the F value while maintaining the effect of the sensitivity adjustment due to the change in the sensitivity adjustment voltage.

It is to be noted that it is also possible to reduce the range of change in the size of the region where signal charges are trapped by the pixel electrode 50 by decreasing the distance L1 (for instance, see FIG. 3) between the pixel electrode 50 and the auxiliary electrode 61 without dividing the pixel electrodes 50 in each unit pixel cell 14. However, it is difficult to sufficiently ensure the range of change in the size of the region where signal charges are trapped by the pixel electrode 50 by simply decreasing the distance L1 in each unit pixel cell 14, and thus sufficient sensitivity adjustment effect is not likely to be obtained.

Fourth Embodiment

An imaging device according to the present embodiment will be described with reference to FIG. 17.

The imaging device of the present embodiment differs from the imaging device of the first embodiment in that an image processing circuit is further included. Also, the voltage application circuit supplies two or more different sensitivity adjustment voltages to the pixel array. The configuration of components other than the image processing circuit and the voltage application circuit may be the same as that of the first embodiment. These circuits will be mainly described.

Figure 17:
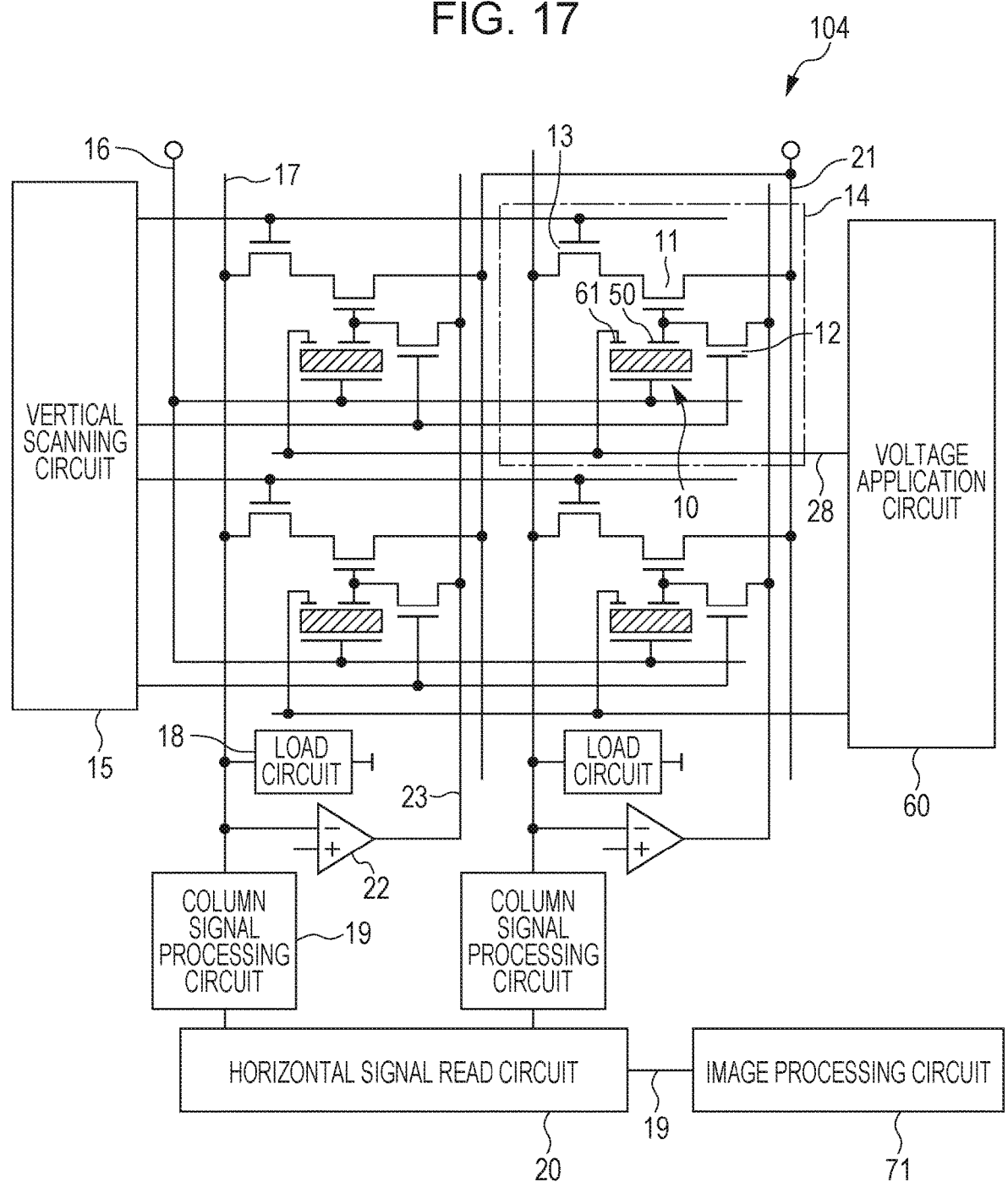
FIG. 17 is a schematic diagram illustrating an example of a circuit configuration of an imaging device according to a fourth embodiment.

FIG. 17 schematically illustrates an example of a circuit configuration of the imaging device according to the present embodiment. The imaging device 104 further includes an image processing circuit 71 in addition to the components of the imaging device 101 of the first embodiment. The imaging device 104 of the present embodiment picks up the same scene multiple times with different sensitivities and synthesizes images with different sensitivities. By combining the images obtained with different sensitivities, an image of a scene having a large contrast ratio without overexposed white area or underexposed black area is generated. Such a shooting method is called high dynamic range imaging.

In the present embodiment, the voltage application circuit 60 successively supplies two or more sensitivity adjustment voltages to each unit pixel cell 14, the two or more sensitivity adjustment voltages having a relationship of Vd1>Vd2>...>Vdm (m is an integer greater than or equal to 2), for instance.

For each of the sensitivity adjustment voltages of Vd1, Vd2, ..., Vdm, the imaging device 104 picks up an image with the sensitivity adjustment voltage applied. Image signals G1, G2, ..., Gm obtained by the pick-up are outputted from the horizontal signal read circuit 20 to the image processing circuit 71. For instance, for a frame, image pick-up is performed with V1 applied as the sensitivity adjustment voltage, and for the subsequent frame, image pick-up is performed with one selected from Vd2 to Vdm applied as the sensitivity adjustment voltage.

For instance, when a hole serves as a signal charge, in a range in which the sensitivity adjustment voltage is lower than the voltage of the upper electrode, the higher the sensitivity adjustment voltage is, the higher the sensitivity of the imaging device 104 is, and the lower the sensitivity adjustment voltage is, the lower the sensitivity of the imaging device 104 is. For this reason, at least a signal of an image having a relatively low sensitivity and less overexposed white area and a signal of an image having a relatively high sensitivity and less underexposed black area are outputted to the image processing circuit 71. For instance, the image processing circuit 71 synthesizes these two images and generates and outputs a synthetic image. A method for combining two or more images with different sensitivities is not limited to a specific method, and various signal processing methods used for high dynamic range imaging may be applicable.

Even in a portion having a high luminance or a portion having a low luminance in an obtained synthetic image, occurrence of overexposed white area or underexposed black area is suppressed. Thus, with the imaging device of the present embodiment, it is possible to expand the dynamic range of the imaging device.

Modification of Fourth Embodiment

Figure 18:
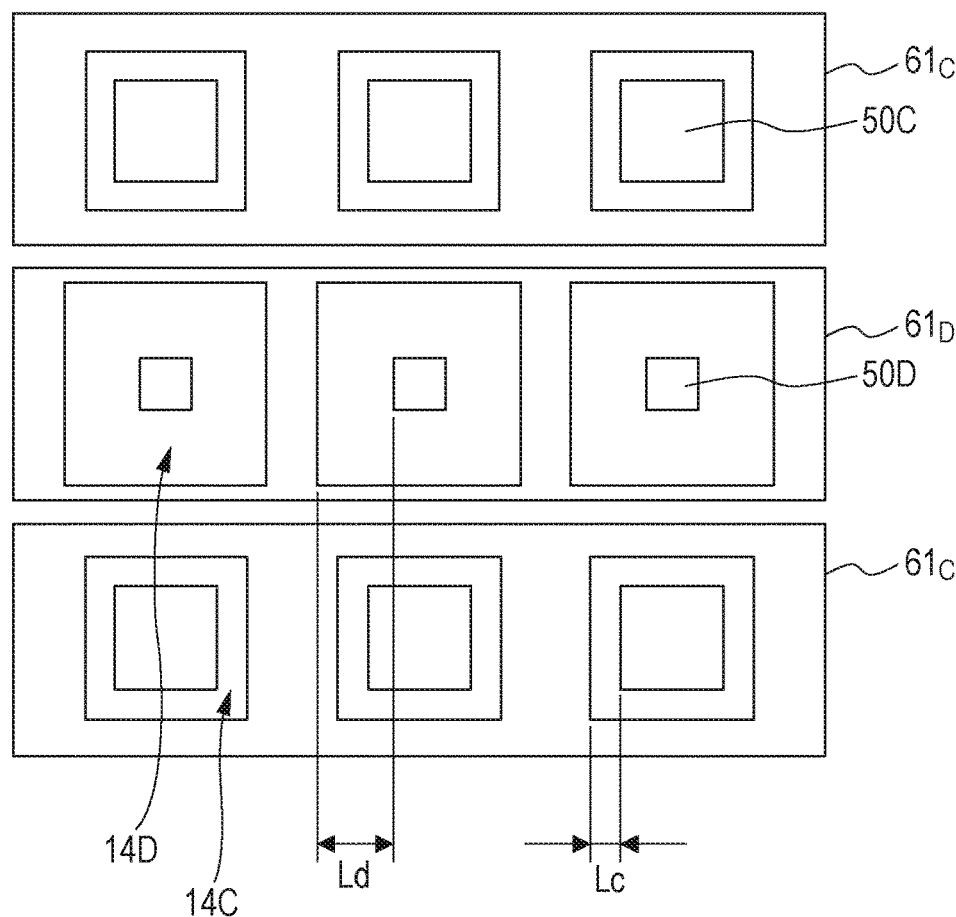
FIG. 18 is a plan view illustrating an example of disposition of pixel electrodes and auxiliary electrodes in the imaging device according to the fourth embodiment.

FIG. 18 illustrates an another example of disposition of pixel electrodes and auxiliary electrodes in the imaging device according to the fourth embodiment. FIG. 18 illustrates nine unit pixel cells selected from the unit pixel cells in the pixel array. As described below, unit pixel cells having different functions may be provided in the pixel array in a mixed manner.

In the configuration illustrated in FIG. 18, unit pixel cell 14C including pixel electrode 50C and unit pixel cell 14D including pixel electrode 50D having a smaller area than the pixel electrode 50C are alternately disposed in every other row. In FIG. 18, the unit pixel cells 14C are disposed in odd rows of the pixel array, and the unit pixel cells 14D are disposed in even rows of the pixel array. As illustrated, in the rows (here, odd rows) in which the unit pixel cells 14C are disposed and in the rows (here, even rows) in which the unit pixel cells 14D are disposed, there are provided auxiliary electrode rows 61$_C$ each formed so as to surround the pixel electrode 50C and auxiliary electrode rows 61$_D$ each formed so as to surround the pixel electrode 50D.

A space is formed between the pixel electrode 50C and the auxiliary electrode row 61$_C$ of each unit pixel cell 14C. The size of the space, that is, the distance between the pixel electrode 50C and the auxiliary electrode row 61$_C$ is Lc. A space is also formed between the pixel electrode 50D and the auxiliary electrode row 61$_D$ of each unit pixel cell 14D. The size of the space, that is, the distance between the pixel electrode 50D and the auxiliary electrode row 61$_D$ is Ld. As schematically illustrated in FIG. 18, the distance Ld is greater than the distance Lc here. Therefore, for instance, even when the same sensitivity adjustment voltage is applied to the auxiliary electrode row 61$_C$ and the auxiliary electrode row 61$_D$, the size of the region where signal charges are trapped by the pixel electrode 50C formed in the unit pixel cell 14C is different from the size of the region where signal charges are trapped by the pixel electrode 50D formed in the unit pixel cell 14D. That is, in this example, even when a common sensitivity adjustment voltage is applied, the size of the region where signal charges are trapped by each pixel electrode are different between odd rows and even rows. In other words, in photosensitive regions, the sensitivity of the unit pixel cell 14C and the sensitivity of the unit pixel cell 14D are different from each other.

In the imaging device having such an electrode structure, an image of an object is picked up, for instance, with the same sensitivity adjustment voltage applied to the auxiliary electrode row 61$_C$ and the auxiliary electrode row 61$_D$. After the image pickup, for instance, the image processing circuit 71 (see FIG. 17) forms the image of the object based on the output from each unit pixel cell.

In this process, the image processing circuit 71 is able to form a first image using an image signal outputted from the unit pixel cell 14C as well as a second image using an image signal outputted from the unit pixel cell 14D. In this example, even when the same sensitivity adjustment voltage is applied to the auxiliary electrode row 61$_C$ and the auxiliary electrode row 61$_D$, the size of the region where signal charges are trapped by the pixel electrode 50C formed in the unit pixel cell 14C is different from the size of the region where signal charges are trapped by the pixel electrode 50D formed in the unit pixel cell 14D. Therefore, the first image and second image are images that are obtained with different sensitivities. That is, pixels having different sizes of the space between the pixel electrode and the auxiliary electrode (here, auxiliary electrode row) are provided in the pixel array in a mixed manner, and thereby an image picked up with different sensitivities is obtainable at a time.

In this manner, with the configuration illustrated in FIG. 18, an image picked up with different sensitivities is obtainable at a time. Therefore, it is possible to perform high dynamic range imaging at a high speed, for instance.

The auxiliary electrode row 61$_C$ and the auxiliary electrode row 61$_D$ may be electrically separated from each other by being disposed in a spatially separated manner as illustrated in FIG. 18. Alternatively, the auxiliary electrode row 61$_C$ and the auxiliary electrode row 61$_D$ may be electrically connected to each other by being integrally formed. The auxiliary electrode row 61$_C$ and the auxiliary electrode row 61$_D$ may be electrically separated from each other, and thereby different sensitivity adjustment voltages may be independently applied to the auxiliary electrode row 61$_C$ and the auxiliary electrode row 61$_D$. When the auxiliary electrode row 61$_C$ and the auxiliary electrode row 61$_D$ are integrally formed, the number of wired lines between the voltage application circuit 60 and the pixel array may be reduced.

In the configuration illustrated in FIG. 18, the auxiliary electrodes are separated row by row. However, the configuration of the auxiliary electrodes is not limited to this example, and the auxiliary electrodes may be separated for each unit pixel cell, for instance.

Figure 19:
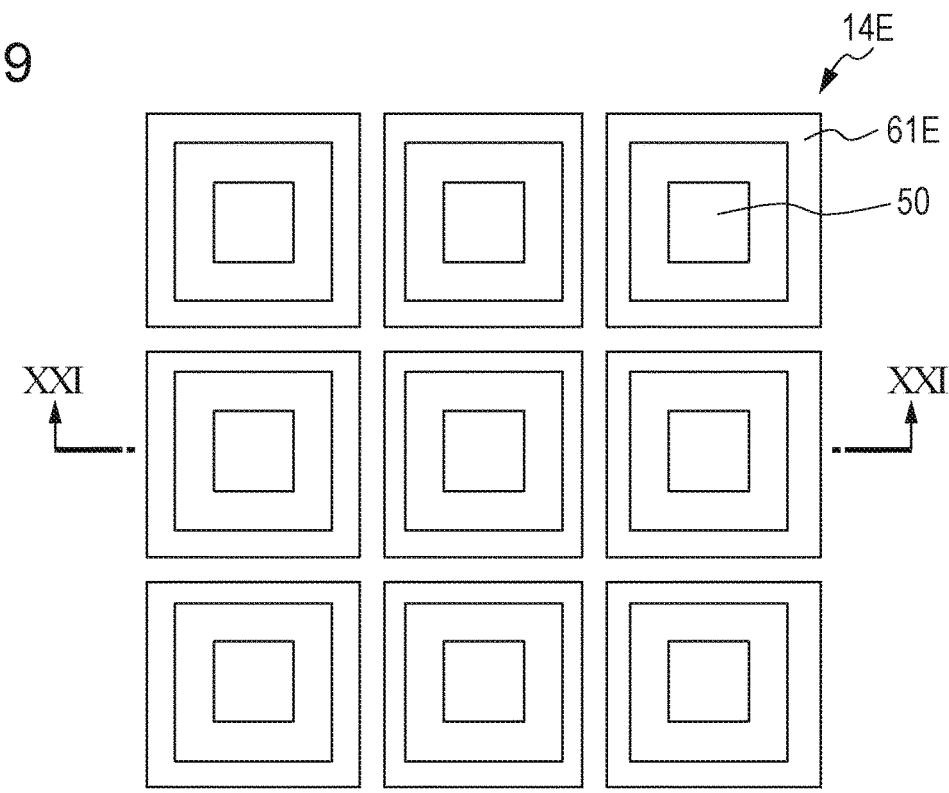
FIG. 19 is a plan view illustrating another example of disposition of the pixel electrodes and the auxiliary electrodes in the imaging device according to the fourth embodiment.

FIG. 19 illustrates another example of disposition of the pixel electrodes and auxiliary electrodes in the imaging device according to the fourth embodiment. In the configuration illustrated in FIG. 19, each of the unit pixel cells 14E includes the pixel electrode 50 and auxiliary electrode 61E. In the example illustrated in FIG. 19, the distance between the pixel electrode 50 and the auxiliary electrode 61E is the same between nine unit pixel cells 14E illustrated in FIG. 19.

As illustrated, in this example, a space is provide between adjacent unit pixel cells 14E, and thereby the auxiliary electrode 61E is electrically separated from other auxiliary electrodes 61E in the pixel array. In such a configuration, it is possible to independently apply different sensitivity adjustment voltages to each of the auxiliary electrodes 61E in the pixel array. Independent application of different sensitivity adjustment voltages to each of the auxiliary electrodes 61E in the pixel array enables adjustment of sensitivity according to any pattern in the pixel array.

Figure 20:
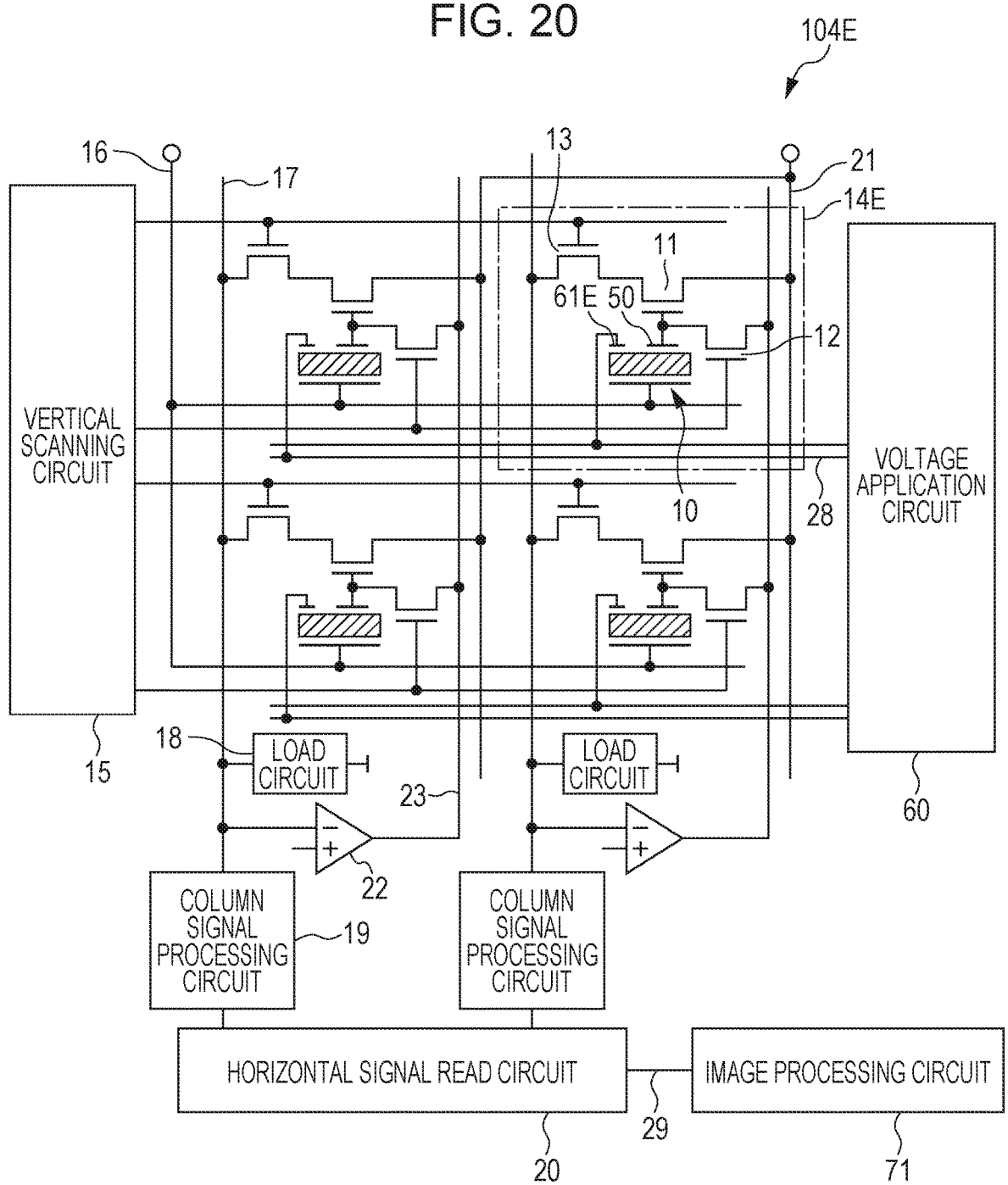
FIG. 20 is a schematic diagram illustrating an example of electrical connection between a voltage application circuit and a unit pixel cell including a pixel electrode and an auxiliary electrode.
Figure 21:
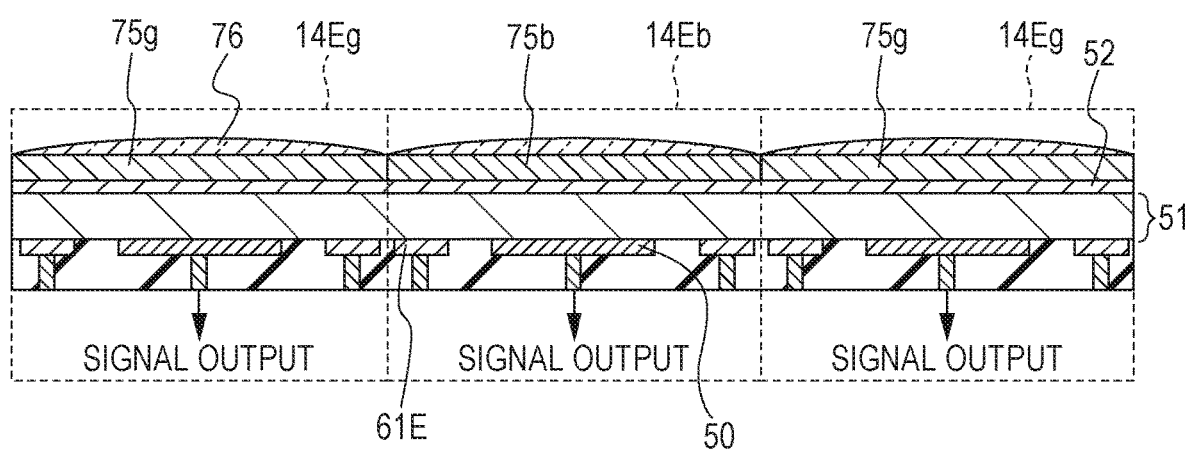
FIG. 21 is a schematic cross-sectional view illustrating an example of the unit pixel cell including the pixel electrode and the auxiliary electrode.

FIG. 20 illustrates an example of electrical connection between the unit pixel cell 14E including the pixel electrode 50 and the auxiliary electrode 61E, and the voltage application circuit 60. The imaging device 104E illustrated in FIG. 20 has sensitivity adjustment line 28 corresponding to each unit pixel cell 14E in each row of the pixel array. Specifically, the auxiliary electrode 61E of each unit pixel cell 14E and the voltage application circuit 60 are connected by different sensitivity adjustment lines 28. The connection between the auxiliary electrode 61E and the voltage application circuit 60 by different sensitivity adjustment lines 28 allows different sensitivity adjustment voltages to be applied independently to each auxiliary electrode 61E. It is to be noted that when a common sensitivity adjustment voltage is supplied to the unit pixel cells 14E belonging to the same row and different sensitivity adjustment voltages are respectively applied to the odd rows and the even rows of the pixel array, it is also possible to perform an operation similar to the operation described with reference to FIG. 18. FIG. 21 schematically illustrates an example of a cross-section of the unit pixel cell 14E.

FIG. 21 corresponds to the sectional view taken along line XXI-XXI illustrated in FIG. 19 and schematically illustrates 3 unit pixel cells arranged in a row direction.

In the configuration illustrated in FIG. 21, the unit pixel cell 14Eb illustrated in the center of FIG. 21 has a color filter 75b on the opposite side of the photoelectric conversion layer 51 with respect to the upper electrode 52. Here, the color filter 75b is a filter that allows blue light to pass through. As illustrated, unit pixel cells 14Eg are disposed on right side and left side of unit pixel cell 14Eb. Each of these two unit pixel cells 14Eg has a color filter 75g on the opposite side of the photoelectric conversion layer 51 with respect to the upper electrode 52. Here, the color filter 75g is a filter that allows green light to pass through. As illustrated, a micro lens 76 may be disposed on the color filter (here, the color filters 75b and 75g).

Each of the unit pixel cell 14Eb and the unit pixel cells 14Eg illustrated in FIG. 21 has the pixel electrode 50 and the auxiliary electrode 61E. Therefore, the voltage application circuit 60 (see FIG. 20) is capable of applying different sensitivity adjustment voltages to the auxiliary electrodes 61E of the unit pixel cells individually. Here, the voltage application circuit 60 supplies different sensitivity adjustment voltages to the auxiliary electrodes 61E of the unit pixel cells according to the color of light that passes through each color filter. For instance, the voltage application circuit 60 applies the first voltage as the sensitivity adjustment voltage to the auxiliary electrode 61E of B pixel that has the color filter 75b, and applies the second voltage different from the first voltage as the sensitivity adjustment voltage to the auxiliary electrode 61E of G pixel that has the color filter 75g. Also, the voltage application circuit 60 applies a third voltage to the auxiliary electrode 61E of R pixel having a color filter (not illustrated in FIG. 21) that allows red light to pass through, the third voltage being different from the first and second voltages.

In this manner, different sensitivity adjustment voltages are supplied to the auxiliary electrodes 61E of each unit pixel cell according to a color of light that passes through a color filter, for instance, thereby making it possible to set sensitivities for each color individually. That is, it is possible to adjust white balance of an image to be obtained by adjusting the sensitivity adjustment voltage.

What is to be noted is that the gain of each color in an image data obtained by image pickup is not adjusted but the sensitivity of each color at the time of image pickup is changed. When a conventional technique is used in which the gain of each color in an image data obtained by image pickup is adjusted, the levels of noise of each color are also amplified at different rates accompanied by the change in the gain. In contrast to this, according to the present embodiment, the sensitivity at the time of image pickup may be changed for each color arbitrarily, and thus it is possible to suppress change of color across the entire image, which is caused by amplification of the noise levels of each color at different rates. Therefore, according to the present embodiment, it is possible to achieve white balance more easily in response to a difference in environment (for instance, whether the morning or the evening) or a difference between light sources at the time of image pickup.

Fifth Embodiment

An imaging device according to the present embodiment will be described with reference to FIG. 22.

The imaging device of the present embodiment differs from the imaging device of the first embodiment in that a memory is further included. The configuration of components other than the memory may be the same as that of the first embodiment. The memory will be mainly described.

Figure 22:
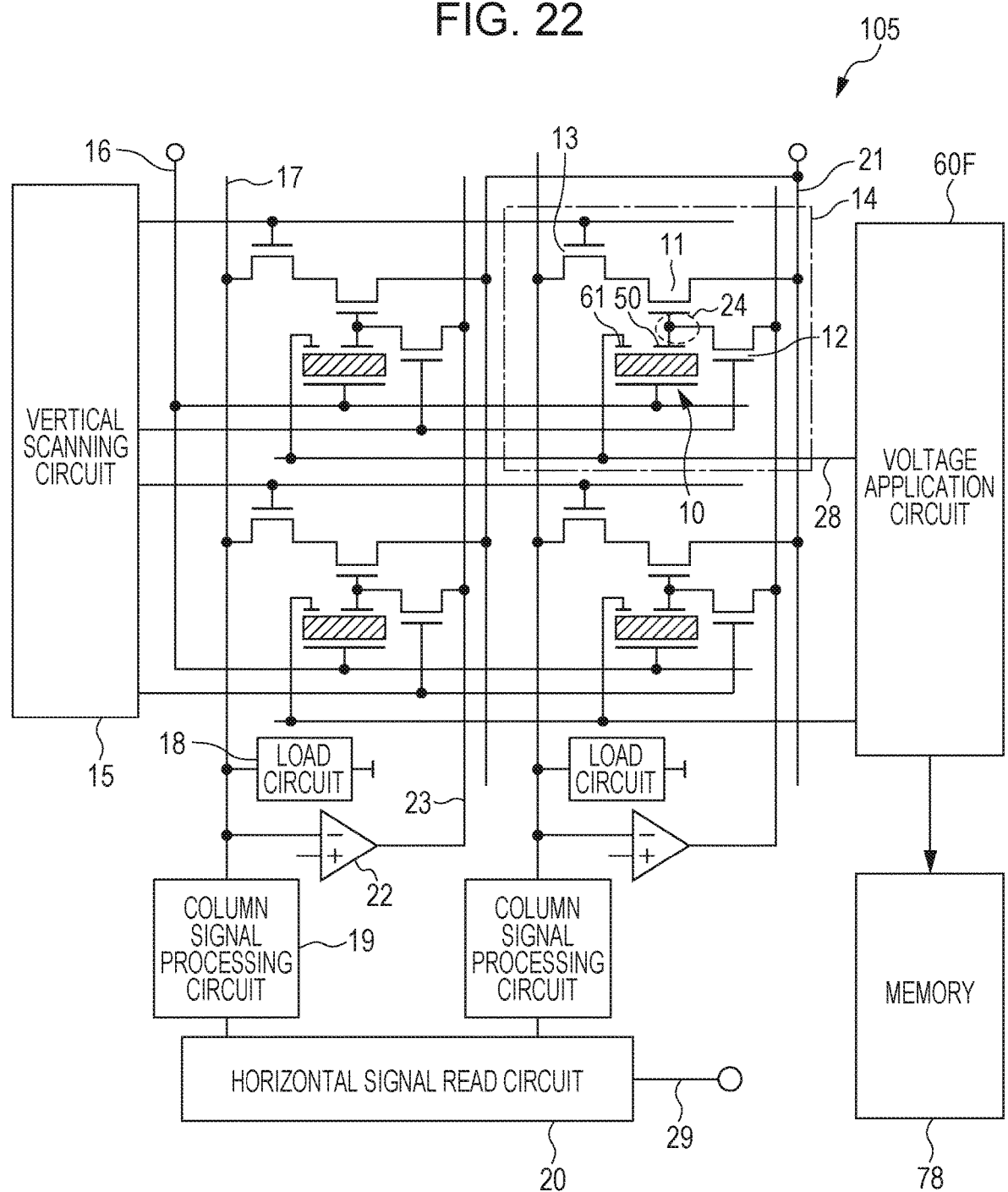
FIG. 22 is a schematic diagram illustrating an example of a circuit configuration of an imaging device according to a fifth embodiment.

FIG. 22 schematically illustrates an example of a circuit configuration of the imaging device according to the present embodiment. The imaging device 105 further includes a memory 78 in addition to the components of the imaging device 101 of the first embodiment.

The memory 78 receives information (typically, the value of the sensitivity adjustment voltage) on the sensitivity adjustment voltage applied to the auxiliary electrode 61, for instance from the voltage application circuit 60F at the time of image pickup and stores the information temporarily. The information on the sensitivity adjustment voltage used at the time of image pickup is associated with an obtained image signal, and is read along with an image signal or image data.

The value of the sensitivity adjustment voltage used at the time of image pickup is stored in the memory 78, and thus it is possible to provide the information regarding the scene at the time of image pickup later after the image pickup. In other words, the information on the sensitivity used for image pickup is available after the image pickup. For instance, based on the value of a sensitivity adjustment voltage associated with an image, it is possible to distinguish whether the image is picked up in a dark environment or picked up in a state where the sensitivity is decreased by controlling the sensitivity adjustment voltage.

The value of the sensitivity adjustment voltage may also be utilized in the above-described high dynamic range imaging. For instance, the image processing circuit 71 (see FIG. 17) may utilize information on the sensitivity adjustment voltages associated with images which are obtained with changed sensitivities, and may determine the order of the degree of sensitivity (may be referred to as the magnitude of exposure) at the time of pickup of those images. The image processing circuit 71 is capable of combining a plurality of images based on the order of the degree of the sensitivity at the time of image pickup.

It is to be noted that when image pickup is performed with different sensitivity adjustment voltages applied to the pixel array simultaneously, information regarding how large magnitude of the sensitivity adjustment voltage is applied to which unit pixel cell may be stored in the memory 78. The memory 78 may be disposed inwardly of the imaging device 105 or may be disposed outwardly of the imaging device 105. Alternatively, the memory 78 may be detachable from the main body of the imaging device 105. As the memory 78, a publicly known storage device such as a RAM, a hard disk may be used.

Sixth Embodiment

An imaging device according to the present embodiment will be described with reference to FIGS. 23, 24A and 24B.

Figure 23:
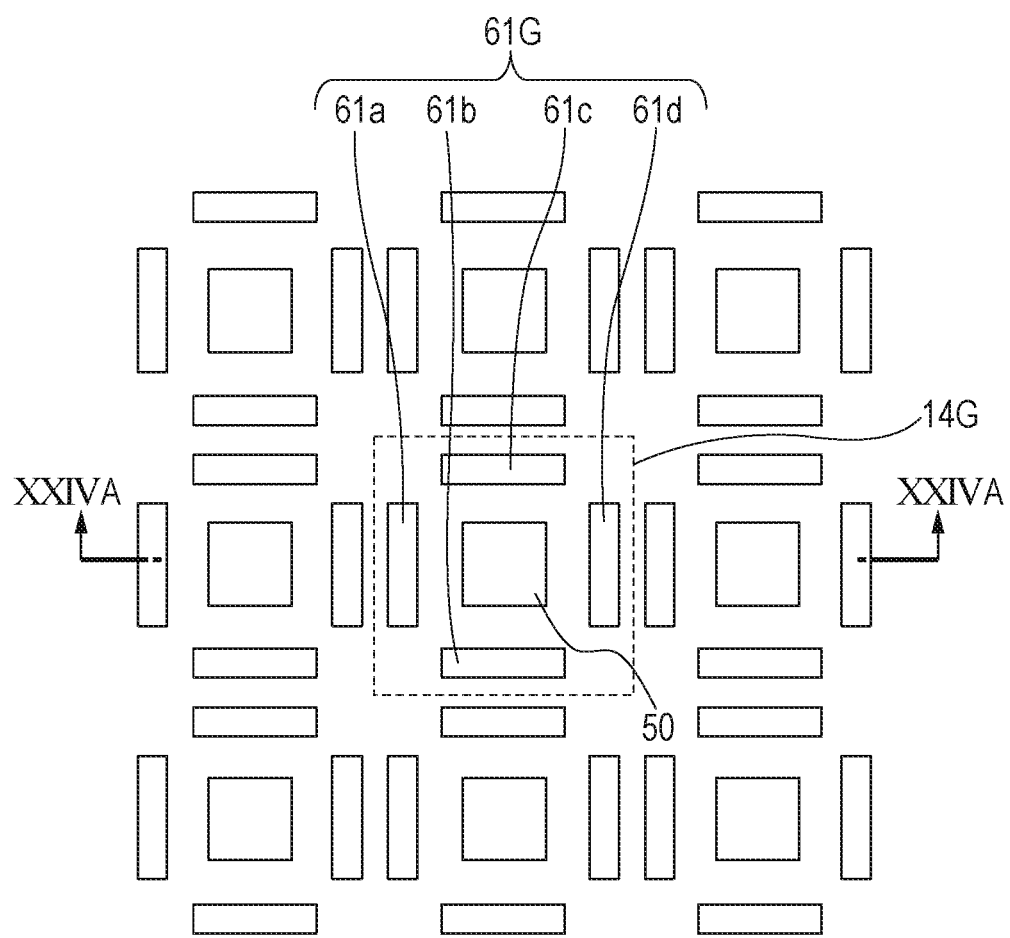
FIG. 23 is a plan view illustrating an example of disposition of pixel electrodes and auxiliary electrodes in an imaging device according to a sixth embodiment.

FIG. 23 illustrates an example of disposition of pixel electrodes and auxiliary electrodes in an imaging device according to a sixth embodiment. In the configuration illustrated in FIG. 23, each of the unit pixel cells 14G includes the pixel electrode 50 and an auxiliary electrode 61G disposed so as to surround the pixel electrode 50. As illustrated, the auxiliary electrode 61G includes sub auxiliary electrodes 61a to 61d that are spatially separated from one another. Here, the sub auxiliary electrodes 61a to 61d are disposed along each side of the rectangular pixel electrode.

Each of the sub auxiliary electrodes 61a to 61d is electrically connected to the voltage application circuit 60 (for instance, see FIG. 20), thereby being configured to receive application of mutually independent sensitivity adjustment voltages. That is, in this example, at the time of an operation of the imaging device, the potentials of the sub auxiliary electrodes 61a to 61d are independently controlled in each of the unit pixel cells 14G. As described in detail in the following, the sub auxiliary electrodes are disposed in each unit pixel cell, and the voltage in each of the sub auxiliary electrodes is controlled, thereby providing the unit pixel cell with a function of phase difference detection.

Figure 24A:
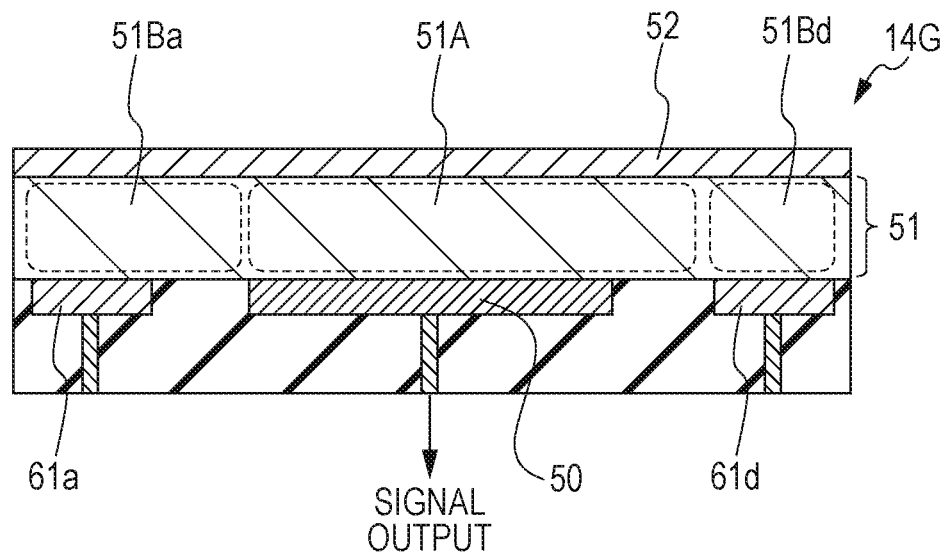
FIG. 24A is a schematic sectional view illustrating an example of a region for trapping charges which is formed in a photoelectric conversion layer of the unit pixel cell.

FIG. 24A illustrates an example of the region 51A that is formed in the photoelectric conversion layer 51 of the unit pixel cell 14G. As described above, the region 51A is a region where signal charges are trapped by the pixel electrode 50. FIG. 24A corresponds to the sectional view taken along line XXIVA-XXIVA illustrated in FIG. 23. For the sake of simplicity, FIG. 24A illustrates a schematic sectional view of the central one of nine unit pixel cells illustrated in FIG. 23.

FIG. 24A schematically illustrates the region 51A in a state where the first sensitivity adjustment voltage (for instance, −2 V) is applied to the sub auxiliary electrode 61a and the second sensitivity adjustment voltage (for instance, 5 V) is applied to the sub auxiliary electrode 61d. Here, it is assumed that a common voltage is applied to the sub auxiliary electrode 61b and the sub auxiliary electrode 61c.

In the state illustrated in FIG. 24A, the potential of the sub auxiliary electrode 61a is lower than the potential of the sub auxiliary electrode 61d, and the sub auxiliary electrode 61a traps more signal charges (here, holes) than the sub auxiliary electrode 61d. That is, as schematically illustrated in FIG. 24A, region 51Ba formed on the sub auxiliary electrode 61a is larger than region 51Bd formed on the sub auxiliary electrode 61d. Therefore, the region 51A at this point is in a shape that is displaced to the right side in FIG. 24A.

Figure 24B:
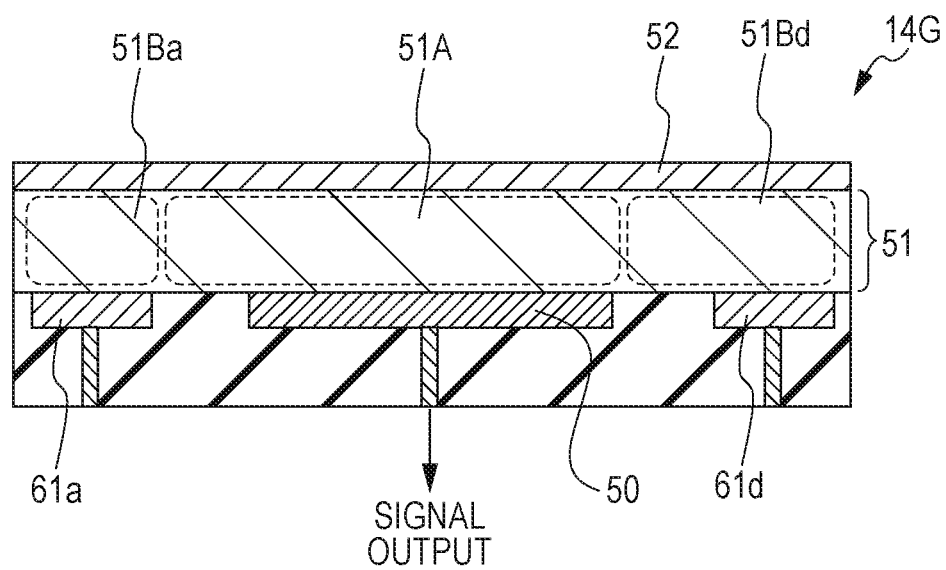
FIG. 24B is a schematic sectional view illustrating an example of the region for trapping charges in a state where a second sensitivity adjustment voltage is applied to a sub auxiliary electrode and a first sensitivity adjustment voltage is applied to another sub auxiliary electrode.

FIG. 24B schematically illustrates the region 51A in a state where the second sensitivity adjustment voltage is applied to the sub auxiliary electrode 61a and the first sensitivity adjustment voltage is applied to the sub auxiliary electrode 61d. In the state which illustrated in FIG. 24B, the region 51Bd formed on the sub auxiliary electrode 61d is larger than the region 51Ba formed on the sub auxiliary electrode 61a. Therefore, the region 51A at this point is in a shape that is displaced to the left side in FIG. 24B.

In this manner, the potentials of the sub auxiliary electrodes 61a and 61d are independently controlled, thereby making it possible to extend the region 51A toward the sub auxiliary electrode 61a or toward the sub auxiliary electrode 61d in the photoelectric conversion layer 51. Similarly, the potentials of the sub auxiliary electrodes 61b and 61c are adjusted with a common potential applied to the sub auxiliary electrodes 61a and 61d, thereby making it possible to extend the region 51A upward or downward in FIG. 23. Also, for instance, when the first sensitivity adjustment voltage is applied to the sub auxiliary electrodes 61a and 61b and the second sensitivity adjustment voltage is applied to the sub auxiliary electrodes 61c and 61d, it is possible to extend the region 51A to the upper right direction in FIG. 23. In this manner, the potentials of the sub auxiliary electrodes 61a to 61d are independently controlled, thereby making it possible to extend the region 51A to any direction in the photoelectric conversion layer 51.

For instance, when the region 51A in a pixel in the pixel array is extended to the right side as illustrated in FIG. 24A, and the region 51A in the adjacent pixel to the left side of the pixel is extended to the left side as illustrated in FIG. 24B, the set of those pixels may be utilized as pixels for phase difference auto focus (AF). Needless to say, when a common sensitivity adjustment voltage is applied to the four sub auxiliary electrodes 61a to 61d, the unit pixel cell 14G is capable of functioning similarly to the other embodiments described above.

As is apparent from FIG. 24A and FIG. 24B, the device structures of the unit pixel cell for image pickup and the unit pixel cell for phase difference AF are common in the present embodiment. Therefore, the phase difference AF is achieved without disposing a pixel for phase difference AF separately in the pixel array or disposing a sensor for phase difference AF separately in the imaging device. According to the present embodiment, control of the sensitivity adjustment voltage applied to the sub auxiliary electrodes enables any unit pixel cell in the pixel array to function as a pixel for phase difference AF, and thus more flexible application is possible.

It is to be noted that the number, shape, and disposition of the sub auxiliary electrodes in the unit pixel cell are not limited to the example illustrated in FIG. 23, and may be set in any manner. In the present embodiment, it may be stated that the "unit pixel cell" is a minimum unit that constitutes a repeated structure of a photosensitive region and includes at least one pixel electrode.

Seventh Embodiment

An image acquisition device according to the present embodiment will be described with reference to FIGS. 25A to 30.

The image acquisition device according to the present embodiment detects light beam that passes through an object. The object is disposed close to a photoelectric converter of the imaging device. The image acquisition device provides different directions of irradiation of light beam that passes through an object, thereby allowing the same pixel to detect light beams that pass through different portions of the object. Obtained image signals are synthesized and thus an image with a high resolution is obtained.

Figure 25A:
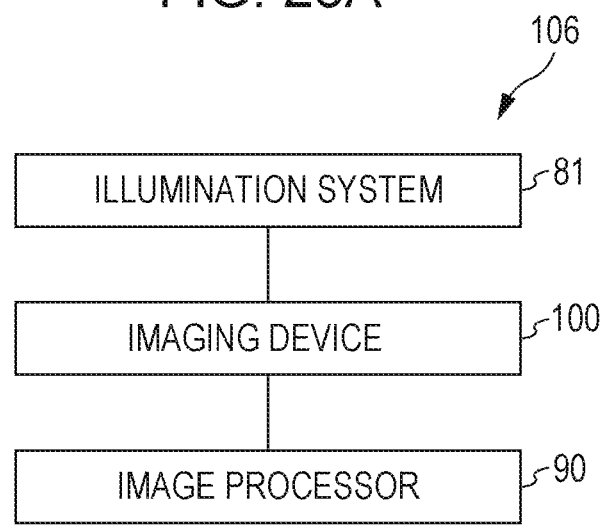
FIG. 25A is a block diagram illustrating an example of a configuration of an image acquisition device according to a seventh embodiment.

FIG. 25A schematically illustrates the configuration of an image acquisition device according to a seventh embodiment of the present disclosure. An image acquisition device 106 illustrated in FIG. 25A has an illumination system 81, an imaging device 100, and an image processor 90.

Figure 25B:
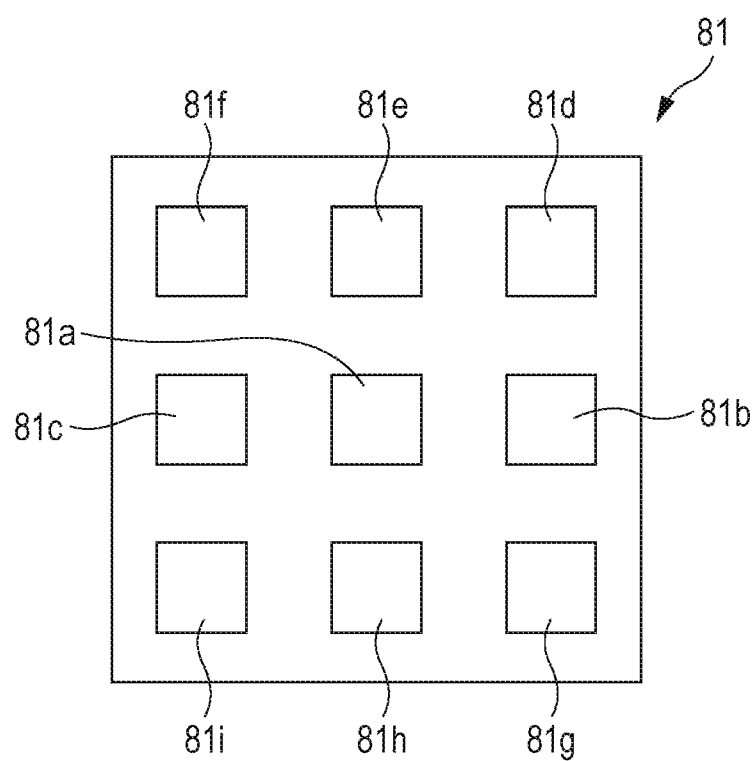
FIG. 25B is a schematic diagram illustrating an example of a configuration of an illumination system in the image acquisition device according to the seventh embodiment.

The imaging device in any one of the first to sixth embodiments may be used as the imaging device 100. In the present embodiment, the imaging device 101 of the first embodiment is used, for instance. FIG. 25B schematically illustrates an example of a configuration of the illumination system 81. The illumination system 81 includes light sources 81a to 81i that are arranged two-dimensionally, for instance.

Figure 26A:
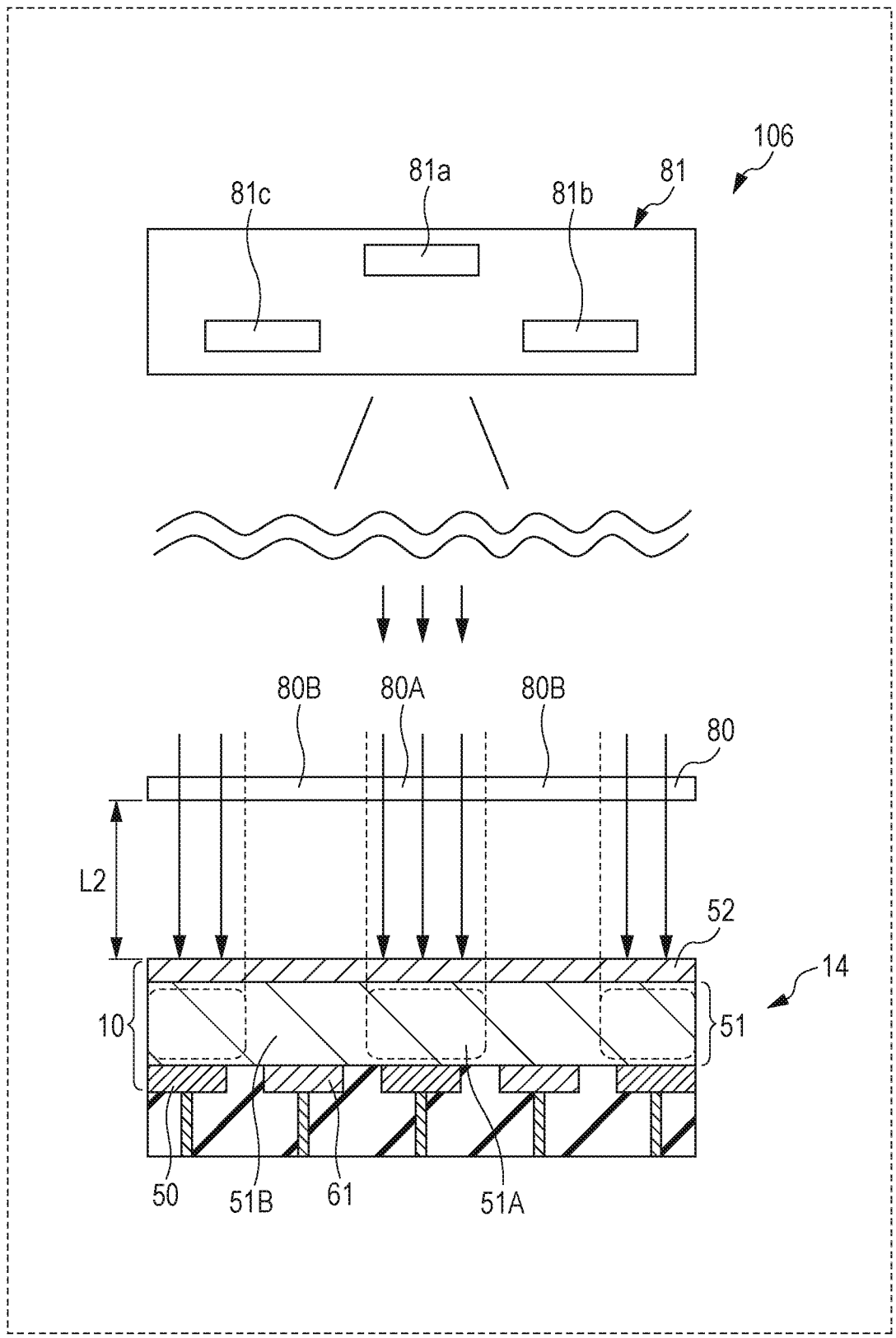
FIG. 26A is an illustration for explaining an exemplary step for obtaining an image by the image acquisition device when a sensitivity adjustment voltage is applied to the auxiliary electrode.

FIG. 26A schematically illustrates the configuration of the illumination system 81 and the vicinity of the photoelectric converter 10 of the imaging device 101. As illustrated in FIG. 26A, an object 80 is disposed away from the upper electrode 52 of the photoelectric converter 10 by distance L2, for instance. The distance L2 is typically 1 mm or less and, for instance, approximately 0.1 μm or more and approximately 10 μm or less. The object 80 is disposed in parallel to the photoelectric converter 10. The imaging device 101 may include an arrangement surface for holding the object 80. Here, a light condensing optical element such as a micro lens is not disposed on the upper electrode 52 of the photoelectric converter 10. The object 80 is, for instance, an optically transparent sample (such as a cell, a sliced tissue) held on a prepared slide.

Figure 26B:
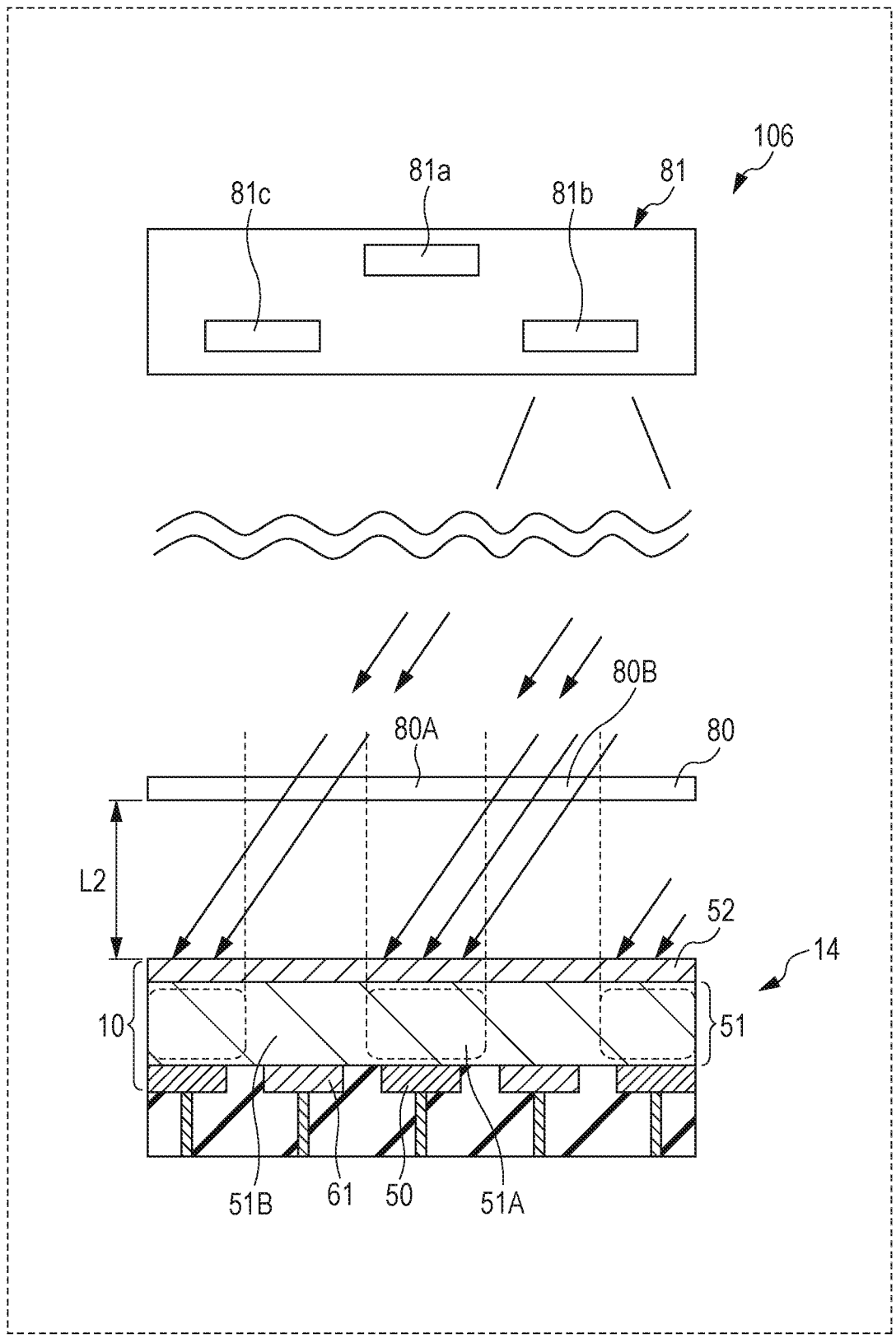
FIG. 26B is an illustration for explaining an exemplary step for obtaining an image by the image acquisition device when the sensitivity adjustment voltage is applied to the auxiliary electrode.

The illumination system 81 is disposed at a position sufficiently distant from the photoelectric converter 10. In FIG. 26A, three light sources 81a to 81c out of the light sources 81a to 81i are illustrated. The light source 81a out of the light sources 81a, 81b, 81c is disposed in the central vicinity of the two-dimensionally disposed unit pixel cells 14 of the imaging device 101. On the other hand, the light sources 81b, 81c are disposed away from the central vicinity. Although the light sources 81a, 81b, 81c are each typically a point light source, the light sources 81a, 81b, 81c are sufficiently away from the photoelectric converter 10. Thus the light sources 81a, 81b, 81c irradiate the object 80 with illumination light which is parallel light. As illustrated in FIG. 26A, the light source 81a irradiates the object 80 over the photoelectric converter 10 with illumination light in a vertical direction. On the other hand, as illustrated in FIG. 26B, the light source 81b irradiates the object 80 with illumination light in a direction inclined to the normal direction to the object 80. The same goes for the light source 81c. In this manner, the illumination system 81 successively emits illumination light in different directions of irradiation with respect to the object 80 as a reference, and irradiates the object 80 with illumination light.

Next, the step for the image acquisition device 106 to obtain the image of the object 80 will be described.

First, a predetermined sensitivity adjustment voltage Vk is applied to the auxiliary electrode 61. As described in the first embodiment, by applying the sensitivity adjustment voltage to the auxiliary electrode 61, the signal charges generated in region 51B including the overlapping portion with the auxiliary electrode 61 in a plan view within the photoelectric conversion layer 51 move to the auxiliary electrode 61. Also, the signal charges generated in region 51A including the overlapping portion with the pixel electrode 50 in a plan view within the photoelectric conversion layer 51 are detected by the pixel electrode 50. That is, the size of the region 51A specifies a pixel size.

Next, the light source 81a is turned on to irradiate the object 80 with illumination light. The illumination light, which passes through the object 80, enters the photoelectric converter 10. As described above, out of the incident light to the photoelectric converter 10, the incident light to the region 51A where signal charges are trapped by the pixel electrode 50 is essentially detected. That is, region 80A of the object 80 is selectively picked up, the region 80A being located immediately above the region 51A which is formed in the photoelectric conversion layer 51.

Next, as illustrated in FIG. 26B, the light source 81b is turned on to irradiate the object 80 with illumination light. The illumination light from the light source 81b is diagonally incident to the object 80 with respect to the normal line to the object 80. Therefore, the light, which passes through region 80B of the object 80 rather than the region 80A of the object 80, is incident to the region 51A, the region 80B being located diagonally above the region 51A, the region 80A being located immediately above the region 51A. As seen from FIG. 26B, illumination light, which passes through the region 80A of the object 80, is incident to the region 51B of the photoelectric conversion layer 51. Therefore, when the light source 81b is turned on, the region 80B of the object is selectively picked up.

Figure 27:
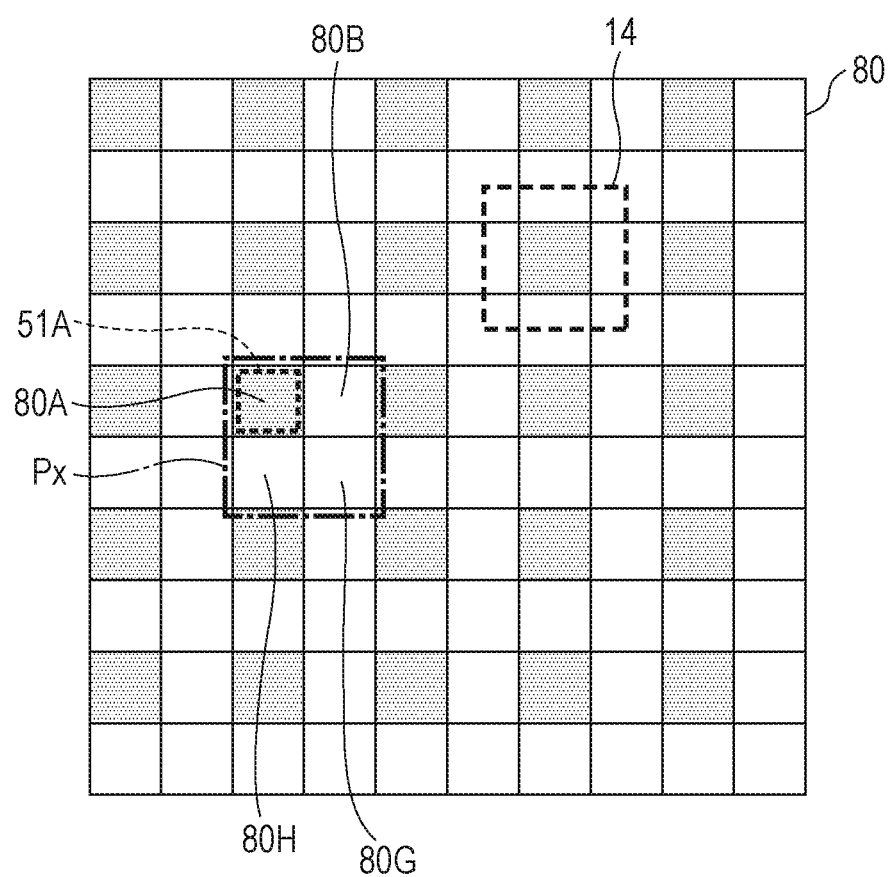
FIG. 27 is a schematic diagram illustrating an example of pixel arrangement of a plurality of picked up images when the sensitivity adjustment voltage is applied to the auxiliary electrode.

Subsequently, image pickup is performed similarly using light source 81g and light source 81h of the illumination system 81 illustrated in FIG. 25B. FIG. 27 is a schematic plan view of the object 80 and illustrates the regions 80A, 80B, 80G, 80H that are picked up using the light sources 81a, 81b, 81g, 81h. As illustrated in FIG. 26B, the region 51A of the photoelectric conversion layer 51 is located below the region 80A. As schematically illustrated by arrows in FIG. 26B, by using the light sources 81b, 81g, 81h, the light, which passes through the regions 80B, 80G, and 80H of the object 80, is detectable in the region 51A of the photoelectric conversion layer 51. Therefore, all the regions of the object 80 may be picked up by performing image pickup four times using the light sources 81a, 81b, 81g, and 81h. That is, by performing image pickup four times while changing an illumination direction, the light, which passes through the regions 80A, 80B, 80G, and 80H (see FIG. 27), is successively detectable in the region 51A, the regions 80A, 80B, 80G, and 80H (see FIG. 27) being mutually different and included in region Px corresponding to one unit pixel cell 14 of the object 80.

The image processor 90 includes, for instance, one or more processors, and synthesizes image signals obtained by image pickup using the light sources 81a, 81b, 81g, and 81h. In this process, the image signals are rearranged to conform to the arrangement illustrated in FIG. 27. That is, the image processor 90 synthesizes image signals so that the image signals compensate one another, and generates a synthetic image, thereby forming a high resolution image of the object, which is higher in resolution than an image obtained by performing image pickup one time using any one of the light sources 81a, 81b, 81g, and 81h.

In the image acquisition device 106, the size of the region 51A of the photoelectric conversion layer 51 determines the resolution of a picked up image of the object. The smaller the region 51A is, the higher the resolution of a picked up image is. Hereinafter, the step to obtain an image of the object 80 with reduced region 51A will be described with reference to FIGS. 28A to 28C and 29.

Figure 28A:
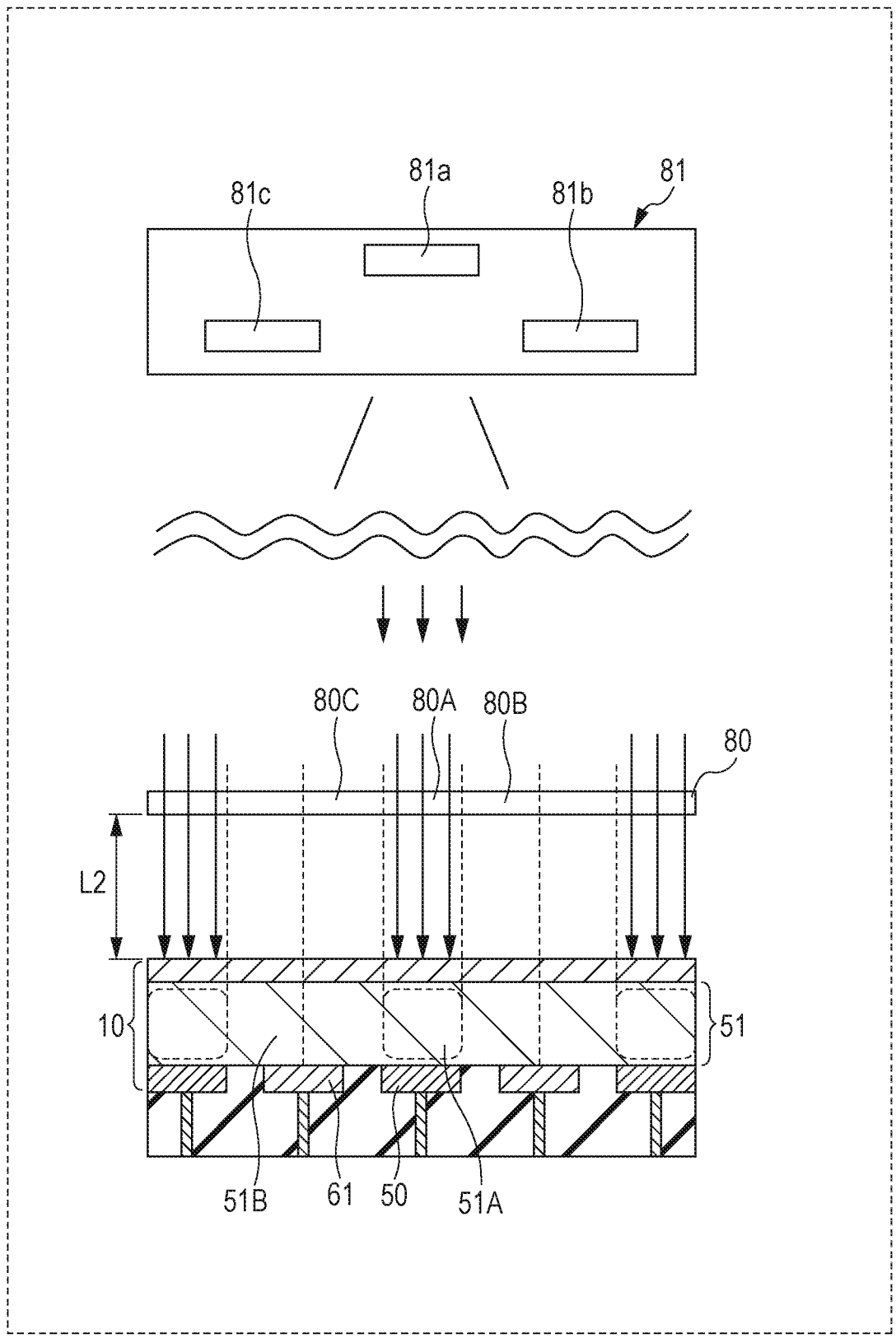
FIG. 28A is a schematic diagram illustrating an example of relationship between an incident light through an object to the region for trapping charges and a direction of illumination when a sensitivity adjustment voltage is applied to the auxiliary electrode.

First, a predetermined sensitivity adjustment voltage Vh is applied to the auxiliary electrode 61. When an electron hole serves as a signal charge, the sensitivity adjustment voltage Vh is set lower than the aforementioned Vk so that the region 51A of the photoelectric conversion layer 51 becomes small. Consequently, as illustrated in FIG. 28A, the region 51A of the photoelectric conversion layer 51 becomes smaller than the region 51A as illustrated in FIG. 26A and FIG. 26B.

Next, the light source 81a is turned on to irradiate the object 80 with illumination light. Accordingly, the region 80A of the object 80 is picked up.

Figure 28B:
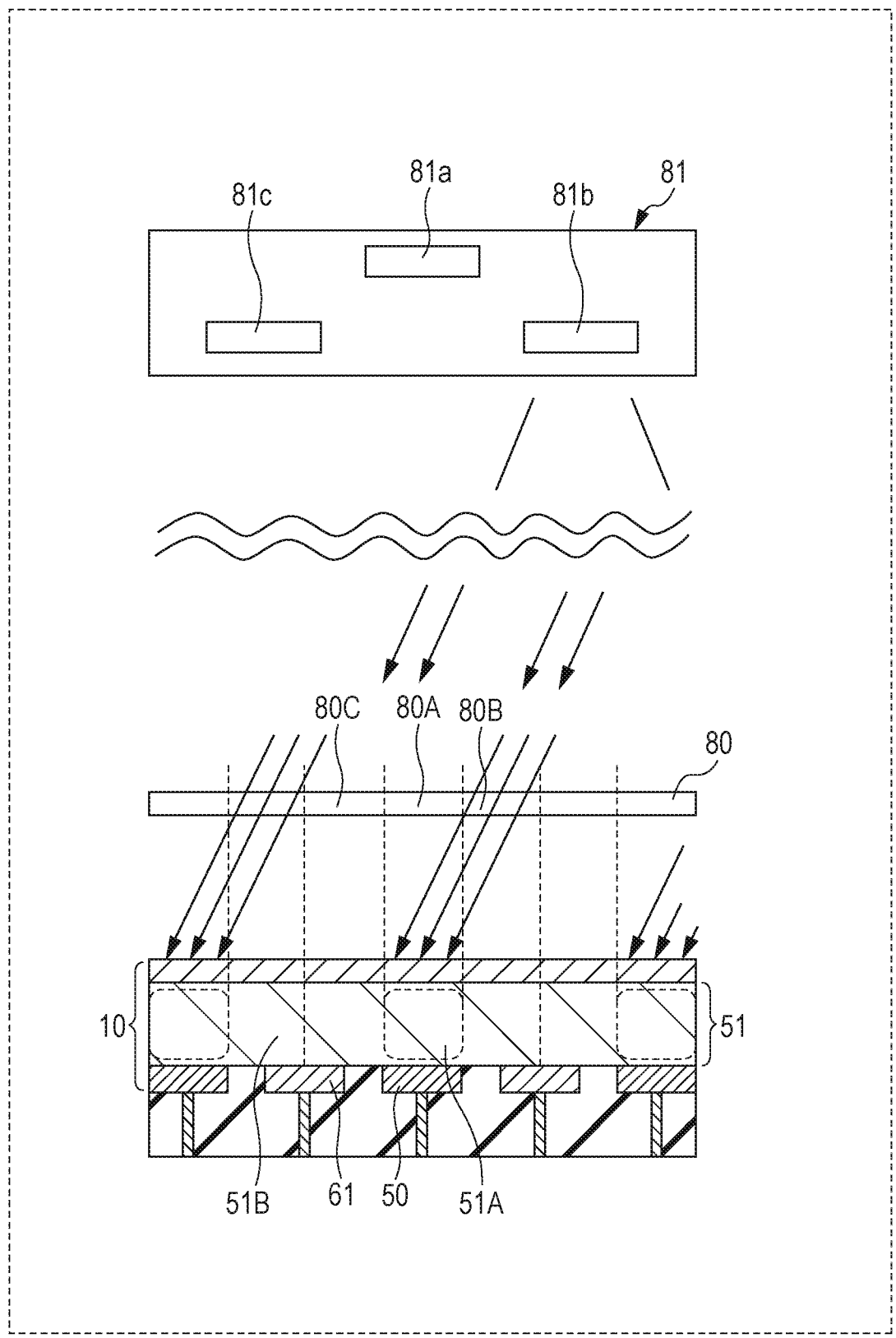
FIG. 28B is a schematic diagram illustrating another example of relationship between an incident light through an object to the region for trapping charges and a direction of illumination when a sensitivity adjustment voltage is applied to the auxiliary electrode.

Next, as illustrated in FIG. 28B, the light source 81b is turned on to irradiate the object 80 with illumination light. The illumination light from the light source 81b is diagonally incident to the object 80 with respect to the normal line to the object 80. When the light source 81b is turned on, the region 80B of the object is picked up.

Figure 28C:
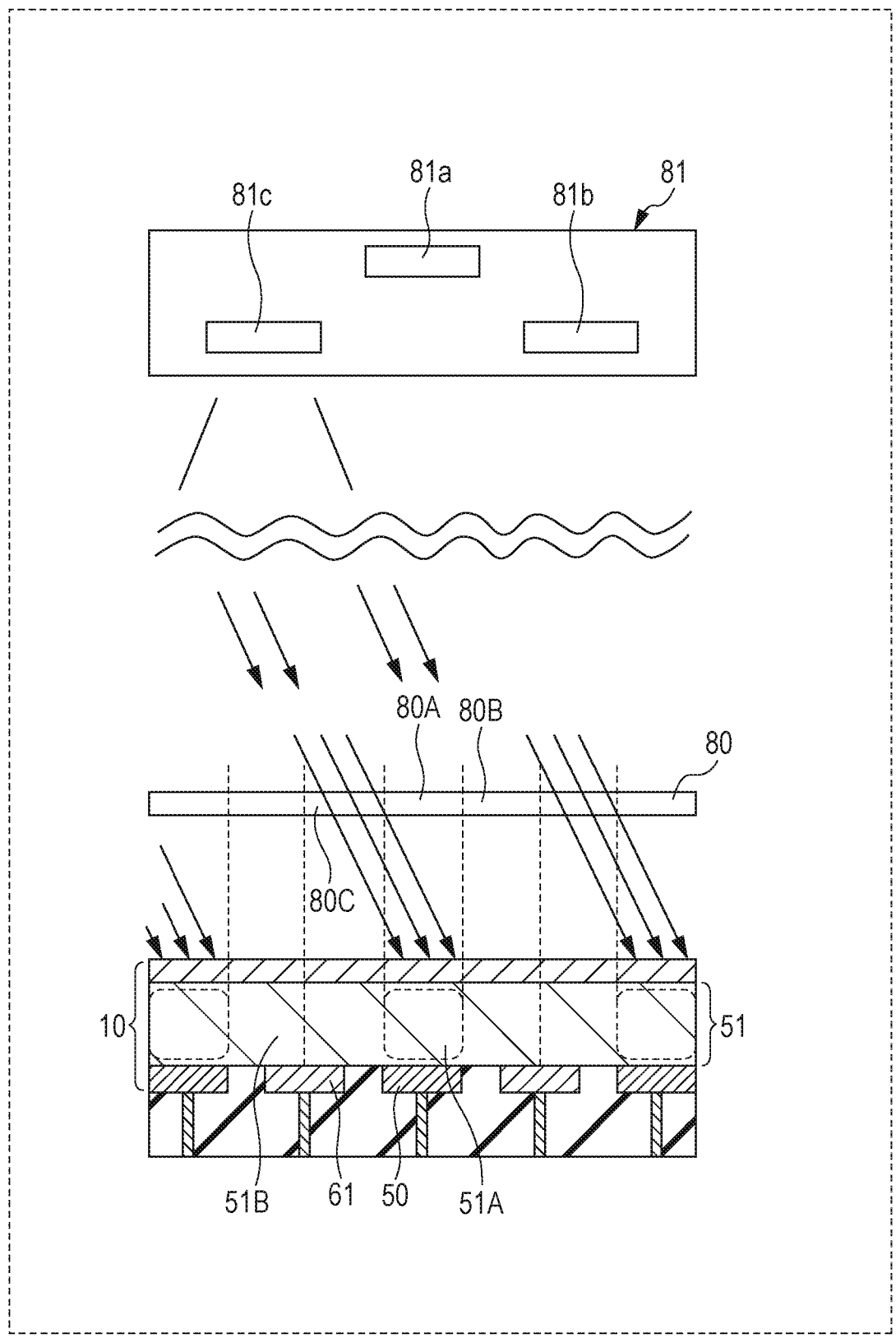
FIG. 28C is a schematic diagram illustrating still another example of relationship between an incident light through an object to the region for trapping charges and a direction of illumination when a sensitivity adjustment voltage is applied to the auxiliary electrode.

Next, as illustrated in FIG. 28C, light source 81c is turned on to irradiate the object 80 with illumination light. Similarly, the illumination light from the light source 81c is diagonally incident to the object 80 with respect to the normal line to the object 80. When the light source 81c is turned on, the region 80C of the object is picked up.

Figure 29:
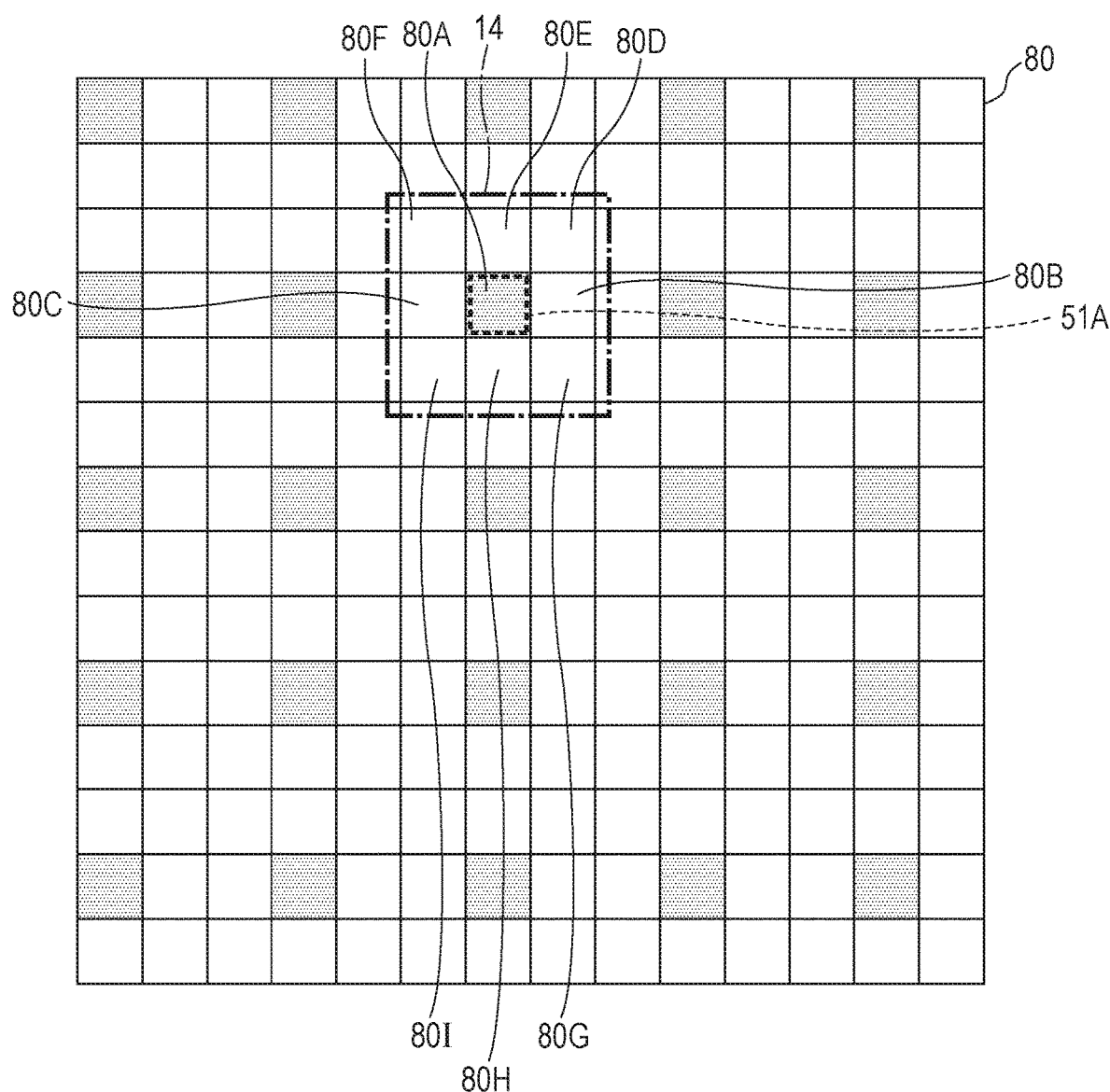
FIG. 29 is a schematic diagram illustrating an example of pixel arrangement of a plurality of picked up images when the sensitivity adjustment voltage is applied to the auxiliary electrode.

Subsequently, image pickup is performed similarly using the light sources 81d to 81i of the illumination system 81 illustrated in FIG. 25B. FIG. 29 is a schematic plan view of the object 80 and illustrates the regions 80A to 80I of the object that are picked up using the light sources 81a to 81i. As schematically illustrated by arrows in FIGS. 28B and 28C, by using the light sources 81b to 81i, the light, which passes through the regions 80B to 80I of the object 80, is detectable in the region 51A of the photoelectric conversion layer 51. Therefore, all the regions of the object 80 may be picked up by performing image pickup nine times using the light sources 81a to 81i. That is, the light, which passes through different regions, is successively detectable in the region 51A.

The image processor 90 rearranges and synthesizes image signals to conform to the arrangement illustrated in FIG. 29, the image signals being obtained by image pickup using the light sources 81a to 81i, respectively. Consequently, a high resolution image of the object is formed, which is higher in resolution than an image obtained by performing image pickup one time using any one of the light sources 81a to 81i.

It is to be noted that even when the sensitivity adjustment voltage is changed, the size of the unit pixel cell 14 does not change, and a pixel pitch does not change, either. However, the size of the region 51A corresponding to the size of effective pixel is changeable. In the image acquisition device 106, the size of the region 51A determines a resolution. The value of the sensitivity adjustment voltage is determined so that the size of the region 51A becomes small, and application of the sensitivity adjustment voltage enables a high resolution image to be obtained. For instance, in the example illustrated in FIG. 27, adjustment of the size of the region 51A to ¼ the size of the unit pixel cell 14 provides an image with a resolution 4 times higher than the resolution as in the case where the size of the region 51A is set to be equivalent to the size of the unit pixel cell 14. In the example illustrated in FIG. 29, adjustment of the size of the region 51A to ⅑ the size of the unit pixel cell 14 provides an image with a resolution 9 times higher than the resolution as in the case where the size of the region 51A is set to be equivalent to the size of the unit pixel cell 14.

In this manner, in the image acquisition device of the present embodiment, the size of the region 51A where signal charges are trapped by the pixel electrode 50 in the photoelectric conversion layer 51 is changeable by changing the sensitivity adjustment voltage applied to the auxiliary electrode 61. Therefore, it is possible to change the resolution. It is possible to obtain a high resolution image by reducing the size of the region 51A.

Figure 30:
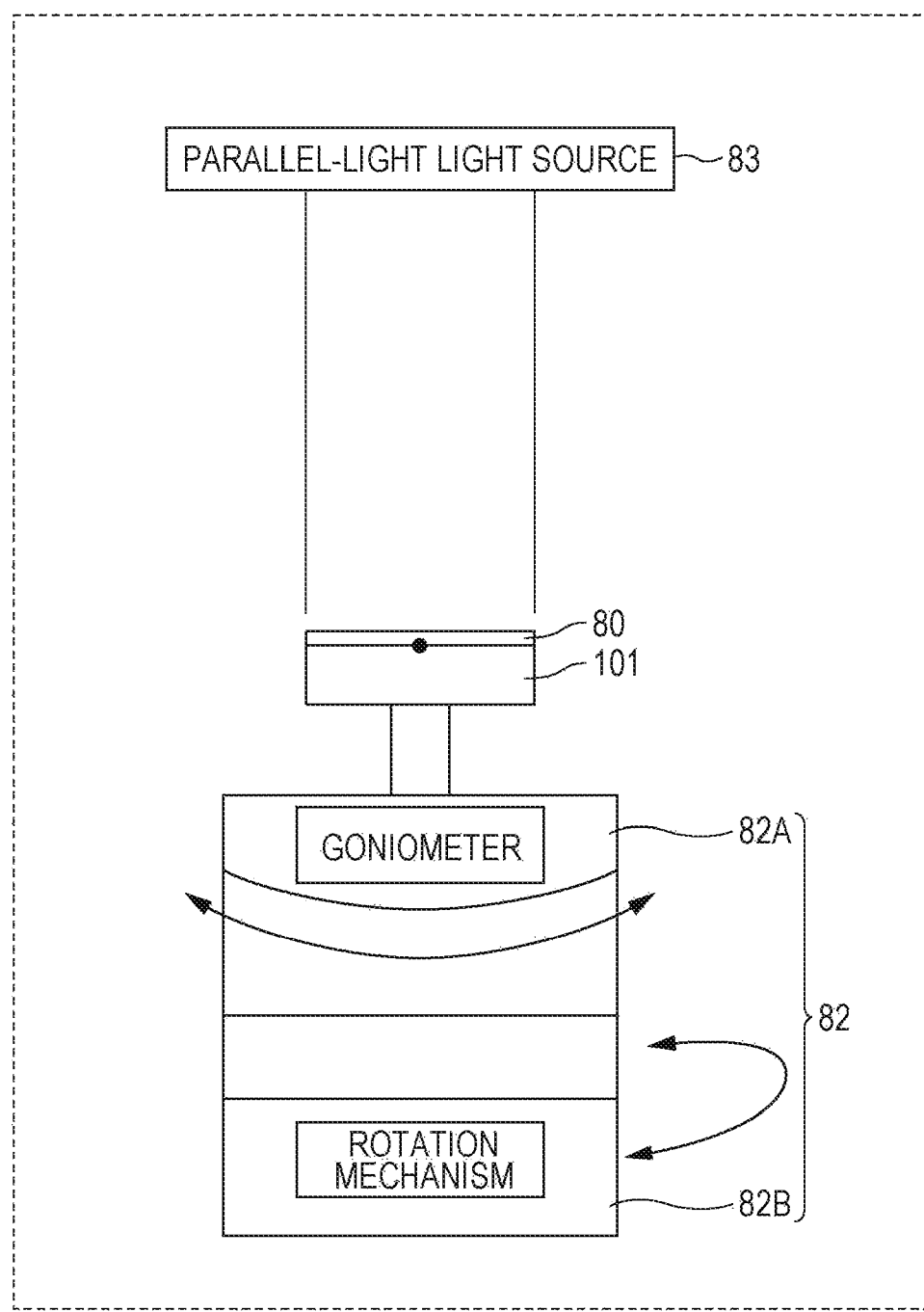
FIG. 30 is a schematic diagram illustrating another example of a configuration of an illumination system in the image acquisition device according to the seventh embodiment.

It is to be noted that in the present embodiment, the illumination system 81 includes a plurality of light sources, and irradiates an object with illumination light in different directions of irradiation based on the positions of light sources. However, the illumination system may include one light source, and the orientation of an imaging device on which an object is supported may be varied. For instance as illustrated in FIG. 30, the illumination system may include a parallel-light light source 83 and a mechanism 82 that changes the posture of an object. The mechanism 82 may include a goniometer 82A and a rotation mechanism 82B. The goniometer 82A supports the imaging device 101 and the object 80. This illumination system allows the posture of the object 80 with respect to the parallel-light light source 83 to be varied. Therefore, the object 80 is able to receive illumination light from the parallel-light light source 83 in different directions with respect to the object 80 as a reference.

For an imaging device, it is useful to change the size of the region 51A where signal charges are trapped by the pixel electrode 50 in the photoelectric conversion layer 51 by changing the sensitivity adjustment voltage applied to the auxiliary electrode 61. That is, since the distance between the regions 51A of adjacent pixels is increased by reducing the size of the regions 51A, it is possible to suppress color mixing.

The imaging device and the image acquisition device according to the present disclosure is useful for an imaging device such as a digital camera and an image sensor.

The present disclosure also includes the following aspects.

[Item 1]

The imaging device of the above-described embodiment may further include a memory that stores a value of a voltage applied to the auxiliary electrode at the time of image pickup.

With this configuration, the value of a sensitivity adjustment voltage used in the image pickup may be saved as information related to image data.

[Item 2]

In the imaging device of the above-described embodiment, the auxiliary electrodes may be separated for each unit pixel cell.

With this configuration, adjustment of sensitivity according to any pattern in the pixel array is possible.

[Item 3]

In the imaging device according to Item 2, the unit pixel cells each include a first unit pixel cell having a color filter of a first color, and a second unit pixel cell having a color filter of a second color, and the voltage application circuit may apply different voltages to the auxiliary electrode of the first unit pixel cell and the auxiliary electrode of the second unit pixel cell.

With this configuration, it is possible to make white balance adjustment according to a scene.

[Item 4]

In the imaging device of the above-described embodiment, the voltage application circuit may switch between voltages to be applied to the auxiliary electrode in one frame.

With this configuration, it is possible to synchronize the exposure periods in all the unit pixel cells included in the pixel array.

[Item 5]

In the imaging device according to Item 4, the voltage application circuit may periodically change the voltage to be applied to the auxiliary electrode in one frame.

With this configuration, it is possible to remove the effect of a periodic flickering of the light that is incident on the imaging device.

[Item 6]

The imaging device of the above-described embodiment may further include an illumination device and the voltage application circuit may switch between voltages to be applied to the auxiliary electrode according to an operation of the illumination device.

With this configuration, it is possible to remove the effect of locus of illumination light.

[Item 7]

The imaging device according to any one of Items 4 to 6 may further include a control line that supplies a voltage to the upper electrode, the voltage changings according to switching of the voltage to be applied to the auxiliary electrode.

With this configuration, by changing the voltage to be applied to the upper electrode according to switching of the voltage to be applied to the auxiliary electrode, it is possible to set the sensitivity used in the imaging device to nearly 0. Therefore, the change in the voltage to be applied to the auxiliary electrode and in the voltage to be applied to the upper electrode may be utilized as a shutter.

[Item 8]

In the imaging device of the above-described embodiment, the voltage application circuit may apply a different voltage to the auxiliary electrode according to a specified F value.

With this configuration, it is possible to control the F value without using a diaphragm mechanism.

[Item 9]

In the imaging device of the above-described embodiment, each of pixel electrodes is surrounded by the auxiliary electrode and may also include sub-pixel electrodes that are spatially separated.

With this configuration, it is possible to set the sensitivity used in the imaging device to nearly 0 while maintaining wide incident angle characteristics.

[Item 10]

In the imaging device of the above-described embodiment, the unit pixel cells may also include a first unit pixel cell in which a first gap is formed between the pixel electrode and the auxiliary electrode, and a second unit pixel cell in which a second gap larger than the first gap is formed between the pixel electrode and the auxiliary electrode.

With this configuration, it is possible to dispose pixels having different functions in the pixel array.

[Item 11]

In the imaging device of the above-described embodiment, each auxiliary electrode may include sub auxiliary electrodes and each of the sub auxiliary electrodes may have an electrical connection to the voltage application circuit.

With this configuration, it is possible to deform a region, in which holes movable to the pixel electrode are distributed, into a shape that is displaced from the center. Therefore, it is possible to utilize each unit pixel cell for phase difference detection and it is possible to flexibly change the shape of the region in which holes movable to the pixel electrode are distributed, using sensitivity adjustment voltage.

[Item 12]

The imaging device of the above-described embodiment may further include an image processing circuit, the voltage application circuit may apply different voltages in at least two frames, the image processing circuit may synthesize the image signals in the at least two frames and may output a synthetic image signal.

With this configuration, it is possible to obtain an image having a high contrast ratio.

What is claimed is:

1. An imaging device, comprising:
    a photoelectric conversion layer having a first surface and a second surface opposite to the first surface;
    a counter electrode on the first surface;
    a first electrode on the second surface;
    a second electrode on the second surface, the second electrode being spaced from the first electrode; and
    an auxiliary electrode on the second surface between the first electrode and the second electrode, the auxiliary electrode being spaced from the first electrode and the second electrode, wherein
    a shortest distance between the first electrode and the auxiliary electrode is different from a shortest distance between the second electrode and the auxiliary electrode.

2. The imaging device according to claim 1, wherein an area of the first electrode is larger than an area of the second electrode.

3. The imaging device according to claim 2, wherein the shortest distance between the first electrode and the auxiliary electrode is smaller than the shortest distance between the second electrode and the auxiliary electrode.

4. The imaging device according to claim 1, wherein the auxiliary electrode surrounds the first electrode and the second electrode.

5. The imaging device according to claim 1, wherein
    the first electrode is one of first electrodes arranged one-dimensionally or two-dimensionally in a plan view, and
    the second electrode is one of second electrodes arranged one-dimensionally or two-dimensionally in the plan view.

6. The imaging device according to claim 5, wherein the first electrodes and the second electrodes face the counter electrode.

7. The imaging device according to claim 1, further comprising
    a first amplification transistor having a gate coupled to the first electrode, and
    a second amplification transistor having a gate coupled to the second electrode.

8. The imaging device according to claim 1, wherein a size of a region in the photoelectric conversion layer where signal charges are trapped by the first electrode is larger than a size of a region in the photoelectric conversion layer where signal charges are trapped by the second electrode.

9. The imaging device according to claim 8, wherein the shortest distance between the first electrode and the auxiliary electrode is smaller than the shortest distance between the second electrode and the auxiliary electrode.

10. The imaging device according to claim 1, wherein
the first electrode is a pixel electrode of a first pixel cell, and
the second electrode is a pixel electrode of a second pixel cell, a sensitivity of the first pixel cell being higher than a sensitivity of the second pixel cell.

11. The imaging device according to claim 10, wherein the shortest distance between the first electrode and the auxiliary electrode is smaller than the shortest distance between the second electrode and the auxiliary electrode.

12. An imaging device, comprising:
a photoelectric conversion layer having a first surface and a second surface opposite to the first surface;
a counter electrode on the first surface;
a first electrode on the second surface;
a second electrode on the second surface, the second electrode being spaced from the first electrode; and
an auxiliary electrode on the second surface between the first electrode and the second electrode, the auxiliary electrode being spaced from the first electrode and the second electrode, wherein
a size of a gap between the first electrode and the auxiliary electrode is different from a size of a gap between the second electrode and the auxiliary electrode.

13. The imaging device according to claim 12, wherein an area of the first electrode is larger than an area of the second electrode.

14. The imaging device according to claim 13, wherein the size of the gap between the first electrode and the auxiliary electrode is smaller than the size of the gap between the second electrode and the auxiliary electrode.

15. The imaging device according to claim 12, wherein the auxiliary electrode surrounds the first electrode and the second electrode.

16. The imaging device according to claim 12, wherein
the first electrode is one of first electrodes arranged one-dimensionally or two-dimensionally in a plan view, and
the second electrode is one of second electrodes arranged one-dimensionally or two-dimensionally in the plan view.

17. The imaging device according to claim 16, wherein the first electrodes and the second electrodes face the counter electrode.

18. The imaging device according to claim 12, further comprising
a first amplification transistor having a gate coupled to the first electrode, and
a second amplification transistor having a gate coupled to the second electrode.

19. The imaging device according to claim 12, wherein a size of a region in the photoelectric conversion layer where signal charges are trapped by the first electrode is larger than a size of a region in the photoelectric conversion layer where signal charges are trapped by the second electrode.

20. The imaging device according to claim 19, wherein the size of the gap between the first electrode and the auxiliary electrode is smaller than the size of the gap between the second electrode and the auxiliary electrode.

21. The imaging device according to claim 12, wherein
the first electrode is a pixel electrode of a first pixel cell, and
the second electrode is a pixel electrode of a second pixel cell, a sensitivity of the first pixel cell being higher than a sensitivity of the second pixel cell.

22. The imaging device according to claim 21, wherein the size of the gap between the first electrode and the auxiliary electrode is smaller than the size of the gap between the second electrode and the auxiliary electrode.

23. The imaging device according to claim 12, wherein
the size of the gap between the first electrode and the auxiliary electrode is an average size of the gap between the first electrode and the auxiliary electrode, and
the size of the gap between the second electrode and the auxiliary electrode is an average size of the gap between the second electrode and the auxiliary electrode.

24. An imaging device, comprising:
a photoelectric conversion layer having a first surface and a second surface opposite to the first surface;
a counter electrode on the first surface;
a first electrode on the second surface;
a second electrode on the second surface, the second electrode being spaced from the first electrode; and
an auxiliary electrode on the second surface between the first electrode and the second electrode, the auxiliary electrode being spaced from the first electrode and the second electrode, wherein
a distance between a first side of the first electrode and a second side of the auxiliary electrode is different from a distance between a third side of the second electrode and a fourth side of the auxiliary electrode, the second side facing the first side and being closer to the first side than any other sides of the auxiliary electrode, the fourth side facing the third side and being closer to the third side than any other sides of the auxiliary electrode.

* * * * *